(12) United States Patent
Chang et al.

(10) Patent No.: US 11,637,538 B2
(45) Date of Patent: Apr. 25, 2023

(54) BULK ACOUSTIC WAVE FILTER AND A METHOD OF FREQUENCY TUNING FOR BULK ACOUSTIC WAVE RESONATOR OF BULK ACOUSTIC WAVE FILTER

(71) Applicant: WIN Semiconductors Corp., Tao Yuan (TW)

(72) Inventors: Chia-Ta Chang, Tao Yuan (TW); Chun-Ju Wei, Tao Yuan (TW); Kuo-Lung Weng, Tao Yuan (TW)

(73) Assignee: WIN SEMICONDUCTORS CORP., Taoyuan (TW)

( * ) Notice: Subject to any disclaimer, the term of this patent is extended or adjusted under 35 U.S.C. 154(b) by 3 days.

(21) Appl. No.: 17/331,330

(22) Filed: May 26, 2021

(65) Prior Publication Data

US 2021/0281233 A1    Sep. 9, 2021

Related U.S. Application Data

(60) Continuation of application No. 16/779,982, filed on Feb. 3, 2020, now Pat. No. 11,070,185, which is a
(Continued)

(30) Foreign Application Priority Data

Jan. 3, 2017  (TW) ................................ 106100073

(51) Int. Cl.
*H03H 3/02* (2006.01)
*H03H 9/58* (2006.01)
(Continued)

(52) U.S. Cl.
CPC ................ *H03H 3/02* (2013.01); *H03H 3/04* (2013.01); *H03H 9/587* (2013.01);
(Continued)

(58) Field of Classification Search
CPC ............ H03H 3/02; H03H 3/04; H03H 9/587; H03H 2003/021; H03H 2003/0442; H03H 2009/02165
(Continued)

(56) References Cited

U.S. PATENT DOCUMENTS 6,905,970 B2    6/2005  Shing et al.
8,910,355 B2   12/2014  Adkisson et al.
(Continued)

*Primary Examiner* — Rakesh B Patel
*Assistant Examiner* — Jorge L Salazar, Jr.
(74) *Attorney, Agent, or Firm* — Muncy, Geissler, Olds & Lowe, P.C.

(57) ABSTRACT

A bulk acoustic wave filter comprises a substrate, an insulating layer disposed on the substrate and having a first cavity and a second cavity formed therein, a first bulk-acoustic-wave-resonance-structure disposed on the first cavity and a second bulk-acoustic-wave-resonance-structure disposed on the second cavity. The first bulk-acoustic-wave-resonance-structure comprises a first bottom electrode disposed on the first cavity, a first top electrode disposed on the first bottom electrode, a first piezoelectric layer portion sandwiched between the first top electrode and the first bottom electrode, and a first frequency tuning structure disposed between the first cavity and the first bottom electrode. The second bulk-acoustic-wave-resonance-structure comprises a second bottom electrode disposed on the second cavity, a second top electrode disposed on the second bottom (Continued)

electrode, a second piezoelectric layer portion sandwiched between the second top electrode and the second bottom electrode.

16 Claims, 25 Drawing Sheets

Related U.S. Application Data division of application No. 15/477,758, filed on Apr. 3, 2017, now Pat. No. 10,594,286.

(51) Int. Cl.
*H03H 3/04* (2006.01)
*H03H 9/02* (2006.01)

(52) U.S. Cl.
CPC ............... *H03H 2003/021* (2013.01); *H03H 2003/0442* (2013.01); *H03H 2009/02165* (2013.01)

(58) Field of Classification Search
USPC ........................................ 333/133, 187, 188
See application file for complete search history.

(56) References Cited

U.S. PATENT DOCUMENTS

| | | |
|---|---|---|
| 9,796,582 B1 | 10/2017 | Cheng et al. |
| 2007/0008050 A1 | 1/2007 | Jung et al. |
| 2007/0120625 A1 | 5/2007 | Larson, III et al. |
| 2007/0194863 A1* | 8/2007 | Shibata ............... H03H 3/02 333/187 |
| 2008/0169728 A1 | 7/2008 | Asai et al. |
| 2012/0049976 A1* | 3/2012 | Son ................... H03H 9/131 29/25.35 |
| 2012/0267638 A1 | 10/2012 | Lee et al. |
| 2015/0280687 A1* | 10/2015 | Burak ............... H03H 9/175 310/321 |
| 2016/0164489 A1* | 6/2016 | Shin ................... H03H 9/587 333/187 |
| 2018/0029882 A1 | 2/2018 | Cheng et al. |
| 2018/0062608 A1 | 3/2018 | Lee et al. |
| 2018/0109240 A1 | 4/2018 | Chang et al. |
| 2018/0123554 A1 | 5/2018 | Kyoung et al. |
| 2018/0191322 A1 | 7/2018 | Chang et al. |

\* cited by examiner

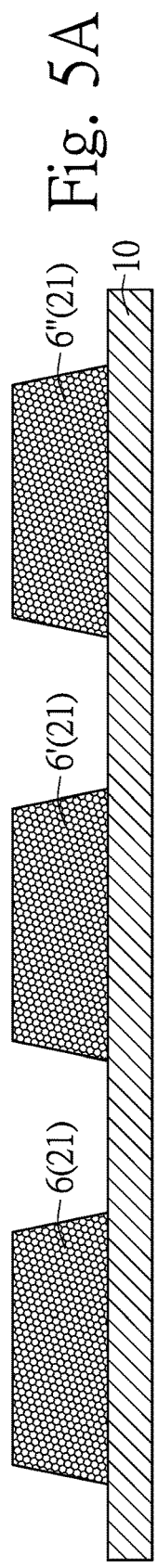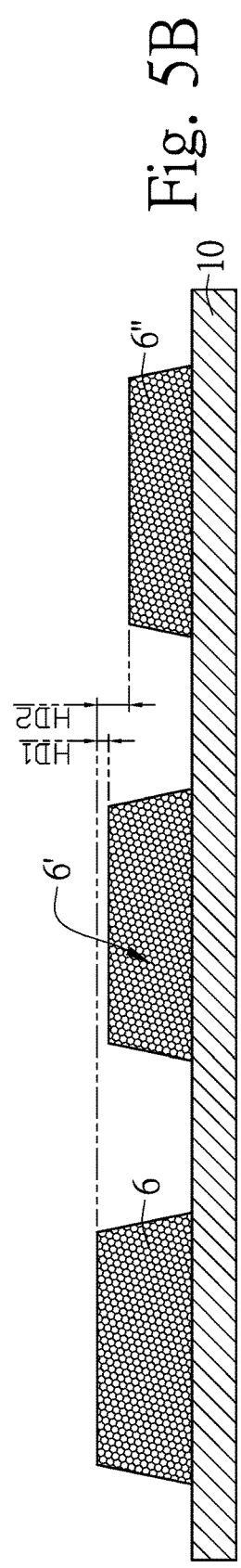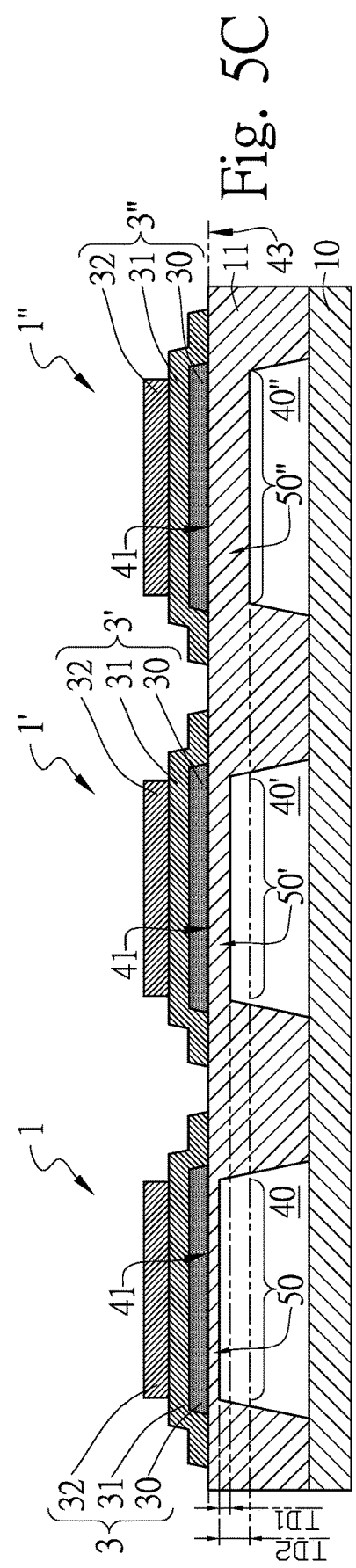

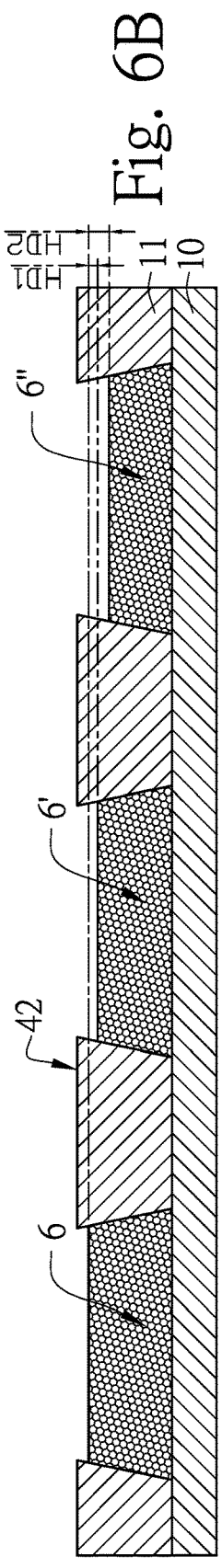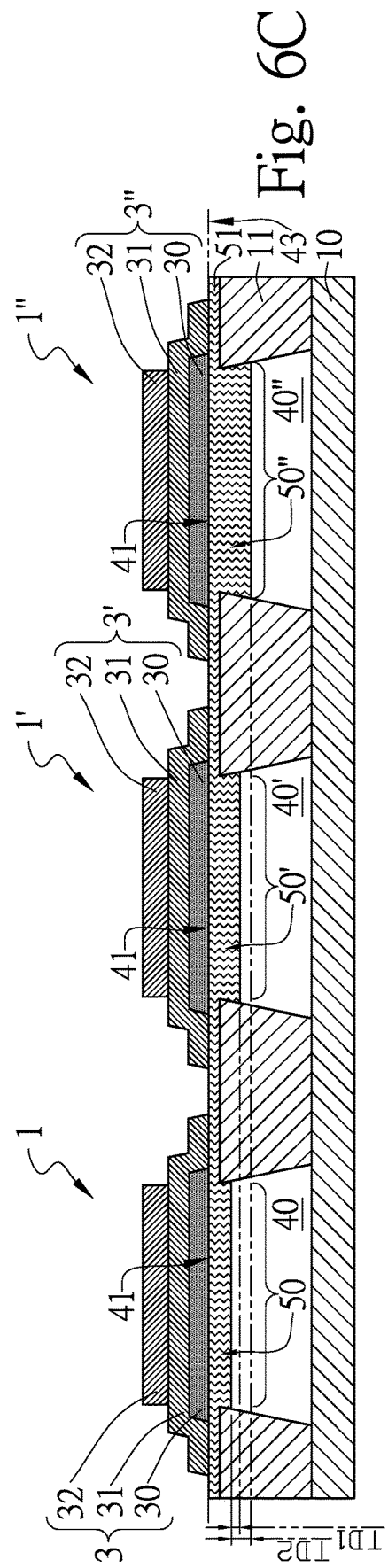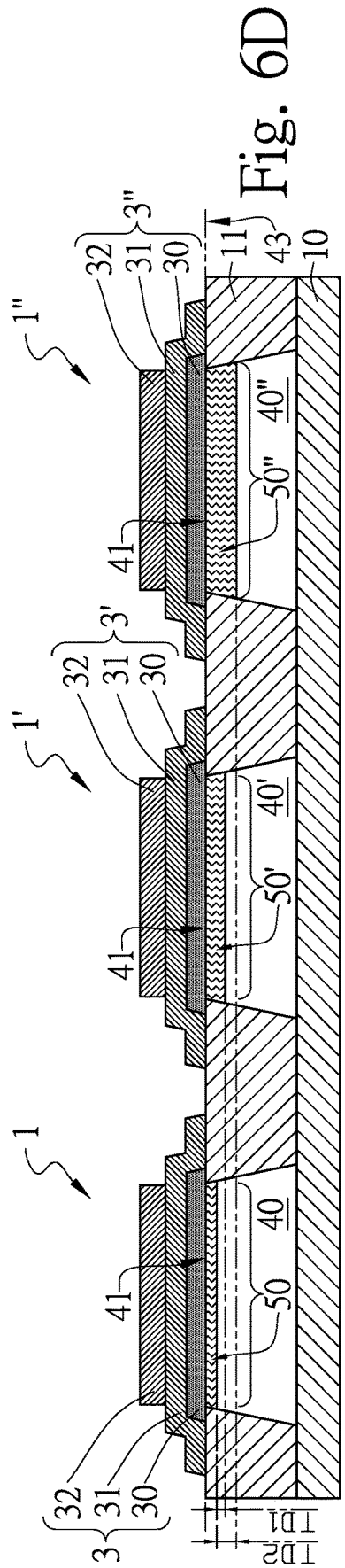

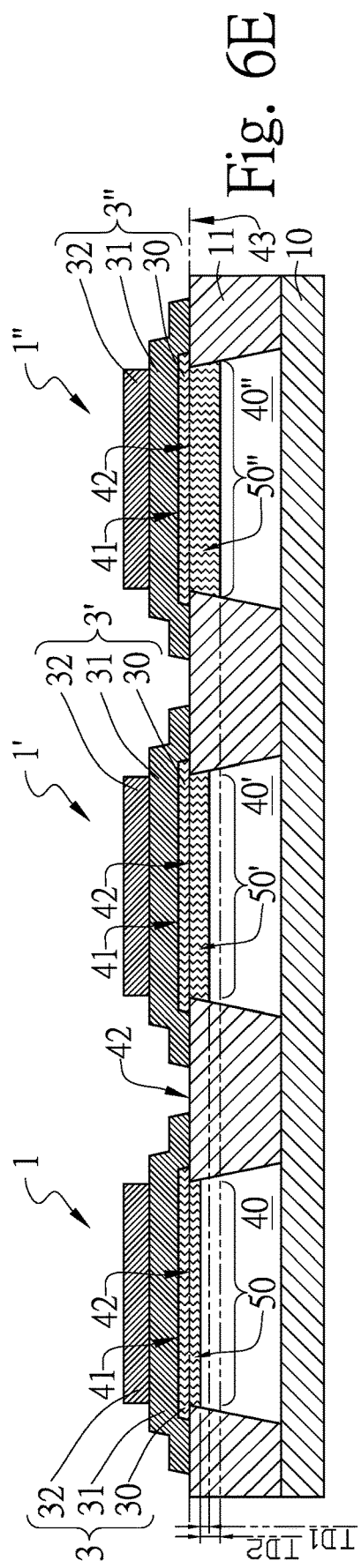
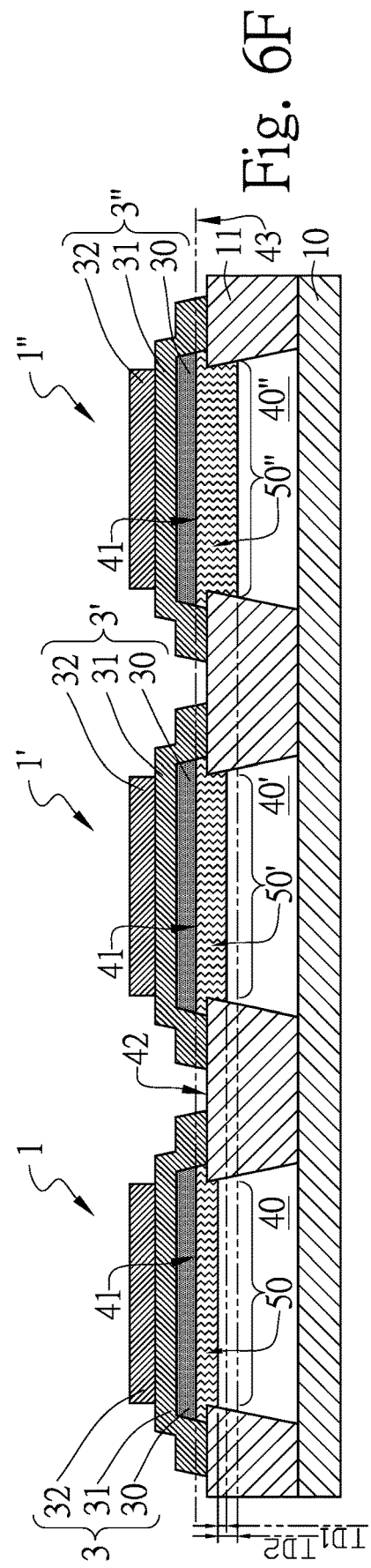

BULK ACOUSTIC WAVE FILTER AND A METHOD OF FREQUENCY TUNING FOR BULK ACOUSTIC WAVE RESONATOR OF BULK ACOUSTIC WAVE FILTER

CROSS-REFERENCE TO RELATED DOCUMENTS

The present invention is a Continuation of U.S. patent application Ser. No. 16/779,982 entitled "BULK ACOUSTIC WAVE FILTER AND A METHOD OF FREQUENCY TUNING FOR BULK ACOUSTIC WAVE RESONATOR OF BULK ACOUSTIC WAVE FILTER" filed on Feb. 3, 2020 (now published as Pub. No. 20200169238), which is a Division of U.S. patent application Ser. No. 15/477,758 filed on Apr. 3, 2017 (now issued as U.S. Pat. No. 10,594,286), which claims priority of Application No. 106100073 filed in Taiwan on Jan. 3, 2017; the entire contents of all of which are hereby incorporated by reference.

FIELD OF THE INVENTION

The present invention is related to a bulk acoustic wave filter and a method of frequency tuning for a bulk acoustic wave resonator of a bulk acoustic wave filter, especially a method of precision frequency tuning for a bulk acoustic wave resonator of a bulk acoustic wave filter.

BACKGROUND OF THE INVENTION

Please refer to FIGS. 7A~7D, which are the cross-sectional schematics showing steps of a fabricating method for bulk acoustic wave filter of conventional technology. In FIG. 7A, a recess 74 and a recess 74' are formed by etching a top surface of a silicon substrate 75. Forming a sacrificial layer 77 on the silicon substrate 75 and then polishing the sacrificial layer 77 by a chemical-mechanical planarization (CMP) process such that the sacrificial layer 77 above the top surface of the silicon substrate 75 are removed and the structure shown as in FIG. 7B are formed, wherein the recess 74 and the recess 74' are filled up with the sacrificial layer 77. In FIG. 7C, a first bulk acoustic wave resonance structure 70 and a second bulk acoustic wave resonance structure 70' are formed on the top surface of the silicon substrate 75, wherein the first bulk acoustic wave resonance structure 70 and the second bulk acoustic wave resonance structure 70' have a same thickness bottom electrode 71 and a same thickness piezoelectric layer 72 respectively, wherein the first bulk acoustic wave resonance structure 70 and the second bulk acoustic wave resonance structure 70' have a top electrode 73 and a top electrode 73' respectively, wherein a thickness of the top electrode 73 is unequal to a thickness of the top electrode 73'. The top electrode 73 and the top electrode 73' have a thickness difference 76. In FIG. 7D, the sacrificial layer 77 filled up in the recess 74 and the recess 74' are etched such that the recess 74 and the recess 74' form two cavities of the first bulk acoustic wave resonance structure 70 and the second bulk acoustic wave resonance structure 70' respectively. Since the thickness of the top electrode 73' is thicker than the thickness of the top electrode 73 such that a resonance frequency of the second bulk acoustic wave resonance structure 70' is lower than a resonance frequency of the first bulk acoustic wave resonance structure 70. The first bulk acoustic wave resonance structure 70 and the second bulk acoustic wave resonance structure 70' have a resonance frequency difference, wherein the resonance frequency difference is correlated to the thickness difference 76.

However, tuning the resonance frequency difference of the first bulk acoustic wave resonance structure 70 and the second bulk acoustic wave resonance structure 70' by adjusting the thickness difference 76 of the top electrode 73 and the top electrode 73' is essentially achieving tuning the resonance frequency difference by the structure difference between the first bulk acoustic wave resonance structure 70 and the second bulk acoustic wave resonance structure 70'. It increases the complexity for fabricating the first bulk acoustic wave resonance structure 70 and the second bulk acoustic wave resonance structure 70', furthermore it may affect the characteristics performance of the first bulk acoustic wave resonance structure 70 and the second bulk acoustic wave resonance structure 70'.

Accordingly, the present invention has developed a new design which may avoid the above mentioned drawbacks, may significantly enhance the performance of the devices and may take into account economic considerations. Therefore, the present invention then has been invented.

SUMMARY OF THE INVENTION

In order to solve the problems mentioned the above and to achieve the expected effect, the present invention provides a method for forming cavity of bulk acoustic wave resonator comprising following steps of: Step A1: forming a sacrificial epitaxial structure mesa on a compound semiconductor substrate; Step A2: forming an insulating layer on the sacrificial epitaxial structure mesa and the compound semiconductor substrate; Step A3: polishing the insulating layer by a chemical-mechanical planarization process to form a polished surface; Step A4: forming a bulk acoustic wave resonance structure on the polished surface, wherein the bulk acoustic wave resonance structure is located above the sacrificial epitaxial structure mesa, wherein the Step A4 comprises following steps of: Step A41: forming a bottom electrode layer on the polished surface; Step A42: forming a piezoelectric layer on the bottom electrode layer; and Step A43: forming a top electrode layer on the piezoelectric layer; and Step A5: etching the sacrificial epitaxial structure mesa to form a cavity, wherein the cavity is located under the bulk acoustic wave resonance structure.

In an embodiment, wherein in the Step A3, the insulating layer is polished such that the sacrificial epitaxial structure mesa is not exposed, wherein the insulating layer between the bottom electrode layer and the sacrificial epitaxial structure mesa forms a frequency tuning structure, wherein the frequency tuning structure has a thickness, the bulk acoustic wave resonance structure has a resonance frequency, thereby adjusting the thickness of the frequency tuning structure is capable of tuning the resonance frequency of the bulk acoustic wave resonance structure.

In an embodiment, further comprises a following step of: forming a bottom etching stop layer on the compound semiconductor substrate, wherein the sacrificial epitaxial structure mesa is formed on the bottom etching stop layer; wherein the sacrificial epitaxial structure mesa comprises a sacrificial epitaxial layer.

In an embodiment, wherein (1) the compound semiconductor substrate is made of GaAs; the sacrificial epitaxial layer is made of GaAs; the bottom etching stop layer is made of InGaP; or (2) the compound semiconductor substrate is made of InP; the sacrificial epitaxial layer is made of InGaAs; the bottom etching stop layer is made of InP.

In an embodiment, wherein the sacrificial epitaxial layer has a thickness, the thickness of the sacrificial epitaxial layer is between 50 nm and 5000 nm; wherein the bottom etching stop layer has a thickness, the thickness of the bottom etching stop layer is between 20 nm and 500 nm.

In addition, the present invention further provides a method of frequency tuning for bulk acoustic wave resonator of bulk acoustic wave filter comprising following steps of: Step B1: forming a plural of sacrificial structure mesas on a substrate, wherein the plural of sacrificial structure mesas comprise at least one first sacrificial structure mesa and at least one second sacrificial structure mesa, wherein a height of the at least one first sacrificial structure mesa is greater than a height of the at least one second sacrificial structure mesa, wherein the at least one first sacrificial structure mesa and the at least one second sacrificial structure mesa have a first height difference; Step B2: forming an insulating layer on the plural of sacrificial structure mesas and the substrate; Step B3: polishing the insulating layer by a chemical-mechanical planarization process to form a polished surface; Step B4: forming a plural of bulk acoustic wave resonance structures on the polished surface, wherein the plural of bulk acoustic wave resonance structures comprise at least one first bulk acoustic wave resonance structure and at least one second bulk acoustic wave resonance structure, the at least one first bulk acoustic wave resonance structure and the at least one second bulk acoustic wave resonance structure are located above the at least one first sacrificial structure mesa and the at least one second sacrificial structure mesa respectively, wherein the Step B4 comprises following steps of: Step B41: forming a bottom electrode layer on the polished surface; Step B42: forming a piezoelectric layer on the bottom electrode layer; and Step B43: forming a top electrode layer on the piezoelectric layer; and Step B5: etching the plural of sacrificial structure mesas to form a plural of cavities, wherein the plural of cavities are located under the plural of bulk acoustic wave resonance structures respectively; wherein in the Step B3, the insulating layer is polished such that (1) the at least one first sacrificial structure mesa is exposed and the at least one second sacrificial structure mesa is not exposed, thereby the insulating layer under the polished surface and located under the at least one second bulk acoustic wave resonance structure forms a second frequency tuning structure of the at least one second bulk acoustic wave resonance structure, wherein the second frequency tuning structure has a thickness, the thickness of the second frequency tuning structure is equal to the first height difference; or (2) the at least one first sacrificial structure mesa and the at least one second sacrificial structure mesa are not exposed, thereby the insulating layer under the polished surface and located under the at least one first bulk acoustic wave resonance structure and the at least one second bulk acoustic wave resonance structure form a first frequency tuning structure of the at least one first bulk acoustic wave resonance structure and a second frequency tuning structure of the at least one second bulk acoustic wave resonance structure respectively, wherein the first frequency tuning structure and the second frequency tuning structure have a first thickness difference, the first thickness difference is equal to the first height difference; wherein the at least one first bulk acoustic wave resonance structure and the at least one second bulk acoustic wave resonance structure have a first resonance frequency difference, the first resonance frequency difference is correlated to the first height difference, thereby adjusting the first height difference is capable of tuning the first resonance frequency difference of the at least one first bulk acoustic wave resonance structure and the at least one second bulk acoustic wave resonance structure.

In an embodiment, wherein the substrate is a semiconductor substrate; wherein the plural of sacrificial structure mesas are made of at least one material selected from the group consisting of: metal, alloy and epitaxial structure.

In an embodiment, wherein the substrate is a compound semiconductor substrate; wherein the Step B1 comprises following steps of: Step B11: forming a sacrificial structure on the substrate, wherein the sacrificial structure comprises a sacrificial epitaxial layer; Step B12: etching the sacrificial structure to form the plural of sacrificial structure mesas such that the plural of sacrificial structure mesas have the same height; and Step B13: etching the at least one first sacrificial structure mesa and the at least one second sacrificial structure mesa or etching the at least one second sacrificial structure mesa such that the at least one first sacrificial structure mesa and the at least one second sacrificial structure mesa have the first height difference.

In an embodiment, wherein the sacrificial structure further comprises a first etching stop layer and a first fine tuning layer, wherein the sacrificial epitaxial layer is formed on the substrate, the first etching stop layer is formed on the sacrificial epitaxial layer, the first fine tuning layer is formed on the first etching stop layer, wherein the first fine tuning layer has a thickness; wherein in the Step B13, the first fine tuning layer of the at least one second sacrificial structure mesa is etched such that the at least one first sacrificial structure mesa and the at least one second sacrificial structure mesa have the first height difference, thereby the first height difference is determined by the thickness of the first fine tuning layer.

In an embodiment, wherein (1) the substrate is made of GaAs; the sacrificial epitaxial layer is made of GaAs; the first etching stop layer is made of AlAs or InGaP; the first fine tuning layer is made of GaAs; or (2) the substrate is made of InP; the sacrificial epitaxial layer is made of InGaAs; the first etching stop layer is made of InP; the first fine tuning layer is made of InGaAs.

In an embodiment, wherein the thickness of the first fine tuning layer is between 1 nm and 300 nm; wherein the first etching stop layer has a thickness, the thickness of the first etching stop layer is between 1 nm and 50 nm.

In an embodiment, further comprises a following step of: forming a bottom etching stop layer on the substrate, wherein the sacrificial structure is formed on the bottom etching stop layer; wherein the sacrificial epitaxial layer has a thickness, the thickness of the sacrificial epitaxial layer is between 50 nm and 5000 nm; wherein the bottom etching stop layer has a thickness, the thickness of the bottom etching stop layer is between 20 nm and 500 nm; wherein (1) the substrate is made of GaAs; the sacrificial epitaxial layer is made of GaAs; the bottom etching stop layer is made of InGaP; or (2) the substrate is made of InP; the sacrificial epitaxial layer is made of InGaAs; the bottom etching stop layer is made of InP.

In addition, the present invention further provides a method of frequency tuning for bulk acoustic wave resonator of bulk acoustic wave filter comprising following steps of: Step C1: forming a plural of sacrificial structure mesas on a substrate, wherein the plural of sacrificial structure mesas have the same height, wherein the plural of sacrificial structure mesas comprise at least one first sacrificial structure mesa and at least one second sacrificial structure mesa; Step C2: forming an insulating layer on the plural of sacrificial structure mesas and the substrate; Step C3: polishing the insulating layer by a prior chemical-mechanical planarization process to form a pre-polished surface such that the plural of sacrificial structure mesas are exposed; Step C4: etching the at least one first sacrificial structure mesa and the at least one second sacrificial structure mesa or etching the at least one second sacrificial structure mesa such that the at least one first sacrificial structure mesa and the at least one second sacrificial structure mesa have a first height difference, wherein a height of the at least one first sacrificial structure mesa is greater than a height of the at least one second sacrificial structure mesa; Step C5: forming a plural of bulk acoustic wave resonance structures, wherein the plural of bulk acoustic wave resonance structures comprise at least one first bulk acoustic wave resonance structure and at least one second bulk acoustic wave resonance structure, the at least one first bulk acoustic wave resonance structure and the at least one second bulk acoustic wave resonance structure are located above the at least one first sacrificial structure mesa and the at least one second sacrificial structure mesa respectively, wherein (a) the Step C5 comprises following steps of: Step C51: forming a second polish layer on the plural of sacrificial structure mesas and the insulating layer, wherein the second polish layer is made of insulator; Step C52: polishing the second polish layer by a chemical-mechanical planarization process to form a polished surface such that (1) the at least one first sacrificial structure mesa is exposed and the at least one second sacrificial structure mesa is not exposed, thereby the second polish layer under the polished surface and located under the at least one second bulk acoustic wave resonance structure forms a second frequency tuning structure of the at least one second bulk acoustic wave resonance structure, wherein the second frequency tuning structure has a thickness, the thickness of the second frequency tuning structure is equal to the first height difference; or (2) the at least one first sacrificial structure mesa and the at least one second sacrificial structure mesa are not exposed, thereby the second polish layer under the polished surface and located under the at least one first bulk acoustic wave resonance structure and the at least one second bulk acoustic wave resonance structure form a first frequency tuning structure of the at least one first bulk acoustic wave resonance structure and a second frequency tuning structure of the at least one second bulk acoustic wave resonance structure respectively, wherein the first frequency tuning structure and the second frequency tuning structure have a first thickness difference, the first thickness difference is equal to the first height difference; Step C53: forming a bottom electrode layer on the polished surface; Step C54: forming a piezoelectric layer on the bottom electrode layer; and Step C55: forming a top electrode layer on the piezoelectric layer; (b) an extending plane is coincident with the pre-polished surface, wherein the Step C5 comprises following steps of: Step C51': forming a second polish layer on the plural of sacrificial structure mesas and the insulating layer, wherein the second polish layer is made of at least one material selected from the group consisting of: metal and alloy; Step C52': polishing the second polish layer by a chemical-mechanical planarization process to form a polished surface such that the plural of sacrificial structure mesas are not exposed; Step C53': patterning the second polish layer, wherein (1) in the Step C4, the at least one second sacrificial structure mesa is etched; wherein the second polish layer above the extending plane, under the polished surface and located under the at least one first bulk acoustic wave resonance structure forms a bottom electrode layer of the at least one first bulk acoustic wave resonance structure; wherein the second polish layer above the extending plane, under the polished surface and located under the at least one second bulk acoustic wave resonance structure forms a bottom electrode layer of the at least one second bulk acoustic wave resonance structure; wherein the second polish layer under the extending plane and located under the at least one second bulk acoustic wave resonance structure forms a second frequency tuning structure of the at least one second bulk acoustic wave resonance structure; wherein the second frequency tuning structure has a thickness, the thickness of the second frequency tuning structure is equal to the first height difference; or (2) in the Step C4, the at least one first sacrificial structure mesa and the at least one second sacrificial structure mesa are etched; wherein the second polish layer above the extending plane, under the polished surface and located under the at least one first bulk acoustic wave resonance structure forms a bottom electrode layer of the at least one first bulk acoustic wave resonance structure; wherein the second polish layer under the extending plane and located under the at least one first bulk acoustic wave resonance structure forms a first frequency tuning structure of the at least one first bulk acoustic wave resonance structure; wherein the second polish layer above the extending plane, under the polished surface and located under the at least one second bulk acoustic wave resonance structure forms a bottom electrode layer of the at least one second bulk acoustic wave resonance structure; wherein the second polish layer under the extending plane and located under the at least one second bulk acoustic wave resonance structure forms a second frequency tuning structure of the at least one second bulk acoustic wave resonance structure; wherein the first frequency tuning structure and the second frequency tuning structure have a first thickness difference, the first thickness difference is equal to the first height difference; Step C54': forming a piezoelectric layer on the polished surface; and Step C55': forming a top electrode layer on the piezoelectric layer; or (c) the Step C5 comprises following steps of: Step C51": forming a second polish layer on the plural of sacrificial structure mesas and the insulating layer, wherein the second polish layer is made of at least one material selected from the group consisting of: metal, alloy and insulator; Step C52": polishing the second polish layer by a chemical-mechanical planarization process to form a polished surface such that (1) the at least one first sacrificial structure mesa is exposed and the at least one second sacrificial structure mesa is not exposed, thereby the second polish layer under the polished surface and located under the at least one second bulk acoustic wave resonance structure forms a second frequency tuning structure of the at least one second bulk acoustic wave resonance structure, wherein the second frequency tuning structure has a thickness, the thickness of the second frequency tuning structure is equal to the first height difference; or (2) the at least one first sacrificial structure mesa and the at least one second sacrificial structure mesa are not exposed, thereby the second polish layer under the polished surface and located under the at least one first bulk acoustic wave resonance structure and the at least one second bulk acoustic wave resonance structure form a first frequency tuning structure of the at least one first bulk acoustic wave resonance structure and a second frequency tuning structure of the at least one second bulk acoustic wave resonance structure respectively, wherein the first frequency tuning structure and the second frequency tuning structure have a first thickness difference, the first thickness difference is equal to the first height difference; Step C53": patterning the second polish layer; Step C54": forming a bottom electrode layer on the polished surface; Step C55": forming a piezoelectric layer on the bottom electrode layer;

and Step C56": forming a top electrode layer on the piezoelectric layer; and Step C6: etching the plural of sacrificial structure mesas to form a plural of cavities, wherein the plural of cavities are located under the plural of bulk acoustic wave resonance structures respectively; wherein the at least one first bulk acoustic wave resonance structure and the at least one second bulk acoustic wave resonance structure have a first resonance frequency difference, the first resonance frequency difference is correlated to the first height difference, thereby adjusting the first height difference is capable of tuning the first resonance frequency difference of the at least one first bulk acoustic wave resonance structure and the at least one second bulk acoustic wave resonance structure.

In an embodiment, wherein the substrate is a semiconductor substrate; wherein the plural of sacrificial structure mesas are made of at least one material selected from the group consisting of: metal, alloy and epitaxial structure.

In an embodiment, wherein the substrate is a compound semiconductor substrate, wherein the Step C1 comprises following steps of: Step C11: forming a sacrificial structure on the substrate, wherein the sacrificial structure comprises a sacrificial epitaxial layer; and Step C12: etching the sacrificial structure to form the plural of sacrificial structure mesas, wherein the plural of sacrificial structure mesas have the same height.

In an embodiment, wherein (1) the sacrificial structure further comprises a first etching stop layer and a first fine tuning layer, wherein the sacrificial epitaxial layer is formed on the substrate, the first etching stop layer is formed on the sacrificial epitaxial layer, the first fine tuning layer is formed on the first etching stop layer, wherein the first fine tuning layer has a thickness; wherein in the Step C4, the first fine tuning layer of the at least one second sacrificial structure mesa is etched such that the at least one first sacrificial structure mesa and the at least one second sacrificial structure mesa have the first height difference, thereby the first height difference is determined by the thickness of the first fine tuning layer; or (2) the sacrificial structure further comprises a first etching stop layer, a first fine tuning layer and a top etching stop layer, wherein the sacrificial epitaxial layer is formed on the substrate, the first etching stop layer is formed on the sacrificial epitaxial layer, the first fine tuning layer is formed on the first etching stop layer, the top etching stop layer is formed on the first fine tuning layer, wherein the first fine tuning layer has a thickness; wherein the Step C4 comprises following steps of: Step C41: etching the top etching stop layer of the at least one first sacrificial structure mesa and the at least one second sacrificial structure mesa; and Step C42: etching the first fine tuning layer of the at least one second sacrificial structure mesa such that the at least one first sacrificial structure mesa and the at least one second sacrificial structure mesa have the first height difference, thereby the first height difference is determined by the thickness of the first fine tuning layer.

In an embodiment, wherein (1) the substrate is made of GaAs; the sacrificial epitaxial layer is made of GaAs; the first etching stop layer is made of AlAs or InGaP; the first fine tuning layer is made of GaAs; the top etching stop layer is made of InGaP; or (2) the substrate is made of InP; the sacrificial epitaxial layer is made of InGaAs; the first etching stop layer is made of InP; the first fine tuning layer is made of InGaAs; the top etching stop layer is made of InP.

In an embodiment, wherein the thickness of the first fine tuning layer is between 1 nm and 300 nm; wherein the first etching stop layer has a thickness, the thickness of the first etching stop layer is between 1 nm and 50 nm; wherein the top etching stop layer has a thickness, the thickness of the top etching stop layer is between 50 nm and 300 nm.

In an embodiment, further comprises a following step of: forming a bottom etching stop layer on the substrate, wherein the sacrificial structure is formed on the bottom etching stop layer; wherein the sacrificial epitaxial layer has a thickness, the thickness of the sacrificial epitaxial layer is between 50 nm and 5000 nm; wherein the bottom etching stop layer has a thickness, the thickness of the bottom etching stop layer is between 20 nm and 500 nm; wherein (1) the substrate is made of GaAs; the sacrificial epitaxial layer is made of GaAs; the bottom etching stop layer is made of InGaP; or (2) the substrate is made of InP; the sacrificial epitaxial layer is made of InGaAs; the bottom etching stop layer is made of InP.

In an embodiment, wherein in the Step C51', the second polish layer is made of at least one material selected from the group consisting of: Ru, Ti, Mo, Pt, Au, Al and W.

In addition, the present invention further provides a bulk acoustic wave filter comprising: an insulating layer, a plural of bulk acoustic wave resonance structures and one of following structures: Structure A, Structure B and Structure C; wherein the insulating layer is formed on a substrate, wherein the insulating layer has a plural of cavities; wherein the plural of bulk acoustic wave resonance structures are located above the plural of cavities respectively, wherein the plural of bulk acoustic wave resonance structures comprise a first bulk acoustic wave resonance structure and a second bulk acoustic wave resonance structure, the plural of cavities comprise a first cavity and a second cavity, the first bulk acoustic wave resonance structure and the second bulk acoustic wave resonance structure are located above the first cavity and the second cavity respectively, wherein the first bulk acoustic wave resonance structure and the second bulk acoustic wave resonance structure have a first resonance frequency difference, wherein each of the plural of bulk acoustic wave resonance structures comprises: a bottom electrode layer, a piezoelectric layer and a top electrode layer; wherein the bottom electrode layer is formed on an extending plane; the piezoelectric layer is formed on the bottom electrode layer; the top electrode layer is formed on the piezoelectric layer; wherein Structure A is as follows: the insulating layer has a polished top surface, the extending plane is coincident with the polished top surface of the insulating layer; wherein the second bulk acoustic wave resonance structure has a second frequency tuning structure, the second frequency tuning structure is formed under the extending plane and between the bottom electrode layer of the second bulk acoustic wave resonance structure and the second cavity, wherein the second frequency tuning structure has a thickness, the thickness of the second frequency tuning structure is correlated to the first resonance frequency difference of the first bulk acoustic wave resonance structure and the second bulk acoustic wave resonance structure; wherein Structure B is as follows: the insulating layer has a polished top surface, the extending plane is coincident with the polished top surface of the insulating layer; wherein the first bulk acoustic wave resonance structure and the second bulk acoustic wave resonance structure have a first frequency tuning structure and a second frequency tuning structure respectively, wherein the first frequency tuning structure is formed under the extending plane and between the bottom electrode layer of the first bulk acoustic wave resonance structure and the first cavity, the second frequency tuning structure is formed under the extending plane and between the bottom electrode layer of the second bulk acoustic wave resonance structure and the second cavity, wherein the first frequency tuning structure and the second frequency tuning structure have a first thickness difference, the first thickness difference is correlated to the first resonance frequency difference of the first bulk acoustic wave resonance structure and the second bulk acoustic wave resonance structure; wherein Structure C is as follows: a second polish layer is formed on the insulating layer and above the plural of cavities, wherein the second polish layer has a polished top surface, the extending plane is coincident with the polished top surface of the second polish layer; wherein the second polish layer under the extending plane and between the bottom electrode layer of the first bulk acoustic wave resonance structure and the first cavity forms a first frequency tuning structure of the first bulk acoustic wave resonance structure, wherein the second polish layer under the extending plane and between the bottom electrode layer of the second bulk acoustic wave resonance structure and the second cavity forms a second frequency tuning structure of the second bulk acoustic wave resonance structure; wherein the first frequency tuning structure and the second frequency tuning structure have a first thickness difference, the first thickness difference is correlated to the first resonance frequency difference of the first bulk acoustic wave resonance structure and the second bulk acoustic wave resonance structure.

In an embodiment, wherein the substrate is a semiconductor substrate.

In an embodiment, wherein the first frequency tuning structure is made of at least one material selected from the group consisting of: metal, alloy and insulator; wherein the second frequency tuning structure is made of at least one material selected from the group consisting of: metal, alloy and insulator.

In an embodiment, wherein the first frequency tuning structure and the bottom electrode layer of the first bulk acoustic wave resonance structure are made of the same material; wherein the second frequency tuning structure and the bottom electrode layer of the at least one second bulk acoustic wave resonance structure are made of the same material.

For further understanding the characteristics and effects of the present invention, some preferred embodiments referred to drawings are in detail described as follows.

BRIEF DESCRIPTION OF DRAWINGS

FIGS. 5A~5C are the cross-sectional schematics showing steps of an embodiment of a method of frequency tuning for bulk acoustic wave resonator of bulk acoustic wave filter of the present invention.

FIGS. 6A~6C are the cross-sectional schematics showing steps of an embodiment of a method of frequency tuning for bulk acoustic wave resonator of bulk acoustic wave filter of the present invention.

FIGS. 6D~6F are the cross-sectional schematics showing three embodiments of a method of frequency tuning for bulk acoustic wave resonator of bulk acoustic wave filter of the present invention.

DETAILED DESCRIPTIONS OF PREFERRED EMBODIMENTS

Figure 1A:
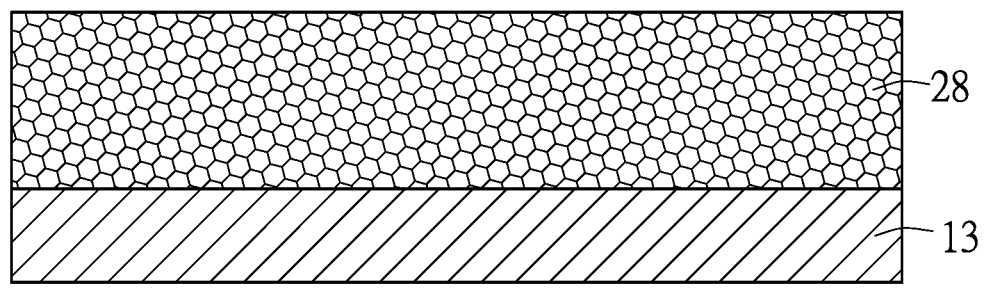
FIGS. 1A~1F are the cross-sectional schematics showing steps of an embodiment of a method for forming cavity of bulk acoustic wave resonator of the present invention.
Figure 1B:
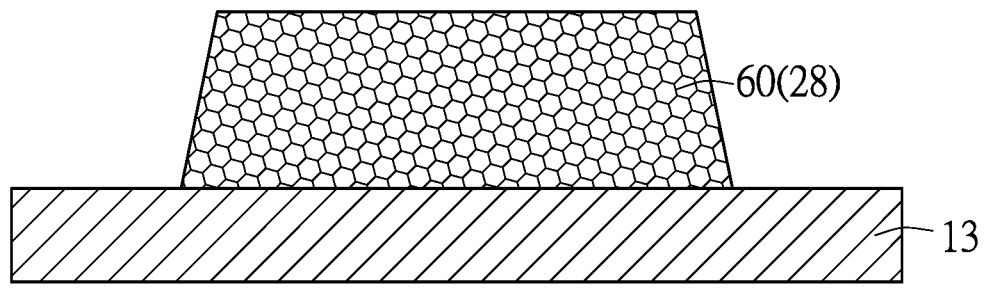
Figure 1C:
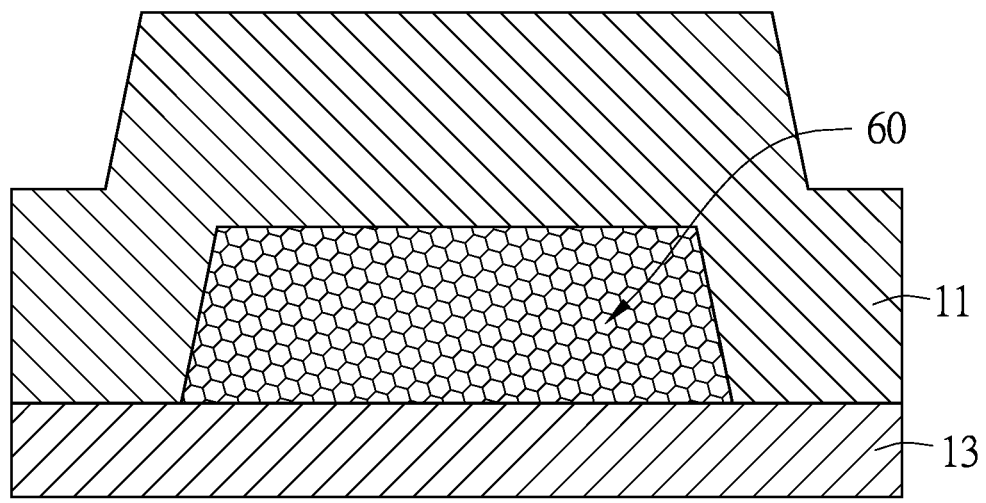
Figure 1D:
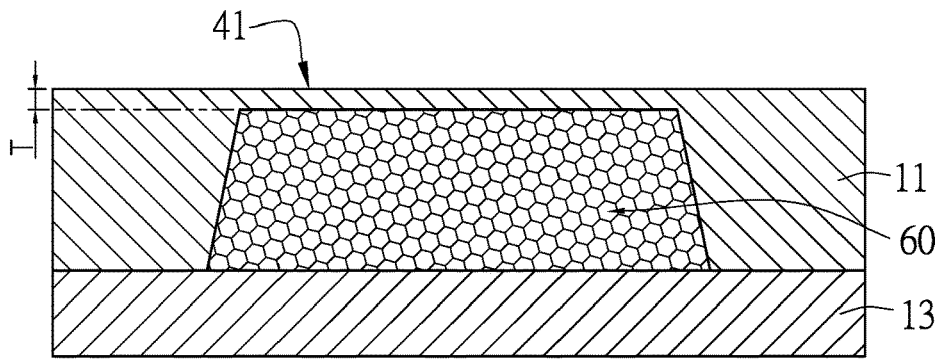
Figure 1E:
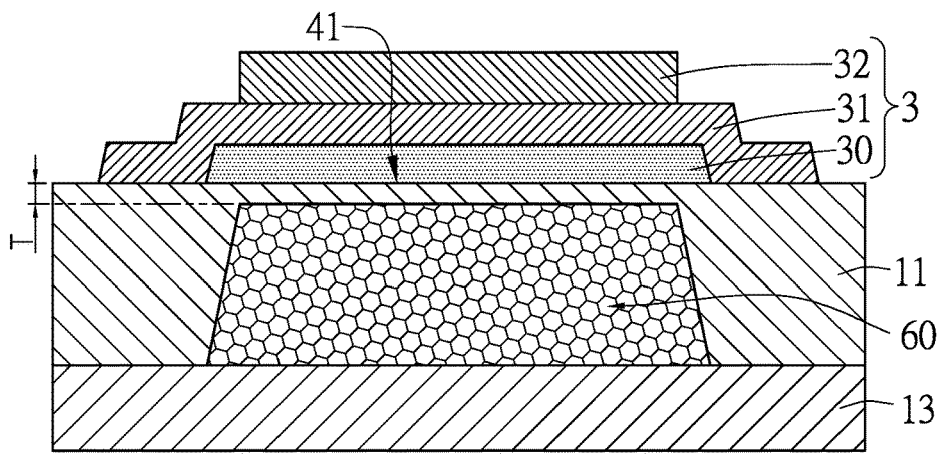
Figure 1F:
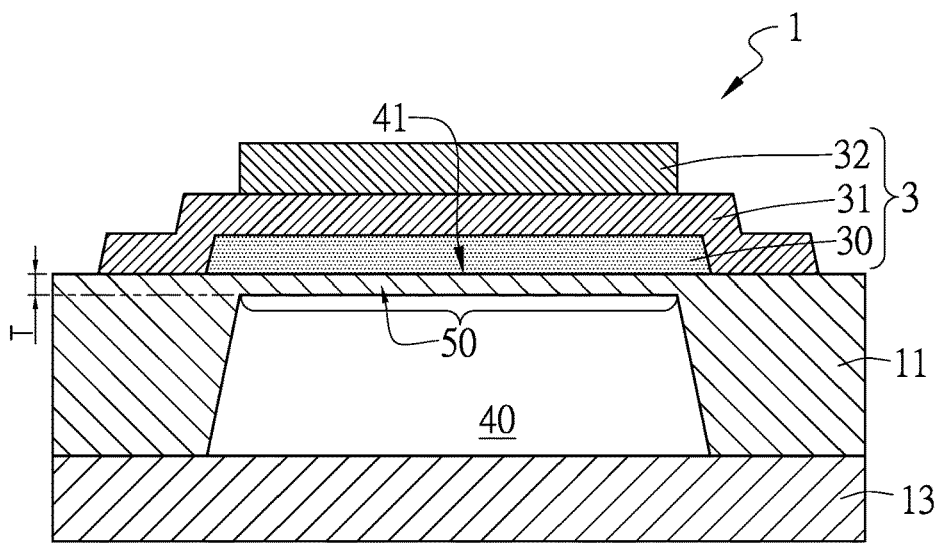

Please refer to FIGS. 1A~1F, which are the cross-sectional schematics showing steps of an embodiment of a method for forming cavity of bulk acoustic wave resonator of the present invention. A method for forming cavity of bulk acoustic wave resonator of the present invention comprises following steps of: Step A1: (please referring to FIG. 1B) forming a sacrificial epitaxial structure mesa 60 on a compound semiconductor substrate 13, which comprises following steps of: (please referring to FIG. 1A) forming an sacrificial epitaxial structure 28 on the compound semiconductor substrate 13; and (please referring to FIG. 1B) etching the sacrificial epitaxial structure 28 to form the sacrificial epitaxial structure mesa 60; Step A2: (please referring to FIG. 1C) forming an insulating layer 11 on the sacrificial epitaxial structure mesa 60 and the compound semiconductor substrate 13, wherein the insulating layer 11 is made of at least one material selected from the group consisting of: silicon nitride ($SiN_x$), silicon oxide ($SiO_2$) and polymer; Step A3: (please referring to FIG. 1D) polishing the insulating layer 11 by a chemical-mechanical planarization process to form a polished surface 41; Step A4: (please referring to FIG. 1E) forming a bulk acoustic wave resonance structure 3 on the polished surface 41, wherein the bulk acoustic wave resonance structure 3 is located above the sacrificial epitaxial structure mesa 60, wherein the Step A4 comprises following steps of: Step A41: forming a bottom electrode layer 30 on the polished surface 41; Step A42: forming a piezoelectric layer 31 on the bottom electrode layer 30; and Step A43: forming a top electrode layer 32 on the piezoelectric layer 31; and Step A5: (please referring to FIG. 1F) etching the sacrificial epitaxial structure mesa 60 to form a cavity 40, wherein the cavity 40 is located under the bulk acoustic wave resonance structure 3. In the Step A3, the insulating layer 11 is polished such that the sacrificial epitaxial structure mesa 60 is not exposed, wherein the insulating layer 11 between the bottom electrode layer 30 and the sacrificial epitaxial structure mesa 60 forms a frequency tuning structure 50, wherein the frequency tuning structure 50 has a thickness T, the bulk acoustic wave resonance structure 3 has a resonance frequency F, thereby adjusting the thickness T of the frequency tuning structure 50 is capable of tuning the resonance frequency F of the bulk acoustic wave resonance structure 3. As the thickness T of the frequency tuning structure 50 is increased, the resonance frequency F of the bulk acoustic wave resonance structure 3 is decreased; while as the thickness T of the frequency tuning structure 50 is decreased, the resonance frequency F of the bulk acoustic wave resonance structure 3 is increased. The main feature of a method for forming cavity of bulk acoustic wave resonator of the present invention is to use the compound semiconductor substrate 13 to form the sacrificial epitaxial structure 28 as the sacrificial layer and then polish the insulating layer 11 by a chemical-mechanical planarization process. The advantage is that it helps to precisely adjust the thickness T of the frequency tuning structure 50, and it also helps to precisely tune the frequency F of the bulk acoustic wave resonance structure 3. However if the thickness T of the frequency tuning structure 50 is too thick, then it will affect the resonance state of the bulk acoustic wave resonance structure 3. Hence, the thickness T of the frequency tuning structure 50 is required to be less than 1000 nm. In some preferable embodiments, the thickness T of the frequency tuning structure 50 is equal to or less than 300 nm.

Figure 1G:
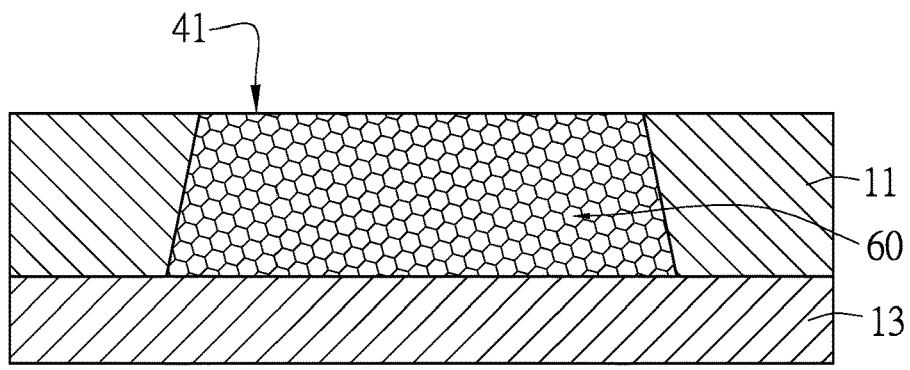
FIGS. 1G and 1H are the cross-sectional schematics showing steps of another embodiment of a method for forming cavity of bulk acoustic wave resonator of the present invention.
Figure 1H:
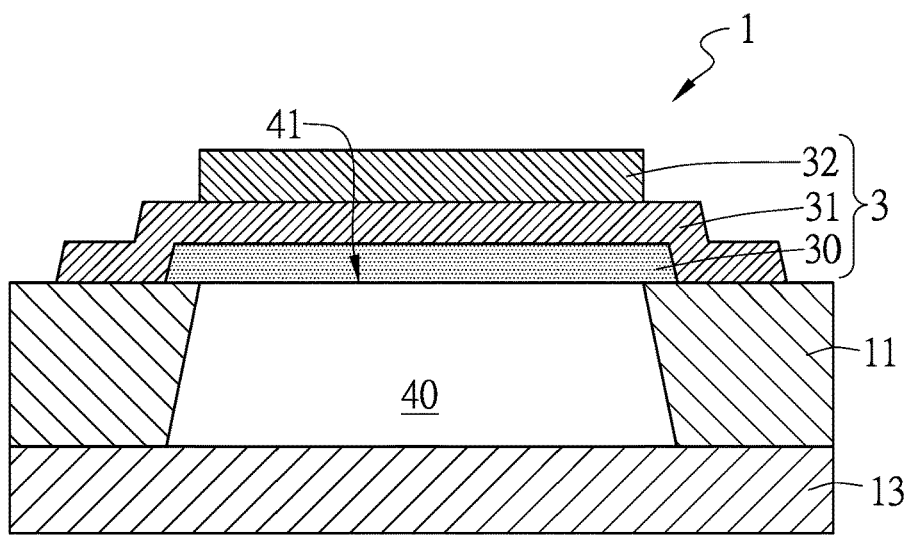

Please refer to FIGS. 1G and 1H, which are the cross-sectional schematics showing steps of another embodiment of a method for forming cavity of bulk acoustic wave resonator of the present invention. The main steps for forming the embodiment shown in FIG. 1H are basically the same as those for forming the embodiment shown in FIG. 1F, except that in the Step A3, the insulating layer 11 is polished such that the sacrificial epitaxial structure mesa 60 is exposed (please referring to FIG. 1G); then forming the bulk acoustic wave resonance structure 3 on the polished surface 41 and etching the sacrificial epitaxial structure mesa 60 to form the cavity 40 (please referring to FIG. 1H). In current embodiment, the bulk acoustic wave resonance structure 3 does not have the frequency tuning structure 50 as the embodiment shown in FIG. 1F.

Figure 1I:
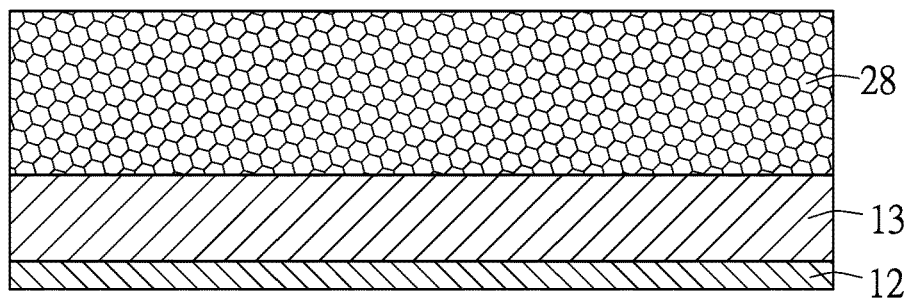
FIG. 1I is the cross-sectional schematic showing an epitaxial structure of an embodiment of a method for forming cavity of bulk acoustic wave resonator of the present invention.

Please refer to FIG. 1I, which is the cross-sectional schematic showing an epitaxial structure of an embodiment of a method for forming cavity of bulk acoustic wave resonator of the present invention. The main structure of the epitaxial structure of the embodiment in FIG. 1I is basically the same as that of the embodiment in FIG. 1A, except that an etching protection layer 12 is further formed on a bottom surface of the compound semiconductor substrate 13. The function of the etching protection layer 12 is to protect the bottom surface of the compound semiconductor substrate 13 so as to prevent the bottom surface of the compound semiconductor substrate 13 from damage of being etched during the etching process of the fabricating process (especially being etched by the etchant of the wet etching). The etching protection layer 12 is made of at least one material selected from the group consisting of: silicon nitride ($SiN_x$), silicon oxide ($SiO_2$), aluminum nitride (AlN) and photoresist. The preferable material for the etching protection layer 12 is silicon nitride. Usually the etching protection layer 12 will be removed after the Step A5 in order to perform a substrate thinning process. In all other embodiments of the present invention, no matter the substrate is a semiconductor substrate or a compound semiconductor substrate, the etching protection layer 12 can be applied to be formed on the bottom surface of the semiconductor substrate or the compound semiconductor substrate to protect the bottom surface of the substrate.

Figure 1J:
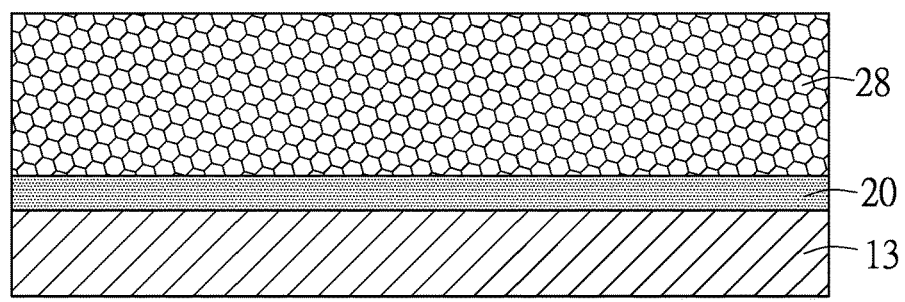
FIGS. 1J and 1K are the cross-sectional schematics showing steps of another embodiment of a method for forming cavity of bulk acoustic wave resonator of the present invention.
Figure 1K:
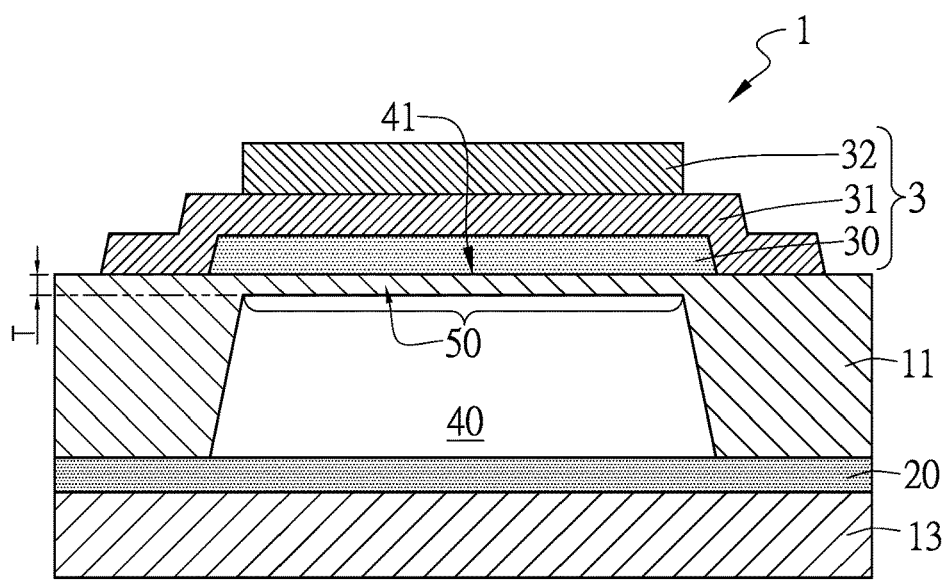

Please refer to FIGS. 1J and 1K, which are the cross-sectional schematics showing steps of another embodiment of a method for forming cavity of bulk acoustic wave resonator of the present invention. The main structure of the epitaxial structure of the embodiment in FIG. 1J is basically the same as that of the embodiment in FIG. 1A, except that a bottom etching stop layer 20 is further formed on the compound semiconductor substrate 13, wherein the sacrificial epitaxial structure 28 is formed on the bottom etching stop layer 20. When etching the sacrificial epitaxial structure 28 to form the sacrificial epitaxial structure mesa 60, the sacrificial epitaxial structure 28 around the sacrificial epitaxial structure mesa 60 is etched and the etching stops at the bottom etching stop layer 20. Under the sacrificial epitaxial structure mesa 60 is the bottom etching stop layer 20. The embodiment of the bulk acoustic wave resonator shown in FIG. 1K is fabricated from the epitaxial structure of the embodiment shown in FIG. 1J. The main structure of the embodiment in FIG. 1K is basically the same as that of the embodiment in FIG. 1F, except that a bottom etching stop layer 20 is further formed on the compound semiconductor substrate 13. In the Step A2, the insulating layer 11 is formed on the sacrificial epitaxial structure mesa 60 and the bottom etching stop layer 20. Therefore, after the sacrificial epitaxial structure mesa 60 is etched in the Step A5, the cavity 40 is formed above the bottom etching stop layer 20. In some embodiments, the compound semiconductor substrate 13 is made of GaAs; the sacrificial epitaxial structure 28 comprises a sacrificial epitaxial layer; the sacrificial epitaxial layer is made of GaAs; wherein the sacrificial epitaxial layer has a thickness between 50 nm and 5000 nm; the bottom etching stop layer 20 is made of InGaP; wherein the bottom etching stop layer 20 has a thickness between 20 nm and 500 nm. In some other embodiments, the compound semiconductor substrate 13 is made of InP; the sacrificial epitaxial structure 28 comprises a sacrificial epitaxial layer; the sacrificial epitaxial layer is made of InGaAs; wherein the sacrificial epitaxial layer has a thickness between 50 nm and 5000 nm; the bottom etching stop layer 20 is made of InP; wherein the bottom etching stop layer 20 has a thickness between 20 nm and 500 nm.

Figure 1L:
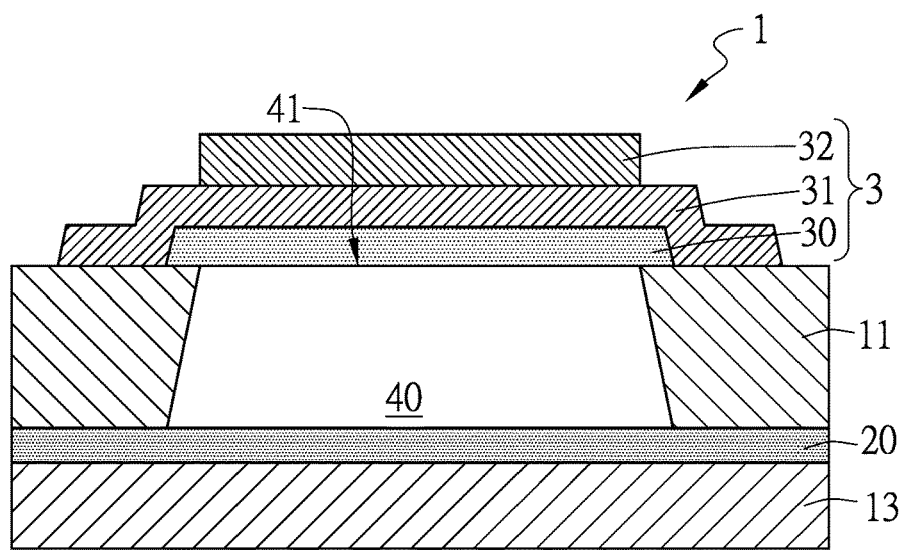
FIG. 1L is the cross-sectional schematic showing an embodiment of a method for forming cavity of bulk acoustic wave resonator of the present invention.

Please refer to FIG. 1L, which is the cross-sectional schematic showing an embodiment of a method for forming cavity of bulk acoustic wave resonator of the present invention. The embodiment of the bulk acoustic wave resonator shown in FIG. 1L is also fabricated from the epitaxial structure of the embodiment shown in FIG. 1J. The main structure of the embodiment in FIG. 1L is basically the same as that of the embodiment in FIG. 1K, except that in the Step A3, the insulating layer 11 is polished such that the sacrificial epitaxial structure mesa 60 is exposed; then forming the bulk acoustic wave resonance structure 3 on the polished surface 41 and etching the sacrificial epitaxial structure mesa 60 to form the cavity 40 (similar to FIG. 1G and FIG. 1H). Therefore, the bulk acoustic wave resonance structure 3 does not have the frequency tuning structure 50 as the embodiment shown in FIG. 1K.

Figure 2A:
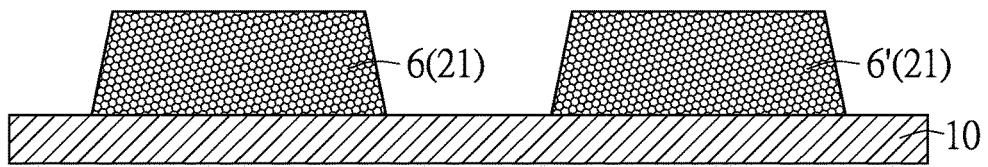
FIGS. 2A~2F are the cross-sectional schematics showing steps of an embodiment of a method of frequency tuning for bulk acoustic wave resonator of bulk acoustic wave filter of the present invention.
Figure 2B:
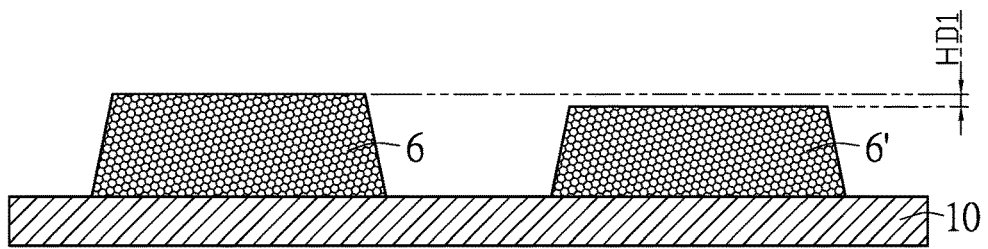
Figure 2C:
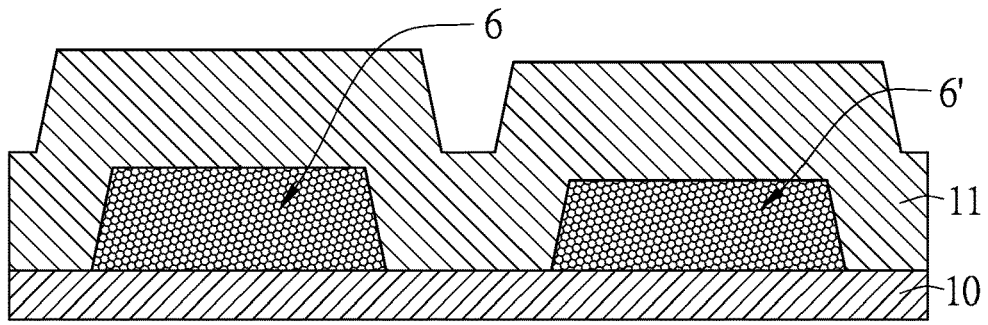
Figure 2D:
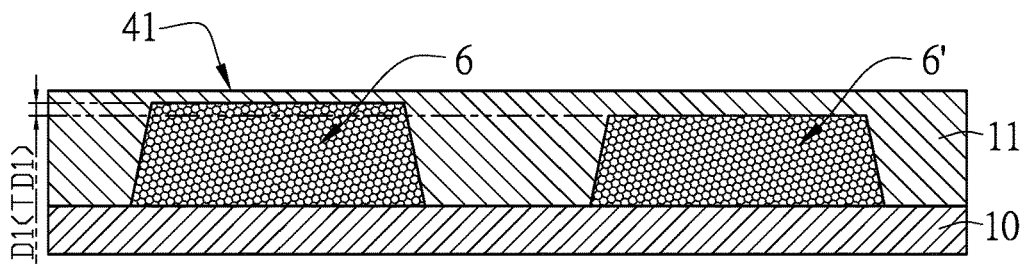
Figure 2E:
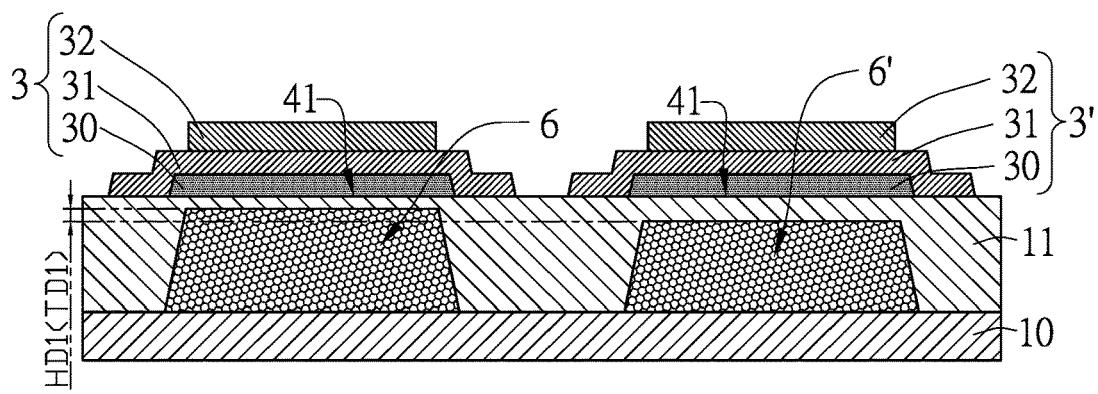
Figure 2F:
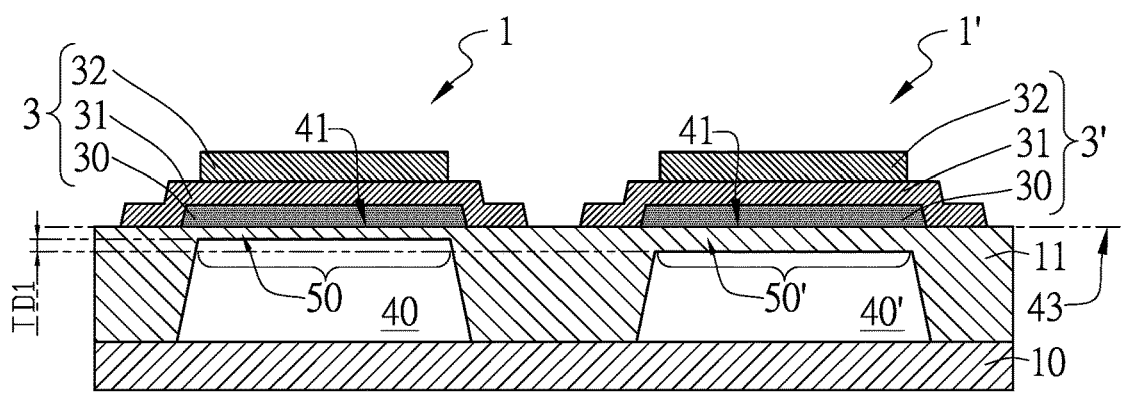

Furthermore, please refer to FIGS. 2A~2F, which are the cross-sectional schematics showing steps of an embodiment of a method of frequency tuning for bulk acoustic wave resonator of bulk acoustic wave filter of the present invention. As shown in FIG. 2F, the structure of the embodiment comprises at least one first bulk acoustic wave resonator 1 and at least one second bulk acoustic wave resonator 1' formed on a substrate 10 respectively. In current embodiment, the at least one first bulk acoustic wave resonator 1 may be a series resonator, while the at least one second bulk acoustic wave resonator 1' may be a shunt resonator. The at least one first bulk acoustic wave resonator 1 comprises at least one first bulk acoustic wave resonance structure 3, a first frequency tuning structure 50 and at least one first cavity 40. The at least one second bulk acoustic wave resonator 1' comprises at least one second bulk acoustic wave resonance structure 3', a second frequency tuning structure 50' and at least one second cavity 40'. A method of frequency tuning for bulk acoustic wave resonator of bulk acoustic wave filter of the present invention comprises following steps of: Step B1: (please referring to FIG. 2B) forming a plural of sacrificial structure mesas on a substrate 10, wherein the plural of sacrificial structure mesas comprise at least one first sacrificial structure mesa 6 and at least one second sacrificial structure mesa 6', wherein a height of the at least one first sacrificial structure mesa 6 is greater than a height of the at least one second sacrificial structure mesa 6', wherein the at least one first sacrificial structure mesa 6 and the at least one second sacrificial structure mesa 6' have a first height difference HD1; in current embodiment, the substrate 10 may be a semiconductor substrate; the plural of sacrificial structure mesas are made of at least one material selected from the group consisting of: metal, alloy and epitaxial structure; Step B2: (please referring to FIG. 2C) forming an insulating layer 11 on the plural of sacrificial structure mesas and the substrate 10; wherein the insulating layer 11 is made of at least one material selected from the group consisting of: silicon nitride ($SiN_x$), silicon oxide ($SiO_2$) and polymer; Step B3: (please referring to FIG. 2D) polishing the insulating layer 11 by a chemical-mechanical planarization process to form a polished surface 41; Step B4: (please referring to FIG. 2E) forming a plural of bulk acoustic wave resonance structures on the polished surface 41 (In all the embodiments of the bulk acoustic wave filter of the present invention, the plural of bulk acoustic wave resonance structures are all formed on an extending plane 43; in current embodiment, the extending plane 43 is coincident with the polished surface 41), wherein the plural of bulk acoustic wave resonance structures comprise at least one first bulk acoustic wave resonance structure 3 and at least one second bulk acoustic wave resonance structure 3', the at least one first bulk acoustic wave resonance structure 3 and the at least one second bulk acoustic wave resonance structure 3' are located above the at least one first sacrificial structure mesa 6 and the at least one second sacrificial structure mesa 6' respectively, wherein the Step B4 comprises following steps of: Step B41: forming a bottom electrode layer 30 on the polished surface 41; Step B42: forming a piezoelectric layer 31 on the bottom electrode layer 30; and Step B43: forming a top electrode layer 32 on the piezoelectric layer 31; and Step B5: (please referring to FIG. 2F) etching the plural of sacrificial structure mesas to form a plural of cavities, wherein the plural of cavities are located under the plural of bulk acoustic wave resonance structures respectively; wherein the plural of cavities comprise at least one first cavity 40 and at least one second cavity 40', the at least one first cavity 40 and the at least one second cavity 40' are located under the at least one first bulk acoustic wave resonance structure 3 and the at least one second bulk acoustic wave resonance structure 3' respectively; wherein in the Step B3, the insulating layer 11 is polished such that the at least one first sacrificial structure mesa 6 and the at least one second sacrificial structure mesa 6' are not exposed, thereby the insulating layer 11 under the polished surface 41 and located under the at least one first bulk acoustic wave resonance structure 3 and the at least one second bulk acoustic wave resonance structure 3' form a first frequency tuning structure 50 of the at least one first bulk acoustic wave resonance structure 3 and a second frequency tuning structure 50' of the at least one second bulk acoustic wave resonance structure 3' respectively, wherein the first frequency tuning structure 50 and the second frequency tuning structure 50' have a first thickness difference TD1, the first thickness difference TD1 is equal to the first height difference HD1; wherein a first resonance frequency F1 of the at least one first bulk acoustic wave resonance structure 3 will be tuned down by the first frequency tuning structure 50, while a second resonance frequency F2 of the at least one second bulk acoustic wave resonance structure 3' will be tuned down by the second frequency tuning structure 50'. Since a thickness of the second frequency tuning structure 50' is thicker than a thickness of the first frequency tuning structure 50 such that the second resonance frequency F2 of the at least one second bulk acoustic wave resonance structure 3' is tuned down to be lower than the first resonance frequency F1 of the at least one first bulk acoustic wave resonance structure 3. Therefore, the at least one first bulk acoustic wave resonance structure 3 and the at least one second bulk acoustic wave resonance structure 3' have a first resonance frequency difference FD1, the first resonance frequency difference FD1 is correlated to the first thickness difference TD1 of the first frequency tuning structure 50 and the second frequency tuning structure 50'; that is that the first resonance frequency difference FD1 is correlated to the first height difference HD1 of the at least one first sacrificial structure mesa 6 and the at least one second sacrificial structure mesa 6'; thereby adjusting the first height difference HD1 is capable of tuning the first resonance frequency difference FD1 of the at least one first bulk acoustic wave resonance structure 3 and the at least one second bulk acoustic wave resonance structure 3'. Since the dimension of the substrate 10 is much greater than the dimension of the bulk acoustic wave resonator, when polishing the insulating layer 11 by a chemical-mechanical planarization process, usually the polished-off thickness of the insulating layer 11 at the location near the center of the substrate 10 is not equal to the polished-off thickness of the insulating layer 11 at the location away from the center of the substrate 10. However, for the adjacent bulk acoustic wave resonators, especially for the plural of bulk acoustic wave resonators of the same bulk acoustic wave filter, the polished-off thickness of the insulating layer 11 is almost the same. One of the characteristics of the present invention is that the first thickness difference TD1 of the first frequency tuning structure 50 and the second frequency tuning structure 50' of the same bulk acoustic wave filter does not vary depending on the location near the center of the substrate 10 or the location away from the center of the substrate 10. That is to say that the first resonance frequency difference FD1 of the at least one first bulk acoustic wave resonance structure 3 and the at least one second bulk acoustic wave resonance structure 3' of the same bulk acoustic wave filter does not vary depending on the location near the center of the substrate 10 or the location away from the center of the substrate 10. Within the same bulk acoustic wave filter, the first resonance frequency difference FD1 of the at least one first bulk acoustic wave resonance structure 3 and the at least one second bulk acoustic wave resonance structure 3' is correlated to the first thickness difference TD1 of the first frequency tuning structure 50 and the second frequency tuning structure 50', correlated to the first height difference HD1 of the at least one first sacrificial structure mesa 6 and the at least one second sacrificial structure mesa 6', and also correlated to the material of the first frequency tuning structure 50 and the second frequency tuning structure 50'. By adjusting the first height difference HD1 or choosing different kinds of materials of the first frequency tuning structure 50 and the second frequency tuning structure 50' is capable of tuning the first resonance frequency difference FD1 of the at least one first bulk acoustic wave resonance structure 3 and the at least one second bulk acoustic wave resonance structure 3'. Moreover, in the present invention, the first resonance frequency difference FD1 of the at least one first bulk acoustic wave resonance structure 3 and the at least one second bulk acoustic wave resonance structure 3' of the same bulk acoustic wave filter does not vary depending on the location near the center of the substrate 10 or the location away from the center of the substrate 10. This is one of the main features of the present invention and is a great help for the later trimming process. Since the first resonance frequency difference FD1 of the at least one first bulk acoustic wave resonance structure 3 and the at least one second bulk acoustic wave resonance structure 3' of the same bulk acoustic wave filter on any area of the wafer may be precisely controlled and does not vary depending on the location, so that the time cost of the trimming process may be significantly reduced. In some embodiments, the substrate 10 may be a compound semiconductor substrate; the plural of sacrificial structure mesas may be made of an epitaxial structure; and wherein the Step B1 comprises following steps of: Step B11: (please referring to FIG. 2A) forming a sacrificial structure 21 on the substrate 10; Step B12: etching the sacrificial structure 21 to form the plural of sacrificial structure mesas, wherein the plural of sacrificial structure mesas comprise the at least one first sacrificial structure mesa 6(21) and the at least one second sacrificial structure mesa 6'(21), wherein the plural of sacrificial structure mesas have the same height; and the Step B13: (please referring to FIG. 2B) etching the at least one first sacrificial structure mesa 6 and the at least one second sacrificial structure mesa 6' or etching the at least one second sacrificial structure mesa 6' such that the at least one first sacrificial structure mesa 6 and the at least one second sacrificial structure mesa 6' have the first height difference HD1.

Figure 2G:
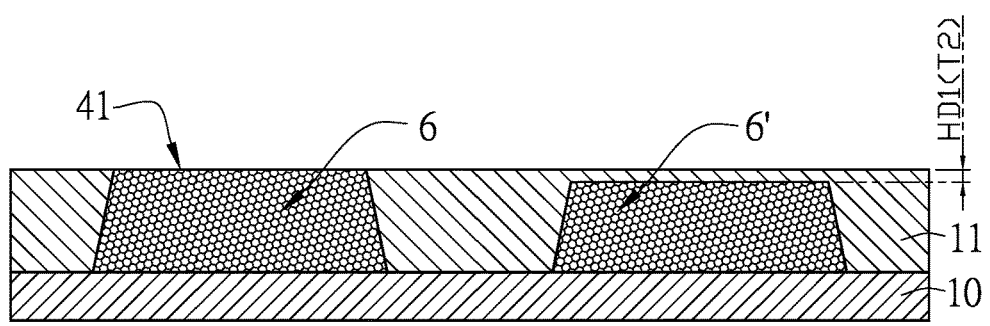
FIGS. 2G and 2H are the cross-sectional schematics showing steps of another embodiment of a method of frequency tuning for bulk acoustic wave resonator of bulk acoustic wave filter of the present invention.
Figure 2H:
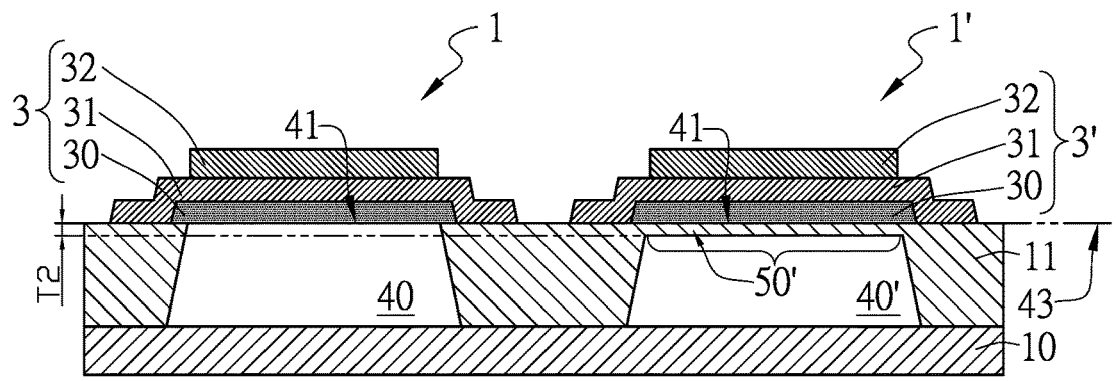

Please refer to FIGS. 2G and 2H, which are the cross-sectional schematics showing steps of another embodiment of a method of frequency tuning for bulk acoustic wave resonator of bulk acoustic wave filter of the present invention. In current embodiment, the substrate 10 may be a semiconductor substrate; the plural of sacrificial structure mesas may be made of at least one material selected from the group consisting of: metal, alloy and epitaxial structure. The main steps for forming the embodiment shown in FIG. 2H are basically the same as those for forming the embodiment shown in FIG. 2F, except that in the Step B3, the insulating layer 11 is polished such that the at least one first sacrificial structure mesa 6 is exposed and the at least one second sacrificial structure mesa 6' is not exposed (please referring to FIG. 2G), thereby the insulating layer 11 under the polished surface 41 (the extending plane 43) and located under the at least one second bulk acoustic wave resonance structure 3' forms a second frequency tuning structure 50' of the at least one second bulk acoustic wave resonance structure 3'. As shown in FIG. 2H, the second frequency tuning structure 50' has a thickness T2. The thickness T2 of the second frequency tuning structure 50' is equal to the first height difference HD1. A spacing between the substrate 10 and the second frequency tuning structure 50' is less than a spacing between the substrate 10 and the bottom electrode layer 30 of the first bulk acoustic wave resonance structure 3. In current embodiment, there is no such a first frequency tuning structure 50 as shown in the embodiment of FIG. 2F. Therefore, the first resonance frequency difference FD1 of the at least one first bulk acoustic wave resonance structure 3 and the at least one second bulk acoustic wave resonance structure 3' is correlated to the thickness T2 of the second frequency tuning structure 50'; that is that the first resonance frequency difference FD1 is correlated to the first height difference HD1 of the at least one first sacrificial structure mesa 6 and the at least one second sacrificial structure mesa 6'; thereby adjusting the first height difference HD1 is capable of tuning the first resonance frequency difference FD1 of the at least one first bulk acoustic wave resonance structure 3 and the at least one second bulk acoustic wave resonance structure 3'.

Figure 2I:
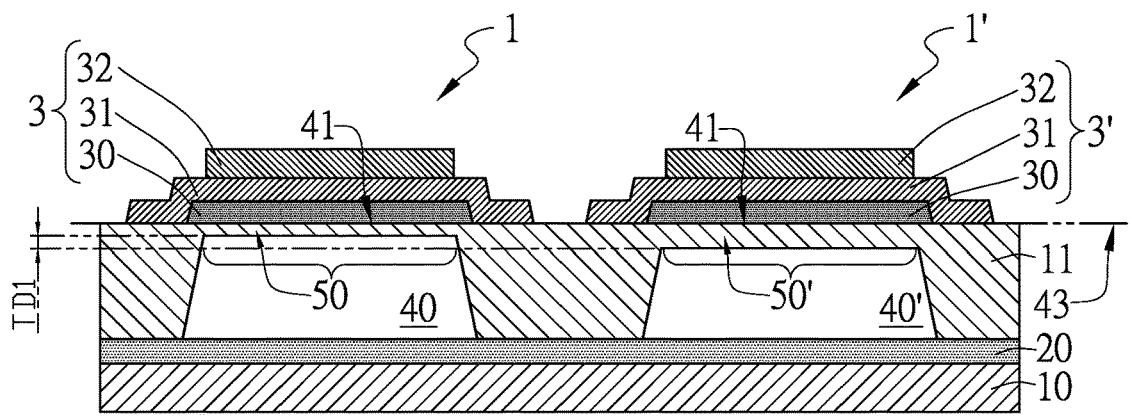
FIGS. 2I and 2J are the cross-sectional schematics showing two embodiments of a method of frequency tuning for bulk acoustic wave resonator of bulk acoustic wave filter of the present invention.

Please refer to FIG. 2I, which is the cross-sectional schematic showing another embodiment of a method of frequency tuning for bulk acoustic wave resonator of bulk acoustic wave filter of the present invention. The main structure of the embodiment in FIG. 2I is basically the same as that of the embodiment in FIG. 2F, except that a bottom etching stop layer 20 is further formed on the substrate 10, wherein the insulating layer 11 is formed on the bottom etching stop layer 20. The at least one first cavity 40 and the at least one second cavity 40' are located above the bottom etching stop layer 20. The main steps for forming the embodiment shown in FIG. 2I are basically the same as those for forming the embodiment shown in FIG. 2F, except that before the Step B11, further comprises a following step of: forming a bottom etching stop layer 20 on the substrate 10, wherein in the Step B11 the sacrificial structure 21 is formed on the bottom etching stop layer 20. In the Step B2, the insulating layer 11 is formed on the plural of sacrificial structure mesas and the bottom etching stop layer 20. In current embodiment, the substrate 10 may be a compound semiconductor substrate; the plural of sacrificial structure mesas (the sacrificial structure 21) may be made of an epitaxial structure. In some embodiments, the substrate 10 is made of GaAs; the sacrificial structure 21 comprises a sacrificial epitaxial layer, wherein the sacrificial epitaxial layer is made of GaAs, the sacrificial epitaxial layer has a thickness between 50 nm and 5000 nm; the bottom etching stop layer 20 is made of InGaP, wherein the bottom etching stop layer 20 has a thickness between 20 nm and 500 nm. In some other embodiments, the substrate 10 is made of InP; the sacrificial structure 21 comprises a sacrificial epitaxial layer, wherein the sacrificial epitaxial layer is made of InGaAs, the sacrificial epitaxial layer has a thickness between 50 nm and 5000 nm; the bottom etching stop layer 20 is made of InP, wherein the bottom etching stop layer 20 has a thickness between 20 nm and 500 nm.

Figure 2J:
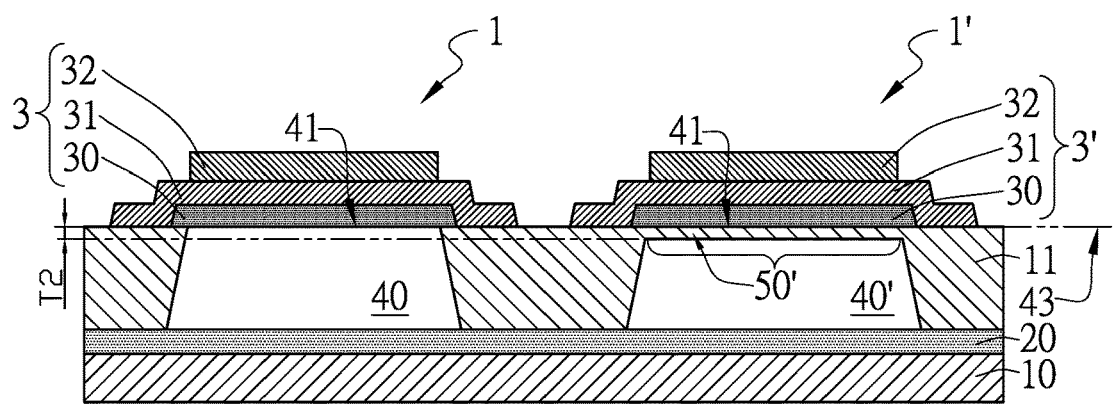

Please refer to FIG. 2J, which is the cross-sectional schematic showing another embodiment of a method of frequency tuning for bulk acoustic wave resonator of bulk acoustic wave filter of the present invention. The substrate 10 may be a compound semiconductor substrate; the plural of sacrificial structure mesas may be made of an epitaxial structure. The main structure of the embodiment in FIG. 2J is basically the same as that of the embodiment in FIG. 2I, except that in the Step B3, the insulating layer 11 is polished such that the at least one first sacrificial structure mesa 6 is exposed and the at least one second sacrificial structure mesa 6' is not exposed (similar to FIG. 2G), thereby the insulating layer 11 under the polished surface 41 (the extending plane 43) and located under the at least one second bulk acoustic wave resonance structure 3' forms a second frequency tuning structure 50' of the at least one second bulk acoustic wave resonance structure 3'.

Figure 2K:
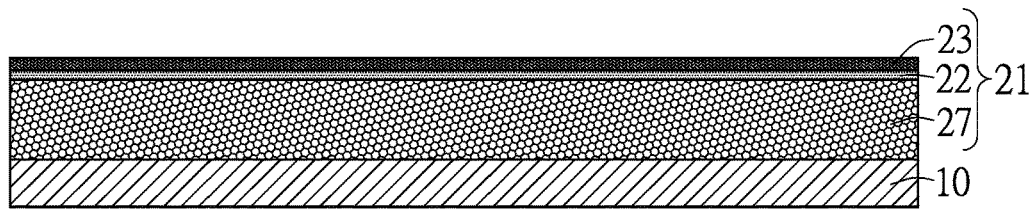
FIGS. 2K~2N are the cross-sectional schematics showing steps of another embodiment of a method of frequency tuning for bulk acoustic wave resonator of bulk acoustic wave filter of the present invention.
Figure 2L:
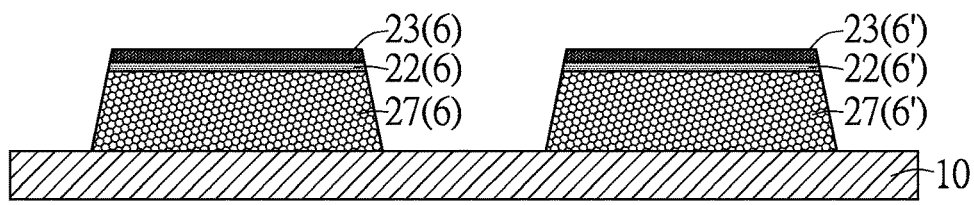
Figure 2M:
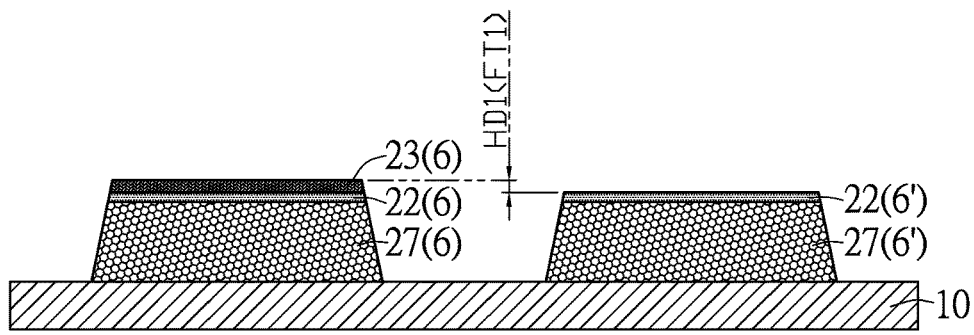
Figure 2N:
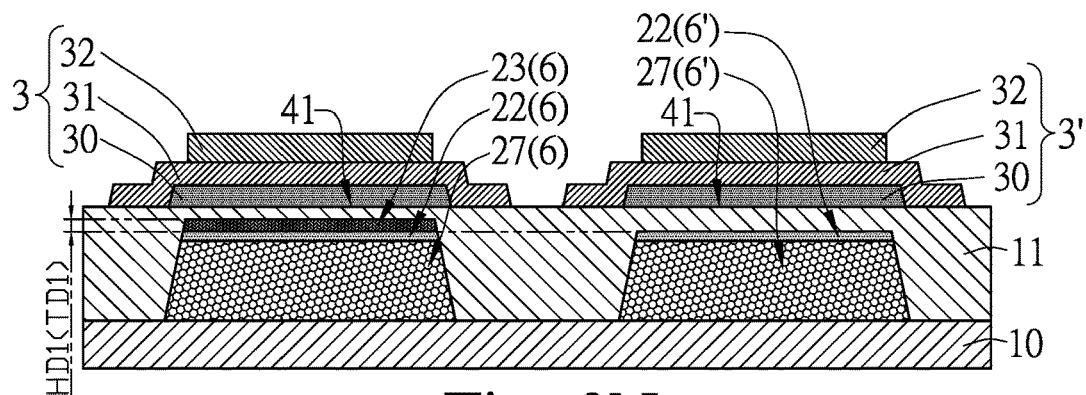

Please refer to FIGS. 2K~2N, which are the cross-sectional schematics showing steps of another embodiment of a method of frequency tuning for bulk acoustic wave resonator of bulk acoustic wave filter of the present invention. In the embodiment of FIG. 2K, the substrate 10 may be a compound semiconductor substrate; the sacrificial structure 21 may be made of an epitaxial structure. The main structure of the epitaxial structure of the embodiment in FIG. 2K is basically the same as that of the embodiment in FIG. 2A, except that the sacrificial structure 21 comprises a sacrificial epitaxial layer 27, a first etching stop layer 22 and a first fine tuning layer 23, wherein the sacrificial epitaxial layer 27 is formed on the substrate 10, the first etching stop layer 22 is formed on the sacrificial epitaxial layer 27, the first fine tuning layer 23 is formed on the first etching stop layer 22. As shown in FIG. 2L, the sacrificial structure 21 is etched to form the plural of sacrificial structure mesas, wherein the plural of sacrificial structure mesas comprise the at least one first sacrificial structure mesa 6 and the at least one second sacrificial structure mesa 6', wherein the plural of sacrificial structure mesas have the same height (the Step B12). As shown in FIG. 2M, the first fine tuning layer 23 has a thickness FT1. Etching the first fine tuning layer 23 of the at least one second sacrificial structure mesa 6' such that the at least one first sacrificial structure mesa 6 and the at least one second sacrificial structure mesa 6' have the first height difference HD1 (the Step B13). After the Step B2, the Step B3 and the Step B4, the result is shown in FIG. 2N. After etching (the Step B5) the at least one first sacrificial structure mesa 6 and the at least one second sacrificial structure mesa 6' in FIG. 2N, the result is the embodiment of FIG. 2F. The first height difference HD1 is determined by the thickness FT1 of the first fine tuning layer 23, therefore, it helps to precisely adjust the first height difference HD1. It also helps to precisely tune the first resonance frequency difference FD1 of the at least one first bulk acoustic wave resonance structure 3 and the at least one second bulk acoustic wave resonance structure 3'. In some embodiments, the substrate 10 is made of GaAs; the sacrificial epitaxial layer 27 is made of GaAs; the first etching stop layer 22 is made of AlAs or InGaP, wherein the first etching stop layer 22 has a thickness between 1 nm and 50 nm; the first fine tuning layer 23 is made of GaAs, wherein the thickness FT1 of the first fine tuning layer 23 is between 1 nm and 300 nm. In some other embodiments, the substrate 10 is made of InP; the sacrificial epitaxial layer 27 is made of InGaAs; the first etching stop layer 22 is made of InP, wherein the first etching stop layer 22 has a thickness between 1 nm and 50 nm; the first fine tuning layer 23 is made of InGaAs, wherein the thickness FT1 of the first fine tuning layer 23 is between 1 nm and 300 nm.

Please refer to FIGS. 3A~3G, which are the cross-sectional schematics showing steps of an embodiment of a method of frequency tuning for bulk acoustic wave resonator of bulk acoustic wave filter of the present invention. Using a method of frequency tuning for bulk acoustic wave resonator of bulk acoustic wave filter of the present invention to form at least one first bulk acoustic wave resonator 1 and at least one second bulk acoustic wave resonator 1'

(please referring to FIG. 3G) comprises following steps of: Step C1: forming a plural of sacrificial structure mesas on a substrate 10, wherein the plural of sacrificial structure mesas have the same height, wherein the plural of sacrificial structure mesas comprise at least one first sacrificial structure mesa 6 and at least one second sacrificial structure mesa 6'; in current embodiment, the substrate 10 may be a semiconductor substrate; the plural of sacrificial structure mesas may be made of at least one material selected from the group consisting of: metal, alloy and epitaxial structure; Step C2: (please referring to FIG. 3A) forming an insulating layer 11 on the plural of sacrificial structure mesas and the substrate 10; Step C3: (please referring to FIG. 3B) polishing the insulating layer 11 by a prior chemical-mechanical planarization process to form a pre-polished surface 42 such that the plural of sacrificial structure mesas are exposed; Step C4: (please referring to FIG. 3C) etching the at least one second sacrificial structure mesa 6' such that the at least one first sacrificial structure mesa 6 and the at least one second sacrificial structure mesa 6' have a first height difference HD1, wherein a height of the at least one first sacrificial structure mesa 6 is greater than a height of the at least one second sacrificial structure mesa 6'; Step C5: (please referring to FIG. 3D~FIG. 3F) forming a plural of bulk acoustic wave resonance structures, wherein the plural of bulk acoustic wave resonance structures comprise at least one first bulk acoustic wave resonance structure 3 and at least one second bulk acoustic wave resonance structure 3', wherein the at least one first bulk acoustic wave resonance structure 3 and the at least one second bulk acoustic wave resonance structure 3' are located above the at least one first sacrificial structure mesa 6 and the at least one second sacrificial structure mesa 6' respectively, wherein the Step C5 comprises following steps of: Step C51: forming a second polish layer 51 on the plural of sacrificial structure mesas and the insulating layer 11, wherein the second polish layer 51 is made of insulator, wherein the material of the insulator of the second polish layer 51 may be at least one material selected from the group consisting of: silicon nitride (SiN$_x$), silicon oxide (SiO$_2$), aluminium nitride (AlN) and zinc oxide (ZnO); Step C52: polishing the second polish layer 51 by a chemical-mechanical planarization process to form a polished surface 41 such that the at least one first sacrificial structure mesa 6 and the at least one second sacrificial structure mesa 6' are not exposed, thereby the second polish layer 51 under the polished surface 41 and located under the at least one first bulk acoustic wave resonance structure 3 and the at least one second bulk acoustic wave resonance structure 3' form a first frequency tuning structure 50 of the at least one first bulk acoustic wave resonance structure 3 and a second frequency tuning structure 50' of the at least one second bulk acoustic wave resonance structure 3' respectively, wherein the first frequency tuning structure 50 and the second frequency tuning structure 50' have a first thickness difference TD1, the first thickness difference TD1 is equal to the first height difference HD1; Step C53: forming a bottom electrode layer 30 on the polished surface 41 (as mentioned above, the plural of bulk acoustic wave resonance structures are formed on an extending plane 43; in current embodiment, the extending plane 43 is coincident with the polished surface 41); Step C54: forming a piezoelectric layer 31 on the bottom electrode layer 30; and Step C55: forming a top electrode layer 32 on the piezoelectric layer 31; and Step C6: (please referring to FIG. 3G) etching the plural of sacrificial structure mesas to form a plural of cavities, wherein the plural of cavities are located under the plural of bulk acoustic wave resonance structures respectively; wherein the plural of cavities comprise at least one first cavity 40 and at least one second cavity 40'; wherein the at least one first bulk acoustic wave resonance structure 3 and the at least one second bulk acoustic wave resonance structure 3' have a first resonance frequency difference FD1, the first resonance frequency difference FD1 is correlated to the first thickness difference TD1 of the first frequency tuning structure 50 and the second frequency tuning structure 50' (a spacing between the substrate 10 and the second frequency tuning structure 50' is less than a spacing between the substrate 10 and the first frequency tuning structure 50); that is that the first resonance frequency difference FD1 is correlated to the first height difference HD1, thereby adjusting the first height difference HD1 is capable of tuning the first resonance frequency difference FD1 of the at least one first bulk acoustic wave resonance structure 3 and the at least one second bulk acoustic wave resonance structure 3'. In some embodiments, the substrate 10 may be a compound semiconductor substrate; the plural of sacrificial structure mesas may be made of an epitaxial structure; and wherein the Step C1 comprises following steps of: Step C11: forming a sacrificial structure 21 on the substrate 10; and Step C12: etching the sacrificial structure 21 to form the plural of sacrificial structure mesas, wherein the plural of sacrificial structure mesas have the same height.

Figure 3A:
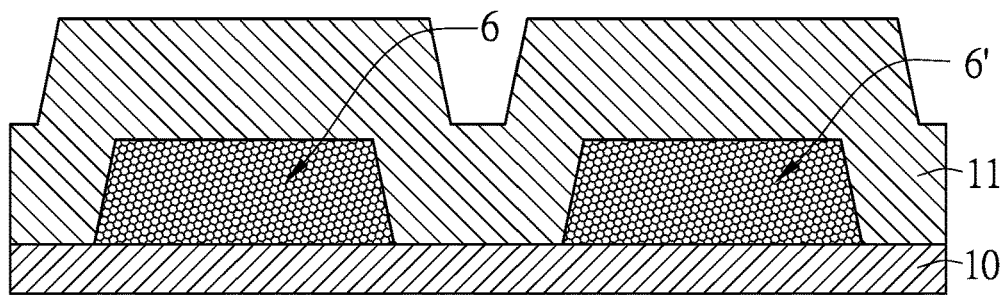
FIGS. 3A~3G are the cross-sectional schematics showing steps of an embodiment of a method of frequency tuning for bulk acoustic wave resonator of bulk acoustic wave filter of the present invention.
Figure 3B:
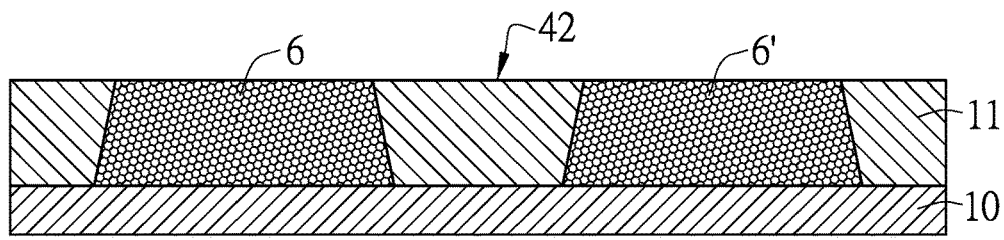
Figure 3C:
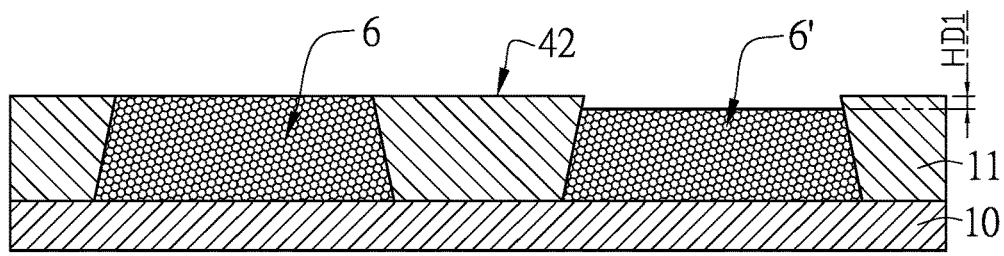
Figure 3D:
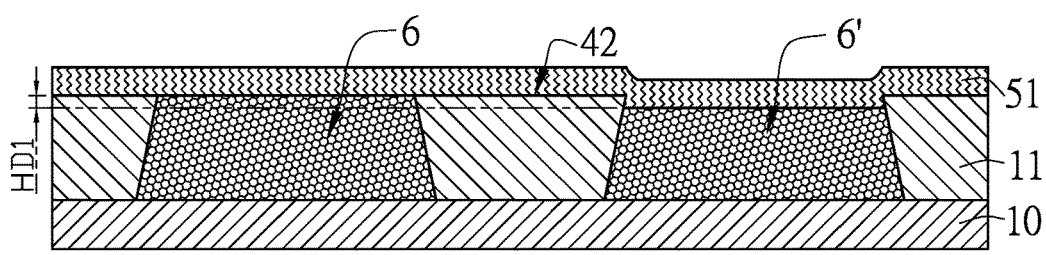
Figure 3E:
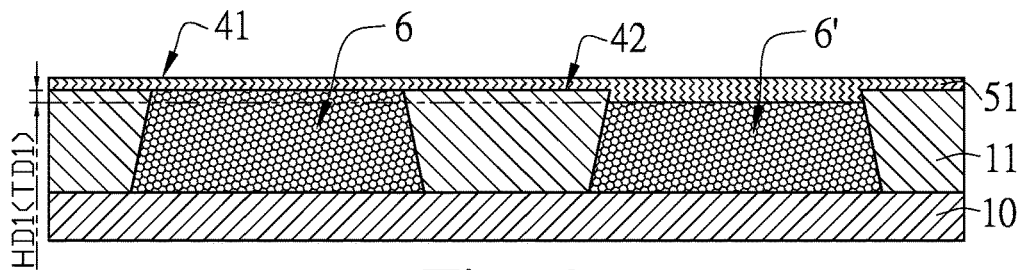
Figure 3F:
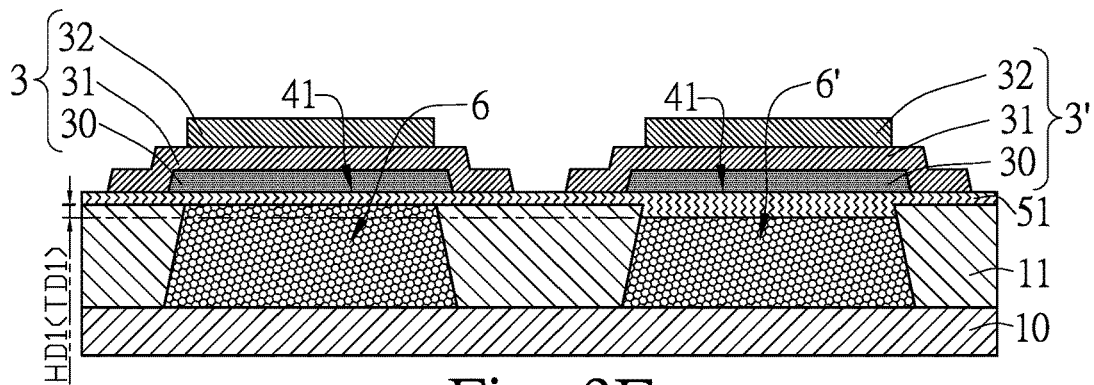
Figure 3G:
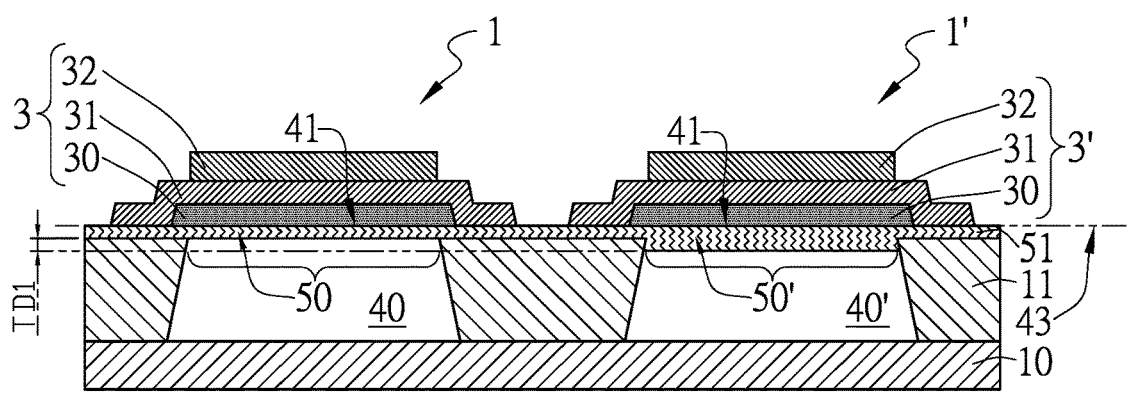
Figure 3H:
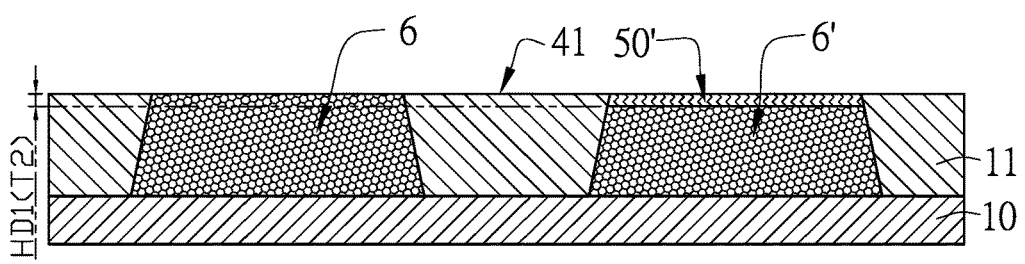
FIGS. 3H and 3I are the cross-sectional schematics showing steps of another embodiment of a method of frequency tuning for bulk acoustic wave resonator of bulk acoustic wave filter of the present invention.
Figure 3I:
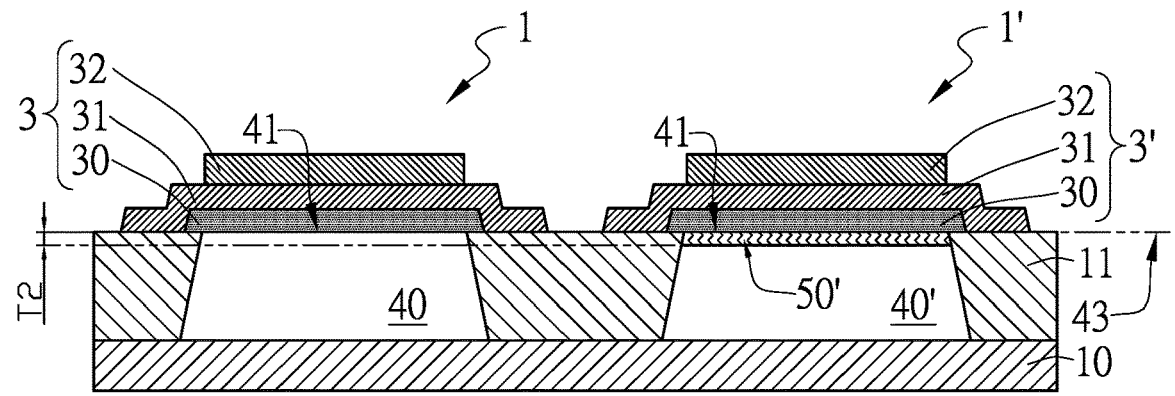

Please refer to FIGS. 3H and 3I, which are the cross-sectional schematics showing steps of another embodiment of a method of frequency tuning for bulk acoustic wave resonator of bulk acoustic wave filter of the present invention. In current embodiment, the substrate 10 may be a semiconductor substrate; the plural of sacrificial structure mesas may be made of at least one material selected from the group consisting of: metal, alloy and epitaxial structure. The main steps for forming the embodiment shown in FIG. 3I are basically the same as those for forming the embodiment shown in FIG. 3G, except that in the Step C52, the second polish layer 51 is polished such that the at least one first sacrificial structure mesa 6 is exposed and the at least one second sacrificial structure mesa 6' is not exposed (please referring to FIG. 3H), thereby the second polish layer 51 under the polished surface 41 (the extending plane 43) and located under the at least one second bulk acoustic wave resonance structure 3' forms a second frequency tuning structure 50' of the at least one second bulk acoustic wave resonance structure 3' (please referring to FIG. 3I), wherein the second frequency tuning structure 50' has a thickness T2, the thickness T2 of the second frequency tuning structure 50' is equal to the first height difference HD1. A spacing between the substrate 10 and the second frequency tuning structure 50' is less than a spacing between the substrate 10 and the bottom electrode layer 30 of the first bulk acoustic wave resonance structure 3. In current embodiment, there is no such a first frequency tuning structure 50 as shown in the embodiment of FIG. 3G. Therefore, the first resonance frequency difference FD1 of the at least one first bulk acoustic wave resonance structure 3 and the at least one second bulk acoustic wave resonance structure 3' is correlated to the thickness T2 of the second frequency tuning structure 50'; that is that the first resonance frequency difference FD1 is correlated to the first height difference HD1 of the at least one first sacrificial structure mesa 6 and the at least one second sacrificial structure mesa 6', thereby adjusting the first height difference HD1 is capable of tuning the first resonance frequency difference FD1 of the at least one first bulk acoustic wave resonance structure 3 and the at least one second bulk acoustic wave resonance structure 3'.

In current embodiment, the second polish layer 51 may be made of at least one material selected from the group consisting of: metal, alloy and insulator.

Figure 3J:
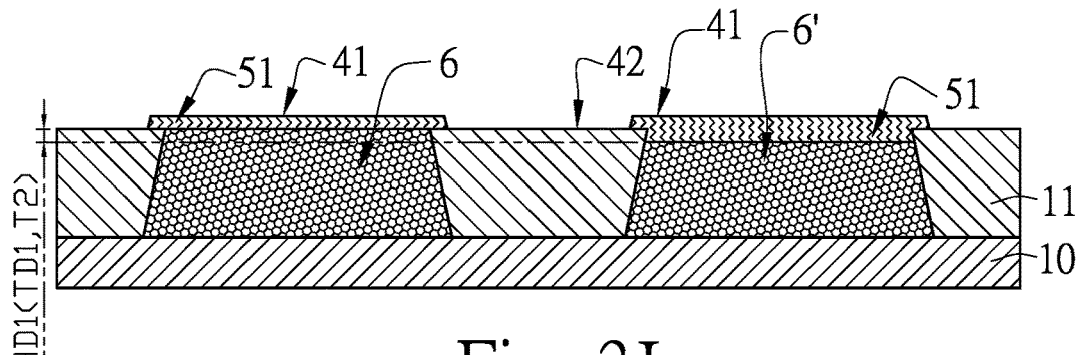
FIGS. 3J and 3K are the cross-sectional schematics showing steps of another embodiment of a method of frequency tuning for bulk acoustic wave resonator of bulk acoustic wave filter of the present invention.
Figure 3K:
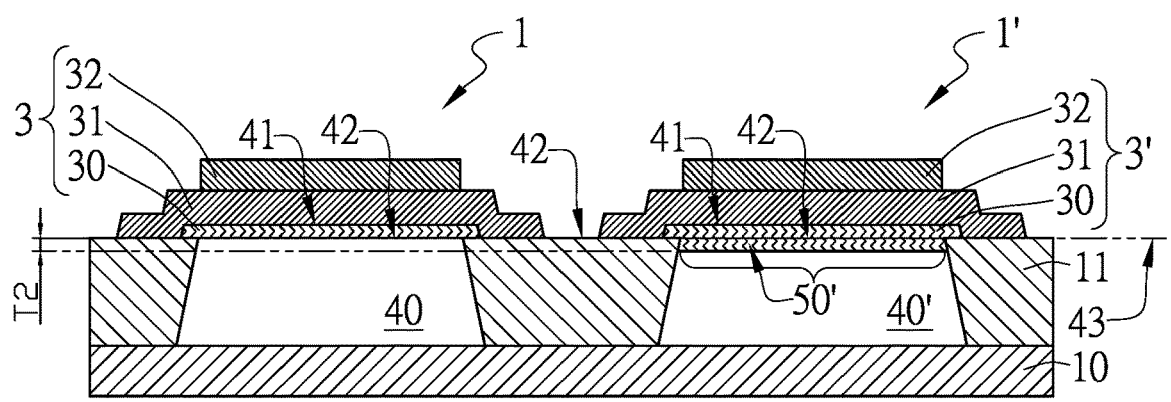

Please refer to FIGS. 3J and 3K, which are the cross-sectional schematics showing steps of another embodiment of a method of frequency tuning for bulk acoustic wave resonator of bulk acoustic wave filter of the present invention. In current embodiment, the substrate 10 may be a semiconductor substrate; the plural of sacrificial structure mesas may be made of at least one material selected from the group consisting of: metal, alloy and epitaxial structure. The main steps for forming the embodiment shown in FIG. 3K are basically the same as those for forming the embodiment shown in FIG. 3G, except that in the Step C5, the plural of bulk acoustic wave resonance structures are formed on an extending plane 43, wherein the extending plane 43 is coincident with the pre-polished surface 42, wherein the Step C5 comprises following steps of: Step C51': (please referring to FIG. 3D) forming a second polish layer 51 on the plural of sacrificial structure mesas and the insulating layer 11, wherein the second polish layer 51 is made of at least one material selected from the group consisting of: metal and alloy; in a preferable embodiment, the second polish layer 51 is made of at least one material selected from the group consisting of: Ru, Ti, Mo, Pt, Au, Al and W; Step C52': (please referring to FIG. 3E) polishing the second polish layer 51 by a chemical-mechanical planarization process to form a polished surface 41 such that the plural of sacrificial structure mesas are not exposed; Step C53': (please referring to FIG. 3J) patterning the second polish layer 51; Step C54': forming a piezoelectric layer 31 on the polished surface 41; and Step C55': forming a top electrode layer 32 on the piezoelectric layer 31. After the Step C6 etching the plural of sacrificial structure mesas, the embodiment of FIG. 3K is formed. In the Step C4, the at least one second sacrificial structure mesa 6' is etched; wherein the second polish layer 51 above the pre-polished surface 42 (the extending plane 43), under the polished surface 41 and located under the at least one first bulk acoustic wave resonance structure 3 forms a bottom electrode layer 30 of the at least one first bulk acoustic wave resonance structure 3; wherein the second polish layer 51 above the pre-polished surface 42 (the extending plane 43), under the polished surface 41 and located under the at least one second bulk acoustic wave resonance structure 3' forms a bottom electrode layer 30 of the at least one second bulk acoustic wave resonance structure 3'; wherein the second polish layer 51 under the pre-polished surface 42 (the extending plane 43) and located under the at least one second bulk acoustic wave resonance structure 3' forms a second frequency tuning structure 50' of the at least one second bulk acoustic wave resonance structure 3'; wherein the second frequency tuning structure 50' has a thickness T2, the thickness T2 of the second frequency tuning structure 50' is equal to the first height difference HD1 (a spacing between the substrate 10 and the second frequency tuning structure 50' is less than a spacing between the substrate 10 and the bottom electrode layer 30 of the first bulk acoustic wave resonance structure 3); thereby adjusting the first height difference HD1 is capable of tuning the first resonance frequency difference FD1 of the at least one first bulk acoustic wave resonance structure 3 and the at least one second bulk acoustic wave resonance structure 3'.

Figure 3L:
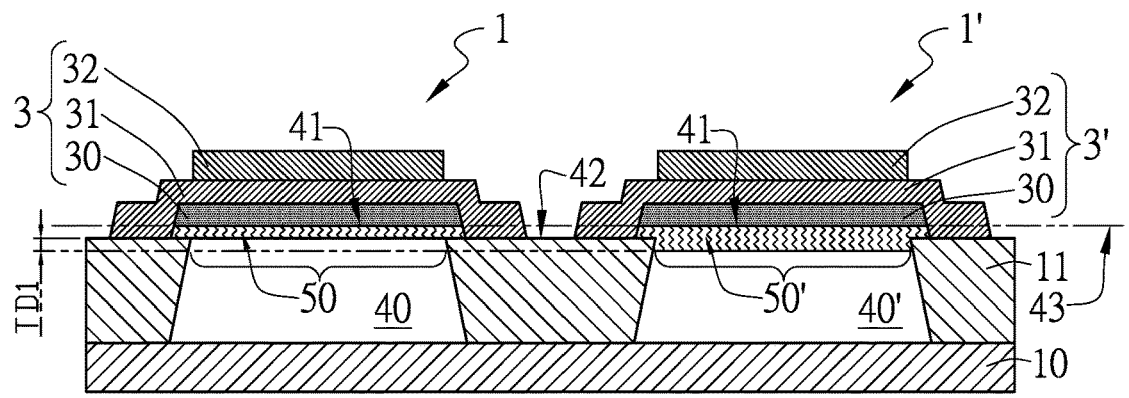
FIG. 3L is the cross-sectional schematic showing another embodiment of a method of frequency tuning for bulk acoustic wave resonator of bulk acoustic wave filter of the present invention.

Please refer to FIG. 3L, which is the cross-sectional schematic showing another embodiment of a method of frequency tuning for bulk acoustic wave resonator of bulk acoustic wave filter of the present invention. In current embodiment, the substrate 10 may be a semiconductor substrate; the plural of sacrificial structure mesas may be made of at least one material selected from the group consisting of: metal, alloy and epitaxial structure. The main steps for forming the embodiment shown in FIG. 3L are basically the same as those for forming the embodiment shown in FIG. 3G, except that the Step C5 comprises following steps of: Step C51": (please referring to FIG. 3D) forming a second polish layer 51 on the plural of sacrificial structure mesas and the insulating layer 11, wherein the second polish layer 51 is made of at least one material selected from the group consisting of: metal, alloy and insulator; Step C52": (please referring to FIG. 3E) polishing the second polish layer 51 by a chemical-mechanical planarization process to form a polished surface 41 such that the at least one first sacrificial structure mesa 6 and the at least one second sacrificial structure mesa 6' are not exposed; Step C53": (please referring to FIG. 3J) patterning the second polish layer 51; Step C54": forming a bottom electrode layer 30 on the polished surface 41 (the extending plane 43); Step C55": forming a piezoelectric layer 31 on the bottom electrode layer 30; and Step C56": forming a top electrode layer 32 on the piezoelectric layer 31. The embodiment of FIG. 3L is formed after the Step C6; thereby the second polish layer 51 under the polished surface 41 and located under the at least one first bulk acoustic wave resonance structure 3 and the at least one second bulk acoustic wave resonance structure 3' form a first frequency tuning structure 50 of the at least one first bulk acoustic wave resonance structure 3 and a second frequency tuning structure 50' of the at least one second bulk acoustic wave resonance structure 3' respectively, wherein the first frequency tuning structure 50 and the second frequency tuning structure 50' have a first thickness difference TD1 (a spacing between the substrate 10 and the second frequency tuning structure 50' is less than a spacing between the substrate 10 and the first frequency tuning structure 50), the first thickness difference TD1 is equal to the first height difference HD1; thereby adjusting the first height difference HD1 is capable of tuning the first resonance frequency difference FD1 of the at least one first bulk acoustic wave resonance structure 3 and the at least one second bulk acoustic wave resonance structure 3'.

In the embodiments of FIGS. 3G and 3I, in the Step C2 (please referring to FIG. 3A), a very thick insulating layer 11 is formed firstly, wherein a thickness of the insulating layer 11 must be higher than a height of the plural of sacrificial structure mesas. In the Step C3 (please referring to FIG. 3B), a chemical-mechanical planarization process must polish the insulating layer 11 a polished-off thickness which must be at least equal to or greater than the height of the plural of sacrificial structure mesas. However, there is a drawback to the chemical-mechanical planarization process. That is that when the required polished-off thickness is too thick, the uniformity of the polished surface will be deteriorated. In current embodiment, since the required polished-off thickness of the insulating layer 11 is very thick such that the uniformity of the pre-polished surface 42 is deteriorated after polished. However, the required polished-off thickness of the second polish layer 51 formed in the later Step C51 is very thin compared to the required polished-off thickness of the insulating layer 11. The polished-off thickness of the second polish layer 51 is only required to be greater than the first height difference HD1. Therefore, the uniformity of the polished surface 41 formed after polishing the second polish layer 51 by the chemical-mechanical planarization process in the Step C52 is not deteriorated. Hence, to form the bottom electrode layer 30 of the at least one first bulk acoustic wave resonator 1 and the at least one second bulk acoustic wave resonator 1' on the polished surface 41 helps to enhance the resonance characteristics of the at least one first bulk acoustic wave resonator 1 and the at least one second bulk acoustic wave resonator 1'. Similarly, it's also the same in the embodiment of FIG. 3L. While in the embodiment of FIG. 3K, to form the piezoelectric layer 31 of the at least one first bulk acoustic wave resonator 1 and the at least one second bulk acoustic wave resonator 1' on the polished surface 41 also helps to enhance the resonance characteristics of the at least one first bulk acoustic wave resonator 1 and the at least one second bulk acoustic wave resonator 1'.

The embodiments of FIGS. 3G, 3I, 3K and 3L may be formed from the sacrificial structure similar to that of FIG. 2K, wherein the substrate 10 is a compound semiconductor substrate; wherein the sacrificial structure 21 comprises a sacrificial epitaxial layer 27, a first etching stop layer 22 and a first fine tuning layer 23, wherein the sacrificial epitaxial layer 27 is formed on the substrate 10, the first etching stop layer 22 is formed on the sacrificial epitaxial layer 27, the first fine tuning layer 23 is formed on the first etching stop layer 22, wherein the first fine tuning layer 23 has a thickness FT1. In the Step C4, the first fine tuning layer 23 of the at least one second sacrificial structure mesa 6' is etched such that the at least one first sacrificial structure mesa 6 and the at least one second sacrificial structure mesa 6' have the first height difference HD1, thereby the first height difference HD1 is determined by the thickness FT1 of the first fine tuning layer 23. Therefore, it helps to precisely adjust the first height difference HD1. It also helps to precisely tune the first resonance frequency difference FD1 of the at least one first bulk acoustic wave resonance structure 3 and the at least one second bulk acoustic wave resonance structure 3'.

Figure 4A:
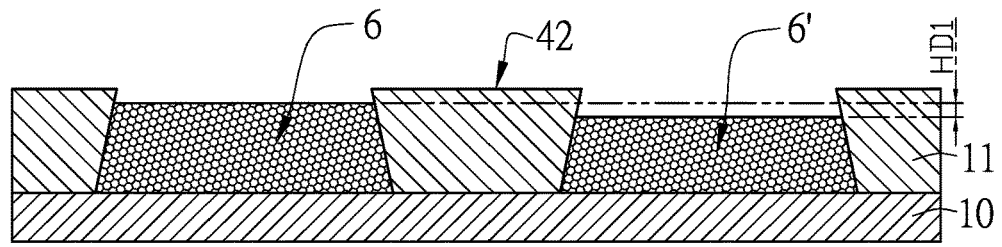
FIGS. 4A~4D are the cross-sectional schematics showing steps of an embodiment of a method of frequency tuning for bulk acoustic wave resonator of bulk acoustic wave filter of the present invention.
Figure 4B:
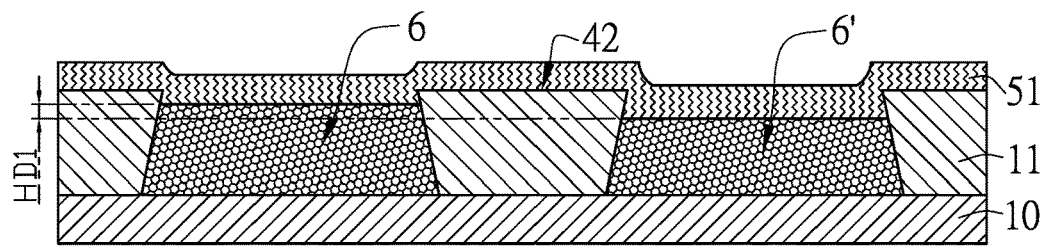
Figure 4C:
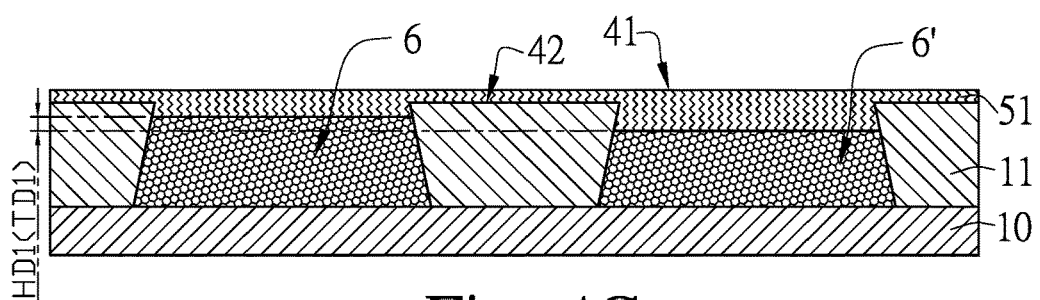
Figure 4D:
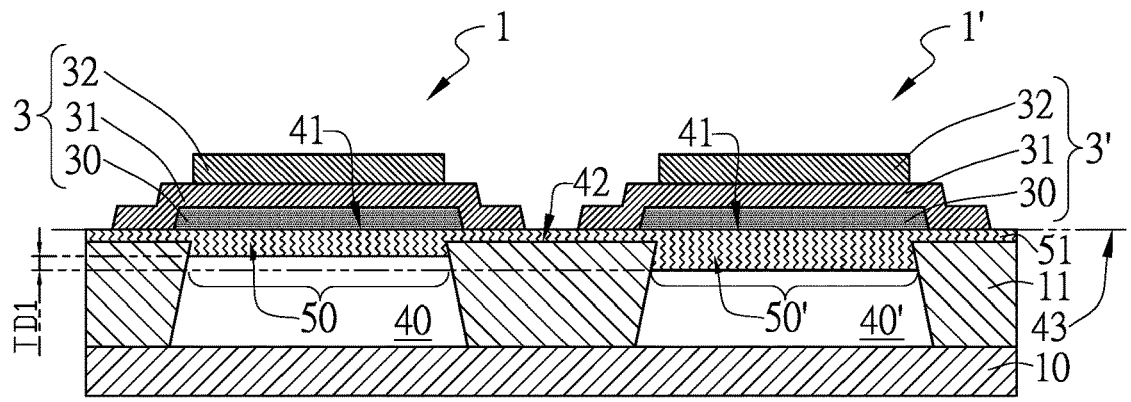

Please refer to FIGS. 4A~4D, which are the cross-sectional schematics showing steps of an embodiment of a method of frequency tuning for bulk acoustic wave resonator of bulk acoustic wave filter of the present invention. The main steps for forming the embodiment shown in FIG. 4D are basically the same as those for forming the embodiment shown in FIG. 3G, except that in the Step C4 (please referring to FIG. 4A), the at least one first sacrificial structure mesa 6 and the at least one second sacrificial structure mesa 6' are etched such that the at least one first sacrificial structure mesa 6 and the at least one second sacrificial structure mesa 6' have a first height difference HD1, wherein a height of the at least one first sacrificial structure mesa 6 is greater than a height of the at least one second sacrificial structure mesa 6'. The embodiment of FIG. 4D is formed after the Step CM (please referring to FIG. 4B), the Step C52 (please referring to FIG. 4C), the Step C53~the Step C55 and the Step C6, wherein the second polish layer 51 is made of insulator, wherein a spacing between the substrate 10 and the second frequency tuning structure 50' is less than a spacing between the substrate 10 and the first frequency tuning structure 50. In current embodiment, the substrate 10 may be a semiconductor substrate; the plural of sacrificial structure mesas may be made of at least one material selected from the group consisting of: metal, alloy and epitaxial structure.

Figure 4E:
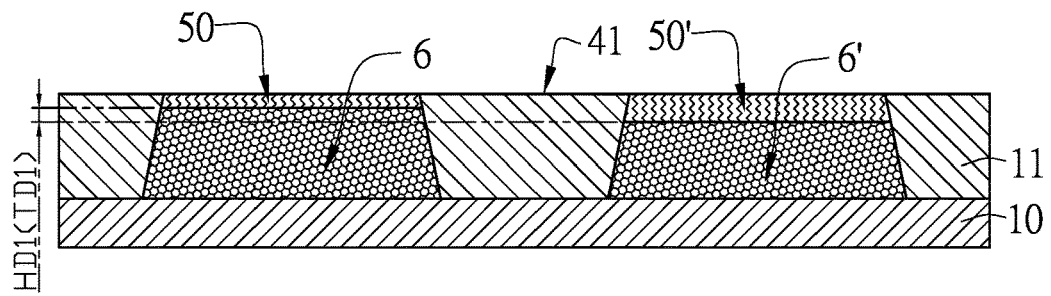
FIGS. 4E and 4F are the cross-sectional schematics showing steps of another embodiment of a method of frequency tuning for bulk acoustic wave resonator of bulk acoustic wave filter of the present invention.
Figure 4F:
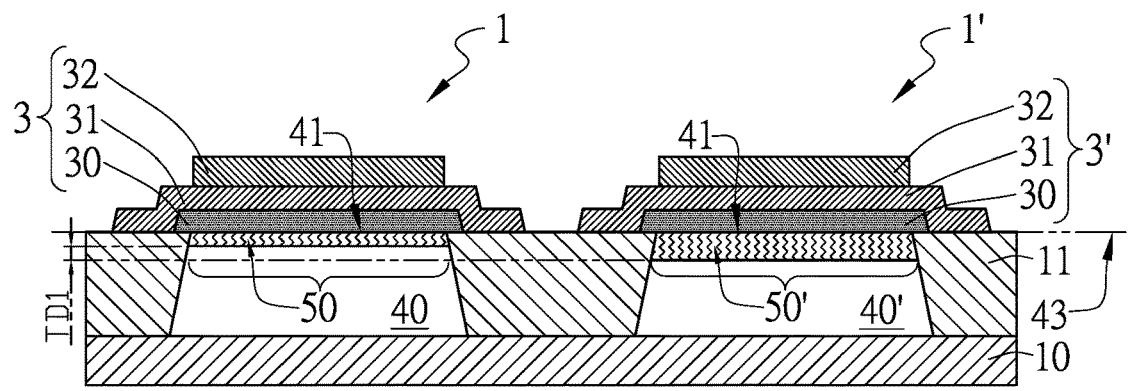

Please refer to FIGS. 4E and 4F, which are the cross-sectional schematics showing steps of another embodiment of a method of frequency tuning for bulk acoustic wave resonator of bulk acoustic wave filter of the present invention. In current embodiment, the substrate 10 may be a semiconductor substrate; the plural of sacrificial structure mesas may be made of at least one material selected from the group consisting of: metal, alloy and epitaxial structure. The main steps for forming the embodiment shown in FIG. 4F are basically the same as those for forming the embodiment shown in FIG. 4D, except that in the Step C52, (please also referring to FIG. 4E) the second polish layer 51 is polished such that the polished surface 41 (the extending plane 43) is coincident with the pre-polished surface 42 or such that the polished surface 41 is lower than the pre-polished surface 42, and wherein the at least one first sacrificial structure mesa 6 and the at least one second sacrificial structure mesa 6' are not exposed. In the embodiment of FIG. 4F, a spacing between the substrate 10 and the second frequency tuning structure 50' is less than a spacing between the substrate 10 and the first frequency tuning structure 50; the second polish layer 51 may be made of at least one material selected from the group consisting of: metal, alloy and insulator.

Figure 4G:
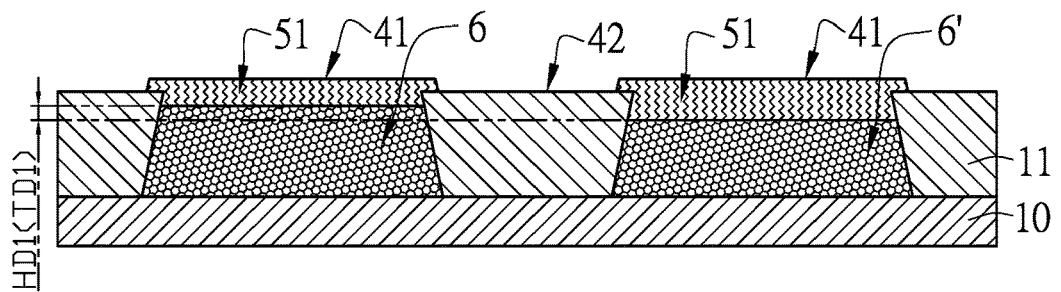
FIGS. 4G and 4H are the cross-sectional schematics showing steps of another embodiment of a method of frequency tuning for bulk acoustic wave resonator of bulk acoustic wave filter of the present invention.
Figure 4H:
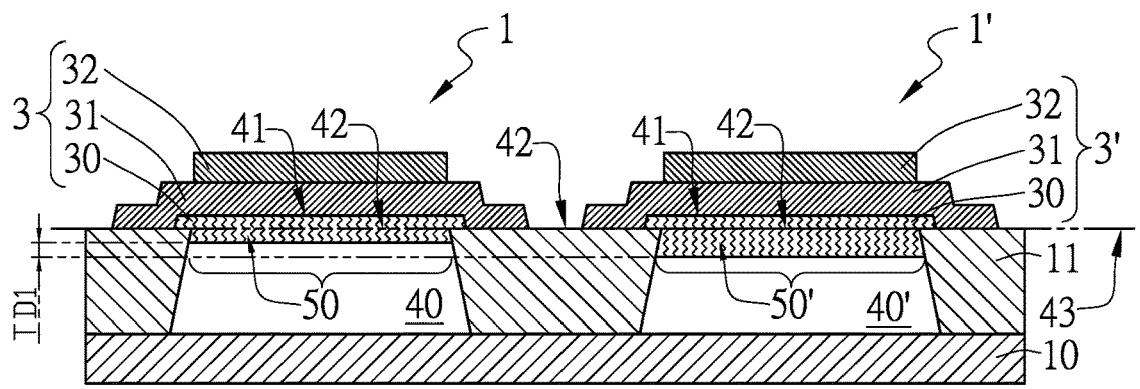

Please refer to FIGS. 4G and 4H, which are the cross-sectional schematics showing steps of another embodiment of a method of frequency tuning for bulk acoustic wave resonator of bulk acoustic wave filter of the present invention. In current embodiment, the substrate 10 may be a semiconductor substrate; the plural of sacrificial structure mesas may be made of at least one material selected from the group consisting of: metal, alloy and epitaxial structure. The main steps for forming the embodiment shown in FIG. 4H are basically the same as those for forming the embodiment shown in FIG. 3K, except that in the Step C4: (please referring to FIG. 4A) the at least one first sacrificial structure mesa 6 and the at least one second sacrificial structure mesa 6' are etched such that the at least one first sacrificial structure mesa 6 and the at least one second sacrificial structure mesa 6' have a first height difference HD1, wherein a height of the at least one first sacrificial structure mesa 6 is greater than a height of the at least one second sacrificial structure mesa 6'. In the Step C5, the plural of bulk acoustic wave resonance structures are formed on an extending plane 43, wherein the extending plane 43 is coincident with the pre-polished surface 42. After the Step C53': (please referring to FIG. 4G) patterning the second polish layer 51, and the Step C54', the Step C55' and the Step C6 (please referring to FIG. 4H), the second polish layer 51 above the pre-polished surface 42 (the extending plane 43), under the polished surface 41 and located under the at least one first bulk acoustic wave resonance structure 3 forms a bottom electrode layer 30 of the at least one first bulk acoustic wave resonance structure 3; wherein the second polish layer 51 under the pre-polished surface 42 (the extending plane 43) and located under the at least one first bulk acoustic wave resonance structure 3 forms a first frequency tuning structure 50 of the at least one first bulk acoustic wave resonance structure 3; wherein the second polish layer 51 above the pre-polished surface 42 (the extending plane 43), under the polished surface 41 and located under the at least one second bulk acoustic wave resonance structure 3' forms a bottom electrode layer 30 of the at least one second bulk acoustic wave resonance structure 3'; wherein the second polish layer 51 under the pre-polished surface 42 (the extending plane 43) and located under the at least one second bulk acoustic wave resonance structure 3' forms a second frequency tuning structure 50' of the at least one second bulk acoustic wave resonance structure 3'; wherein the first frequency tuning structure 50 and the second frequency tuning structure 50' have a first thickness difference TD1 (a spacing between the substrate 10 and the second frequency tuning structure 50' is less than a spacing between the substrate 10 and the first frequency tuning structure 50), the first thickness difference TD1 is equal to the first height difference HD1, thereby adjusting the first height difference HD1 is capable of tuning the first resonance frequency difference FD1 of the at least one first bulk acoustic wave resonance structure 3 and the at least one second bulk acoustic wave resonance structure 3'. The second polish layer 51 may be made of at least one material selected from the group consisting of: metal and alloy; wherein in a preferable embodiment, the second polish layer 51 is made of at least one material selected from the group consisting of: Ru, Ti, Mo, Pt, Au, Al and W.

Figure 4I:
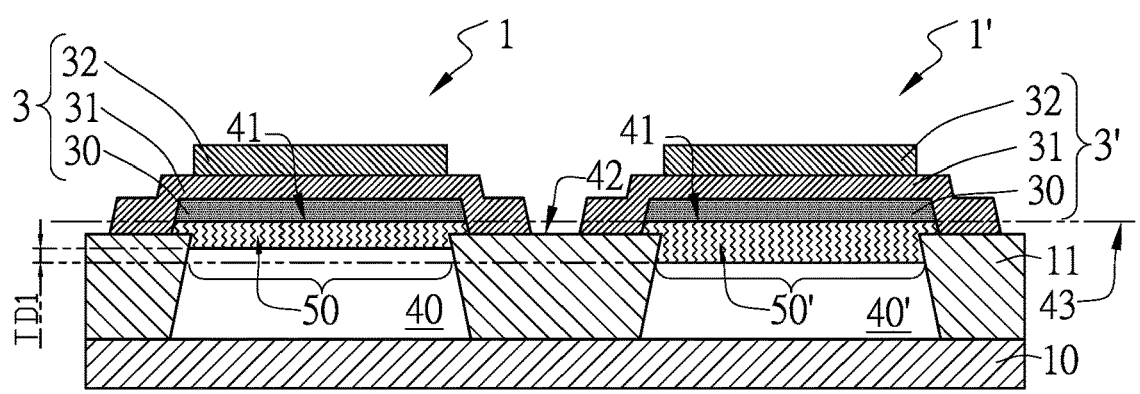
FIG. 4I is the cross-sectional schematic showing another embodiment of a method of frequency tuning for bulk acoustic wave resonator of bulk acoustic wave filter of the present invention.

Please refer to FIG. 4I, which is the cross-sectional schematic showing another embodiment of a method of frequency tuning for bulk acoustic wave resonator of bulk acoustic wave filter of the present invention. In current embodiment, the substrate 10 may be a semiconductor substrate; the plural of sacrificial structure mesas may be made of at least one material selected from the group consisting of: metal, alloy and epitaxial structure. The main steps for forming the embodiment shown in FIG. 4I are basically the same as those for forming the embodiment shown in FIG. 3L, except that in the Step C4: (please referring to FIG. 4A) the at least one first sacrificial structure mesa 6 and the at least one second sacrificial structure mesa 6' are etched such that the at least one first sacrificial structure mesa 6 and the at least one second sacrificial structure mesa 6' have a first height difference HD1, wherein a height of the at least one first sacrificial structure mesa 6 is greater than a height of the at least one second sacrificial structure mesa 6', and wherein in the Step C52", the second polish layer 51 is polished such that the at least one first sacrificial structure mesa 6 and the at least one second sacrificial structure mesa 6' are not exposed. After the Step C53": (please referring to FIG. 4G) patterning the second polish layer 51, and the Step C54"~the Step C56" and the Step C6 (please referring to FIG. 4I), the second polish layer 51 under the polished surface 41 (the extending plane 43) and located under the at least one first bulk acoustic wave resonance structure 3 and the at least one second bulk acoustic wave resonance structure 3' form a first frequency tuning structure 50 of the at least one first bulk acoustic wave resonance structure 3 and a second frequency tuning structure 50' of the at least one second bulk acoustic wave resonance structure 3' respectively, wherein the first frequency tuning structure 50 and the second frequency tuning structure 50' have a first thickness difference TD1 (a spacing between the substrate 10 and the second frequency tuning structure 50' is less than a spacing between the substrate 10 and the first frequency tuning structure 50), the first thickness difference TD1 is equal to the first height difference HD1; thereby adjusting the first height difference HD1 is capable of tuning the first resonance frequency difference FD1 of the at least one first bulk acoustic wave resonance structure 3 and the at least one second bulk acoustic wave resonance structure 3'. In current embodiment, the second polish layer 51 may be made of at least one material selected from the group consisting of: metal, alloy and insulator.

Figure 4J:
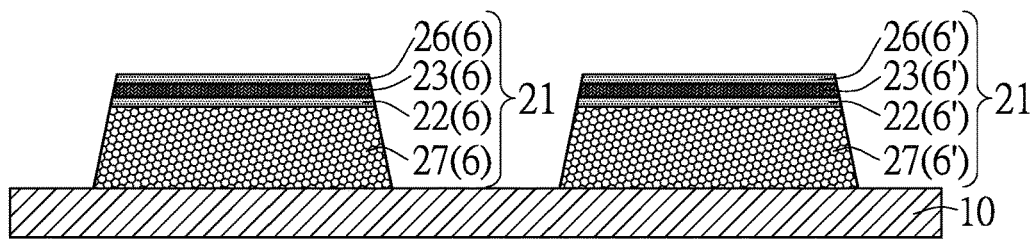
FIGS. 4J~4M are the cross-sectional schematics showing steps of another embodiment of a method of frequency tuning for bulk acoustic wave resonator of bulk acoustic wave filter of the present invention.
Figure 4K:
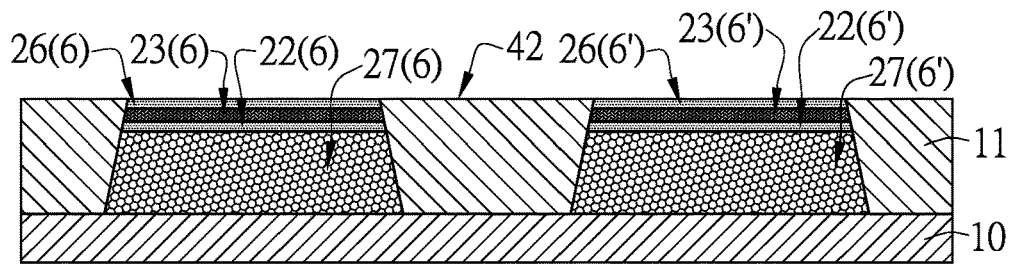
Figure 4L:
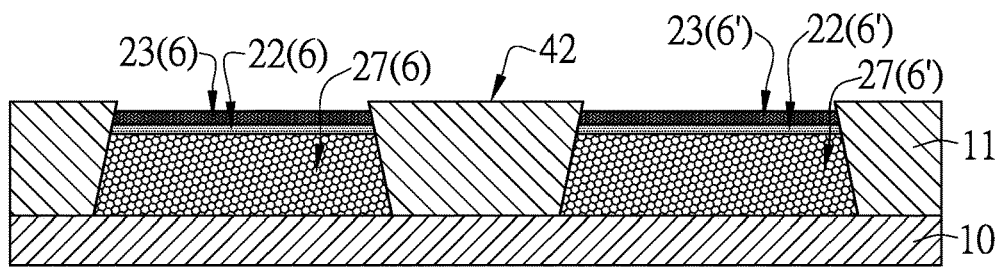
Figure 4M:
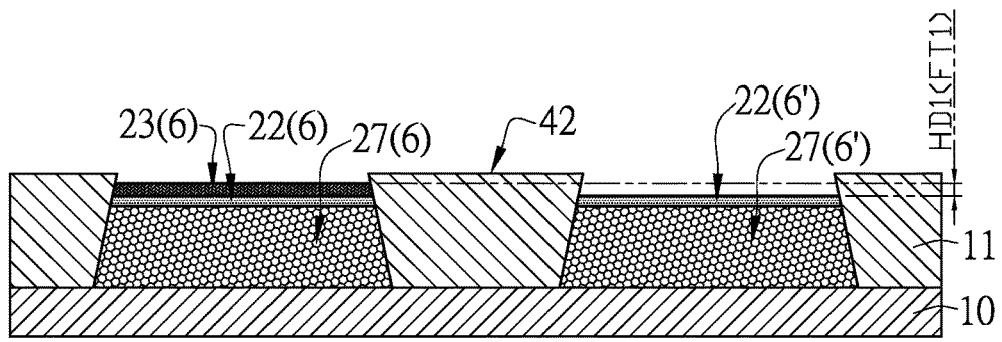

Please refer to FIGS. 4J~4M, which are the cross-sectional schematics showing steps of another embodiment of a method of frequency tuning for bulk acoustic wave resonator of bulk acoustic wave filter of the present invention. In the embodiment of FIG. 4J, the substrate 10 may be a compound semiconductor substrate; the sacrificial structure 21 may be made of an epitaxial structure. The main structure of the epitaxial structure of the embodiment in FIG. 4J is basically the same as that of the embodiment in FIG. 2L, except that the sacrificial structure 21 comprises a sacrificial epitaxial layer 27, a first etching stop layer 22, a first fine tuning layer 23 and a top etching stop layer 26, wherein the Step C1 comprises following steps of: Step C11: forming a sacrificial structure 21 on the substrate 10; and Step C12: etching the sacrificial structure 21 to form the plural of sacrificial structure mesas, wherein the plural of sacrificial structure mesas have the same height, wherein the plural of sacrificial structure mesas comprise at least one first sacrificial structure mesa 6 and at least one second sacrificial structure mesa 6', wherein the sacrificial epitaxial layer 27 is formed on the substrate 10, the first etching stop layer 22 is formed on the sacrificial epitaxial layer 27, the first fine tuning layer 23 is formed on the first etching stop layer 22, the top etching stop layer 26 is formed on the first fine tuning layer 23. The structure of the embodiment of FIG. 4K is formed after the Step C2 and the Step C3. The Step C4 comprises following steps of: Step C41: (please referring to FIG. 4L) etching the top etching stop layer 26 of the at least one first sacrificial structure mesa 6 and the at least one second sacrificial structure mesa 6'; and Step C42: (please referring to FIG. 4M) etching the first fine tuning layer 23 of the at least one second sacrificial structure mesa 6' such that the at least one first sacrificial structure mesa 6 and the at least one second sacrificial structure mesa 6' have the first height difference HD1, wherein the first fine tuning layer 23 has a thickness FT1, thereby the first height difference HD1 is determined by the thickness FT1 of the first fine tuning layer 23, therefore, it helps to precisely adjust the first height difference HD1. Hence it helps to precisely adjust the first thickness difference TD1 of the first frequency tuning structure 50 and the second frequency tuning structure 50'. It also helps to precisely tune the first resonance frequency difference FD1 of the at least one first bulk acoustic wave resonance structure 3 and the at least one second bulk acoustic wave resonance structure 3'. The embodiments of FIGS. 4D, 4F, 4H and 4I may be formed from the structure of FIG. 4M. To form the embodiments of FIGS. 4D, 4F, 4H and 4I from the epitaxial structure of FIG. 4M, in the Step C3, the insulating layer 11 is polished such that the plural of sacrificial structure mesas are exposed. However, during polishing, the plural of sacrificial structure mesas located near the center of the substrate 10 and the plural of sacrificial structure mesas located away from the center of the substrate 10 usually cannot be polished to expose at the same time. For example, if the plural of sacrificial structure mesas located away from the center of the substrate 10 are exposed earlier, then must continue the polish process in order to let the plural of sacrificial structure mesas located near the center of the substrate 10 exposed. Therefore, the plural of sacrificial structure mesas located near the center of the substrate 10 are over polished. Hence, after polish, the thickness of the first fine tuning layer 23 of the plural of sacrificial structure mesas located away from the center of the substrate 10 becomes thinner than the thickness of the first fine tuning layer 23 of the plural of sacrificial structure mesas located near the center of the substrate 10. In order to prevent from that the thickness of the first fine tuning layer 23 of the plural of sacrificial structure mesas located near the center of the substrate 10 is unequal to the thickness of the first fine tuning layer 23 of the plural of sacrificial structure mesas located away from the center of the substrate 10, the top etching stop layer 26 is introduced such that the thickness of the first fine tuning layer 23 of the plural of sacrificial structure mesas located near the center of the substrate 10 is capable to be preserved to be equal to the thickness of the first fine tuning layer 23 of the plural of sacrificial structure mesas located away from the center of the substrate 10. In some embodiments, the substrate 10 is made of GaAs; the sacrificial epitaxial layer 27 is made of GaAs; the first etching stop layer 22 is made of AlAs or InGaP, wherein the first etching stop layer 22 has a thickness between 1 nm and 50 nm; the first fine tuning layer 23 is made of GaAs, wherein the thickness FT1 of the first fine tuning layer 23 is between 1 nm and 300 nm; the top etching stop layer 26 is made of InGaP, wherein the top etching stop layer 26 has a thickness between 50 nm and 300 nm. In some other embodiments, the substrate 10 is made of InP; the sacrificial epitaxial layer 27 is made of InGaAs; the first etching stop layer 22 is made of InP, wherein the first etching stop layer 22 has a thickness between 1 nm and 50 nm; the first fine tuning layer 23 is made of InGaAs, wherein the thickness FT1 of the first fine tuning layer 23 is between 1 nm and 300 nm; the top etching stop layer 26 is made of InP, wherein the top etching stop layer 26 has a thickness between 50 nm and 300 nm.

All the embodiments of FIGS. 2F, 2H, 2I, 2J, 3G, 3I, 3K, 3L, 4D, 4F, 4H and 4I have a common characteristic, wherein the at least one first bulk acoustic wave resonator 1 and the at least one second bulk acoustic wave resonator 1' are formed by a method of frequency tuning for bulk acoustic wave resonator of bulk acoustic wave filter of the present invention. The common characteristic is that the bottom electrode layer 30 of any of the bulk acoustic wave resonance structure (the at least one first bulk acoustic wave resonance structure 3 or the at least one second bulk acoustic wave resonance structure 3') is formed on an extending plane 43. The common structures of these embodiments comprise: an insulating layer 11 formed on a substrate 10, wherein the insulating layer 11 has a plural of cavities; a plural of bulk acoustic wave resonance structures, wherein the plural of bulk acoustic wave resonance structures are located above the plural of cavities respectively, wherein the plural of bulk acoustic wave resonance structures comprise at least one first bulk acoustic wave resonance structure 3 and at least one second bulk acoustic wave resonance structure 3', the plural of cavities comprise at least one first cavity 40 and at least one second cavity 40', the at least one first bulk acoustic wave resonance structure 3 and the at least one second bulk acoustic wave resonance structure 3' are located above the at least one first cavity 40 and the at least one second cavity 40' respectively, wherein the at least one first bulk acoustic wave resonance structure 3 and the at least one second bulk acoustic wave resonance structure 3' have a first resonance frequency difference FD1; wherein each of the plural of bulk acoustic wave resonance structures comprises: a bottom electrode layer 30 formed on an extending plane 43; a piezoelectric layer 31 formed on the bottom electrode layer 30; and a top electrode layer 32 formed on the piezoelectric layer 31; and a structure for tuning frequency. While the differences between these embodiments are as follows: (1) in the embodiments of FIGS. 2H, 2J, 3I and 3K, the structure for tuning frequency comprises a structure A: the insulating layer 11 has a polished top surface, the extending plane 43 is coincident with the top surface of the insulating layer 11, wherein the at least one second bulk acoustic wave resonance structure 3' comprises a second frequency tuning structure 50', the second frequency tuning structure 50' is formed under the extending plane 43 and located between the bottom electrode layer 30 of the at least one second bulk acoustic wave resonance structure 3' and the at least one second cavity 40', wherein the second frequency tuning structure 50' has a thickness T2, the thickness T2 is correlated to the first resonance frequency difference FD1 of the at least one first bulk acoustic wave resonance structure 3 and the at least one second bulk acoustic wave resonance structure 3'; (2) in the embodiments of FIGS. 2F, 2I, 4F and 4H, the structure for tuning frequency comprises a structure B: the insulating layer 11 has a polished top surface, the extending plane 43 is coincident with the top surface of the insulating layer 11, wherein the at least one first bulk acoustic wave resonance structure 3 and the at least one second bulk acoustic wave resonance structure 3' have a first frequency tuning structure 50 and a second frequency tuning structure 50' respectively, wherein the first frequency tuning structure 50 is formed under the extending plane 43 and located between the bottom electrode layer 30 of the at least one first bulk acoustic wave resonance structure 3 and the at least one first cavity 40, the second frequency tuning structure 50' is formed under the extending plane 43 and located between the bottom electrode layer 30 of the at least one second bulk acoustic wave resonance structure 3' and the at least one second cavity 40', wherein the first frequency tuning structure 50 and the second frequency tuning structure 50' have a first thickness difference TD1, the first thickness difference TD1 is correlated to a first resonance frequency difference FD1 of the at least one first bulk acoustic wave resonance structure 3 and the at least one second bulk acoustic wave resonance structure 3'; (3) in the embodiments of FIGS. 3G, 3L, 4D and 4I, the structure for tuning frequency comprises a structure C: a second polish layer 51 is formed on the insulating layer 11 and above the plural of cavities, wherein the second polish layer 51 has a polished top surface, the extending plane 43 is coincident with the top surface of the second polish layer 51, wherein the second polish layer 51 under the extending plane 43 and located between the bottom electrode layer 30 of the at least one first bulk acoustic wave resonance structure 3 and the at least one first cavity 40 forms a first frequency tuning structure 50 of the at least one first bulk acoustic wave resonance structure 3, wherein the second polish layer 51 under the extending plane 43 and located between the bottom electrode layer 30 of the at least one second bulk acoustic wave resonance structure 3' and the at least one second cavity 40' forms a second frequency tuning structure 50' of the at least one second bulk acoustic wave resonance structure 3', wherein the first frequency tuning structure 50 and the second frequency tuning structure 50' have a first thickness difference TD1, the first thickness difference TD1 is correlated to a first resonance frequency difference FD1 of the at least one first bulk acoustic wave resonance structure 3 and the at least one second bulk acoustic wave resonance structure 3'. In the embodiments of FIGS. 2F, 2I, 3G, 3L, 4D, 4F, 4H and 4I of the present invention, the common characteristic is that: the bottom electrode layer 30 of the at least one first bulk acoustic wave resonance structure 3 and the bottom electrode layer 30 of the at least one second bulk acoustic wave resonance structure 3' are formed on the extending plane 43; and wherein the first frequency tuning structure 50 and the second frequency tuning structure 50' are formed under the extending plane 43. In the embodiments of FIGS. 2H, 2J, 3I and 3K of the present invention, the common characteristic is that: the bottom electrode layer 30 of the at least one first bulk acoustic wave resonance structure 3 and the bottom electrode layer 30 of the at least one second bulk acoustic wave resonance structure 3' are formed on the extending plane 43; and wherein the second frequency tuning structure 50' is formed under the extending plane 43.

Please refer to FIGS. 5A~5C, which are the cross-sectional schematics showing steps of an embodiment of a method of frequency tuning for bulk acoustic wave resonator of bulk acoustic wave filter of the present invention. In current embodiment, the substrate 10 may be a semiconductor substrate; the plural of sacrificial structure mesas may be made of at least one material selected from the group consisting of: metal, alloy and epitaxial structure. The main steps for forming the embodiment shown in FIG. 5C are basically the same as those for forming the embodiment shown in FIG. 2F, except that at least one first bulk acoustic wave resonator 1, at least one second bulk acoustic wave resonator 1' and at least one third bulk acoustic wave resonator 1" are formed on the substrate 10 respectively. In the Step B1, (please referring to FIG. 5B) the plural of sacrificial structure mesas comprise at least one first sacrificial structure mesa 6, at least one second sacrificial structure mesa 6' and at least one third sacrificial structure mesa 6"; wherein a height of the at least one first sacrificial structure mesa 6 is greater than a height of the at least one second sacrificial structure mesa 6', wherein the at least one first sacrificial structure mesa 6 and the at least one second sacrificial structure mesa 6' have a first height difference HD1; wherein the height of the at least one first sacrificial structure mesa 6 is greater than a height of the at least one third sacrificial structure mesa 6", wherein the at least one first sacrificial structure mesa 6 and the at least one third sacrificial structure mesa 6" have a second height difference HD2. In the Step B4, a plural of bulk acoustic wave resonance structures are formed on the polished surface 41 (the extending plane 43), wherein the plural of bulk acoustic wave resonance structures comprise at least one first bulk acoustic wave resonance structure 3, at least one second bulk acoustic wave resonance structure 3' and at least one third bulk acoustic wave resonance structure 3", wherein the at least one first bulk acoustic wave resonance structure 3, the at least one second bulk acoustic wave resonance structure 3' and the at least one third bulk acoustic wave resonance structure 3" are located above the at least one first sacrificial structure mesa 6, the at least one second sacrificial structure mesa 6' and the at least one third sacrificial structure mesa 6" respectively. In the Step B5, the plural of sacrificial structure mesas are etched to form a plural of cavities, wherein the plural of cavities comprise at least one first cavity 40, at least one second cavity 40' and at least one third cavity 40", the at least one first cavity 40, the at least one second cavity 40' and the at least one third cavity 40" are located under the at least one first bulk acoustic wave resonance structure 3, the at least one second bulk acoustic wave resonance structure 3' and the at least one third bulk acoustic wave resonance structure 3" respectively. In the Step B3, the insulating layer 11 is polished such that the at least one first sacrificial structure mesa 6, the at least one second sacrificial structure mesa 6' and the at least one third sacrificial structure mesa 6" are not exposed, thereby the insulating layer 11 under the polished surface 41 and located under the at least one first bulk acoustic wave resonance structure 3, the at least one second bulk acoustic wave resonance structure 3' and the at least one third bulk acoustic wave resonance structure 3" form a first frequency tuning structure 50 of the at least one first bulk acoustic wave resonance structure 3, a second frequency tuning structure 50' of the at least one second bulk acoustic wave resonance structure 3' and a third frequency tuning structure 50" of the at least one third bulk acoustic wave resonance structure 3" respectively; wherein the first frequency tuning structure 50 and the second frequency tuning structure 50' have a first thickness difference TD1, the first thickness difference TD1 is equal to the first height difference HD1; wherein the first frequency tuning structure 50 and the third frequency tuning structure 50" have a second thickness difference TD2, the second thickness difference TD2 is equal to the second height difference HD2; thereby adjusting the first height difference HD1 is capable of tuning a first resonance frequency difference FD1 of the at least one first bulk acoustic wave resonance structure 3 and the at least one second bulk acoustic wave resonance structure 3'; while adjusting the second height difference HD2 is capable of tuning a second resonance frequency difference FD2 of the at least one first bulk acoustic wave resonance structure 3 and the at least one third bulk acoustic wave resonance structure 3". In some embodiments, the substrate 10 may be a compound semiconductor substrate; the plural of sacrificial structure mesas may be made of an epitaxial structure; and wherein the Step B1 comprises following steps of: Step B11: (please referring to FIG. 5A) forming a sacrificial structure 21 on the substrate 10; Step B12: etching the sacrificial structure 21 to form the plural of sacrificial structure mesas, wherein the plural of sacrificial structure mesas comprise the at least one first sacrificial structure mesa 6(21), the at least one second sacrificial structure mesa 6'(21) and the at least one third sacrificial structure mesa 6"(21), wherein the plural of sacrificial structure mesas have the same height; and the Step B13: (please referring to FIG. 5B) etching the at least one first sacrificial structure mesa 6, the at least one second sacrificial structure mesa 6' and the at least one third sacrificial structure mesa 6" or etching the at least one second sacrificial structure mesa 6' and the at least one third sacrificial structure mesa 6" such that the at least one first sacrificial structure mesa 6 and the at least one second sacrificial structure mesa 6' have the first height difference HD1 and such that the at least one first sacrificial structure mesa 6 and the at least one third sacrificial structure mesa 6" have the second height difference HD2.

Figure 5D:
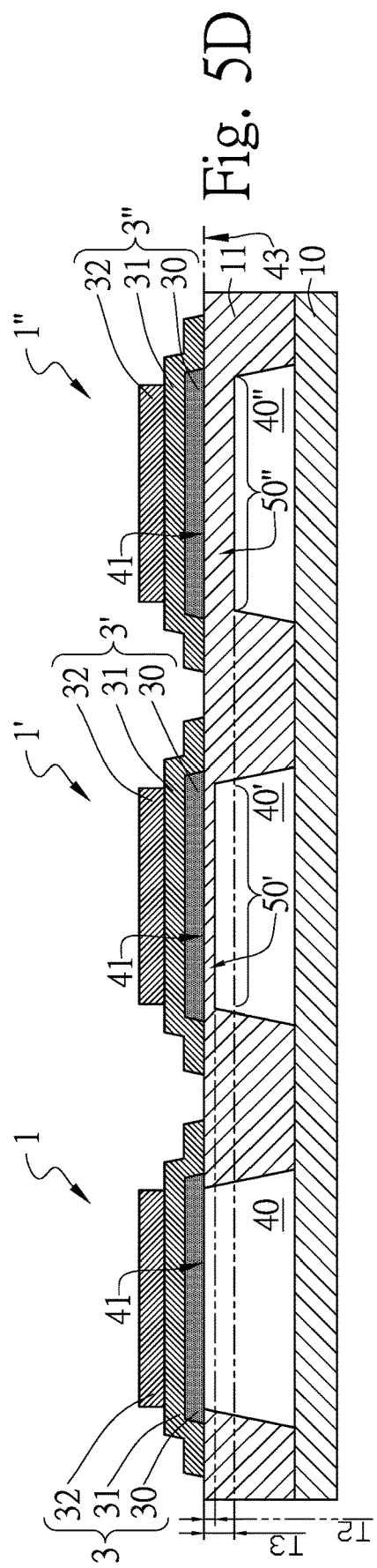
FIG. 5D is the cross-sectional schematic showing another embodiment of a method of frequency tuning for bulk acoustic wave resonator of bulk acoustic wave filter of the present invention.

Please refer to FIG. 5D, which is the cross-sectional schematic showing another embodiment of a method of frequency tuning for bulk acoustic wave resonator of bulk acoustic wave filter of the present invention. In current embodiment, the substrate 10 may be a semiconductor substrate; the plural of sacrificial structure mesas may be made of at least one material selected from the group consisting of: metal, alloy and epitaxial structure. The main steps for forming the embodiment shown in FIG. 5D are basically the same as those for forming the embodiment shown in FIG. 5C, except that in the Step B3, the insulating layer 11 is polished such that the at least one first sacrificial structure mesa 6 is exposed and the at least one second sacrificial structure mesa 6' and the at least one third sacrificial structure mesa 6" are not exposed, thereby the insulating layer 11 under the polished surface 41 (the extending plane 43) and located under the at least one second bulk acoustic wave resonance structure 3' forms a second frequency tuning structure 50' of the at least one second bulk acoustic wave resonance structure 3'; and the insulating layer 11 under the polished surface 41 (the extending plane 43) and located under the at least one third bulk acoustic wave resonance structure 3" forms a third frequency tuning structure 50" of the at least one third bulk acoustic wave resonance structure 3"; wherein the second frequency tuning structure 50' has a thickness T2, the thickness T2 of the second frequency tuning structure 50' is equal to the first height difference HD1; wherein the third frequency tuning structure 50" has a thickness T3, the thickness T3 of the third frequency tuning structure 50" is equal to the second height difference HD2. In current embodiment, there is no such a first frequency tuning structure 50 as shown in the embodiment of FIG. 5C. Therefore, the first resonance frequency difference FD1 of the at least one first bulk acoustic wave resonance structure 3 and the at least one second bulk acoustic wave resonance structure 3' is correlated to the thickness T2 of the second frequency tuning structure 50'; that is that the first resonance frequency difference FD1 is correlated to the first height difference HD1 of the at least one first sacrificial structure mesa 6 and the at least one second sacrificial structure mesa 6'; the second resonance frequency difference FD2 of the at least one first bulk acoustic wave resonance structure 3 and the at least one third bulk acoustic wave resonance structure 3" is correlated to the thickness T3 of the third frequency tuning structure 50"; that is that the second resonance frequency difference FD2 is correlated to the second height difference HD2 of the at least one first sacrificial structure mesa 6 and the at least one third sacrificial structure mesa 6"; thereby adjusting the first height difference HD1 is capable of tuning the first resonance frequency difference FD1 of the at least one first bulk acoustic wave resonance structure 3 and the at least one second bulk acoustic wave resonance structure 3'; thereby adjusting the second height difference HD2 is capable of tuning a second resonance frequency difference FD2 of the at least one first bulk acoustic wave resonance structure 3 and the at least one third bulk acoustic wave resonance structure 3".

Figure 5E:
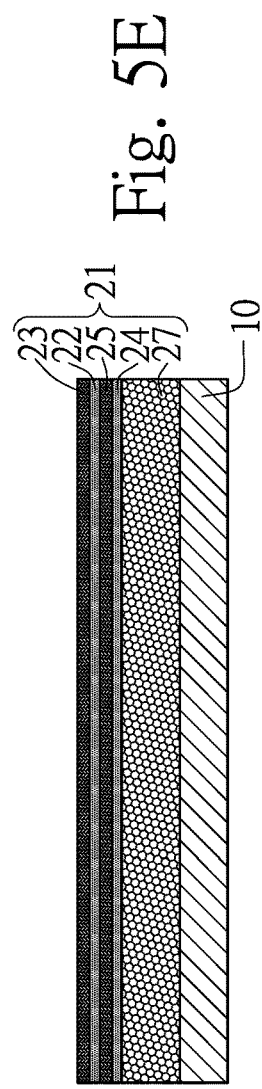
FIGS. 5E~5G are the cross-sectional schematics showing steps of another embodiment of a method of frequency tuning for bulk acoustic wave resonator of bulk acoustic wave filter of the present invention.
Figure 5F:
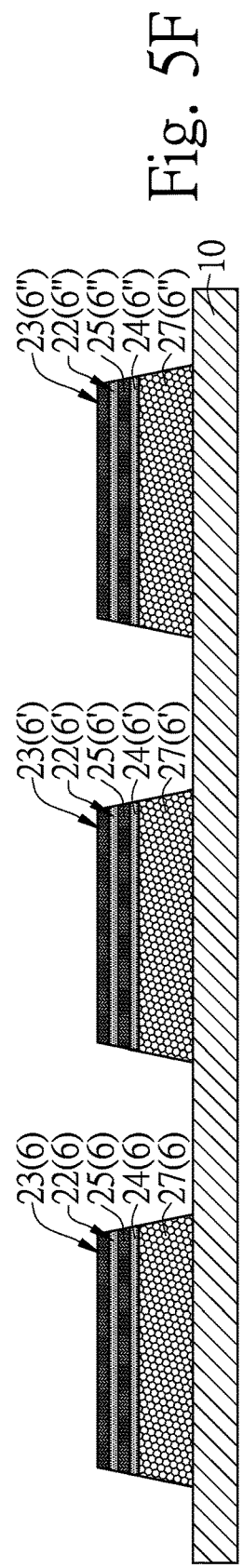
Figure 5G:
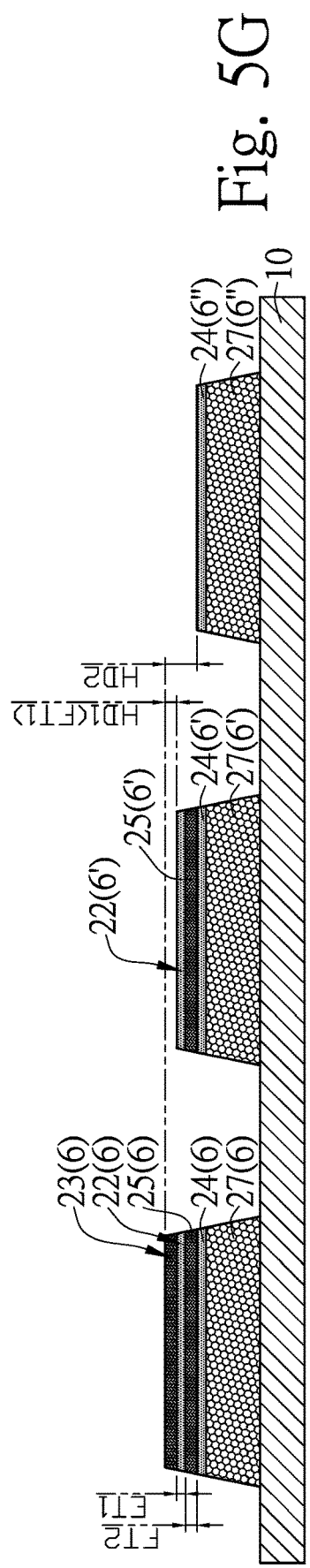

Please refer to FIGS. 5E~5G, which are the cross-sectional schematics showing steps of another embodiment of a method of frequency tuning for bulk acoustic wave resonator of bulk acoustic wave filter of the present invention. In the embodiment of FIG. 5E, the substrate 10 is a compound semiconductor substrate; the sacrificial structure 21 is made of an epitaxial structure. The main epitaxial structures of the embodiments in FIG. 5E~5G are basically the same as those of the embodiments in FIG. 5A~5B, except that the sacrificial structure 21 comprises a sacrificial epitaxial layer 27, a second etching stop layer 24, a second fine tuning layer 25, a first etching stop layer 22 and a first fine tuning layer 23, wherein the sacrificial epitaxial layer 27 is formed on the substrate 10, the second etching stop layer 24 is formed on the sacrificial epitaxial layer 27, the second fine tuning layer 25 is formed on the second etching stop layer 24, the first etching stop layer 22 is formed on the second fine tuning layer 25, the first fine tuning layer 23 is formed on the first etching stop layer 22. As shown in FIG. 5F, the sacrificial structure 21 is etched to form the plural of sacrificial structure mesas such that the plural of sacrificial structure mesas have the same height, wherein the plural of sacrificial structure mesas comprise at least one first sacrificial structure mesa 6, at least one second sacrificial structure mesa 6' and at least one third sacrificial structure mesa 6". As shown in FIG. 5G, the first fine tuning layer 23 has a thickness FT1, the first etching stop layer 22 has a thickness ET1, the second fine tuning layer 25 has a thickness FT2. The first fine tuning layer 23 of the at least one second sacrificial structure mesa 6' is etched such that the at least one first sacrificial structure mesa 6 and the at least one second sacrificial structure mesa 6' have a first height difference HD1; the first fine tuning layer 23, the first etching stop layer 22 and the second fine tuning layer 25 of the at least one third sacrificial structure mesa 6" are etched such that the at least one first sacrificial structure mesa 6 and the at least one third sacrificial structure mesa 6" have a second height difference HD2. The embodiment of FIG. 5C may be formed from the structure of FIG. 5G, wherein the first height difference HD1 is determined by the thickness FT1 of the first fine tuning layer 23, therefore, it helps to precisely adjust the first height difference HD1. Hence it helps to precisely adjust the first thickness difference TD1 of the first frequency tuning structure 50 and the second frequency tuning structure 50'. It also helps to precisely tune the first resonance frequency difference FD1 of the at least one first bulk acoustic wave resonance structure 3 and the at least one second bulk acoustic wave resonance structure 3'; wherein the second height difference HD2 is determined by the thickness FT1 of the first fine tuning layer 23, the thickness ET1 of the first etching stop layer 22 and the thickness FT2 of the second fine tuning layer 25, therefore, it helps to precisely adjust the second height difference HD2. It also helps to precisely tune the second resonance frequency difference FD2 of the at least one first bulk acoustic wave resonance structure 3 and the at least one third bulk acoustic wave resonance structure 3". The embodiment of FIG. 5D may also be formed from the structure of FIG. 5G, wherein the first height difference HD1 is determined by the thickness FT1 of the first fine tuning layer 23, therefore, it helps to precisely adjust the first height difference HD1. Hence it helps to precisely adjust the thickness T2 of the second frequency tuning structure 50'. It also helps to precisely tune the first resonance frequency difference FD1 of the at least one first bulk acoustic wave resonance structure 3 and the at least one second bulk acoustic wave resonance structure 3'; wherein the second height difference HD2 is determined by the thickness FT1 of the first fine tuning layer 23, the thickness ET1 of the first etching stop layer 22 and the thickness FT2 of the second fine tuning layer 25, therefore, it helps to precisely adjust the second height difference HD2. Hence it helps to precisely adjust the thickness T3 of the third frequency tuning structure 50". It also helps to precisely tune the second resonance frequency difference FD2 of the at least one first bulk acoustic wave resonance structure 3 and the at least one third bulk acoustic wave resonance structure 3". In some embodiments, the substrate 10 is made of GaAs; the sacrificial epitaxial layer 27 is made of GaAs; the first etching stop layer 22 is made of AlAs or InGaP, wherein the thickness ET1 of the first etching stop layer 22 is between 1 nm and 50 nm; the first fine tuning layer 23 is made of GaAs, wherein the thickness FT1 of the first fine tuning layer 23 is between 1 nm and 300 nm; the second etching stop layer 24 is made of AlAs or InGaP, wherein the second etching stop layer 24 has a thickness between 1 nm and 50 nm; the second fine tuning layer 25 is made of GaAs, the thickness FT2 of the second fine tuning layer 25 is between 1 nm and 300 nm. In some other embodiments, the substrate 10 is made of InP; the sacrificial epitaxial layer 27 is made of InGaAs; the first etching stop layer 22 is made of InP, wherein the thickness ET1 of the first etching stop layer 22 is between 1 nm and 50 nm; the first fine tuning layer 23 is made of InGaAs, wherein the thickness FT1 of the first fine tuning layer 23 is between 1 nm and 300 nm; the second etching stop layer 24 is made of InP, wherein the second etching stop layer 24 has a thickness between 1 nm and 50 nm; the second fine tuning layer 25 is made of InGaAs, the thickness FT2 of the second fine tuning layer 25 is between 1 nm and 300 nm.

Figure 5H:
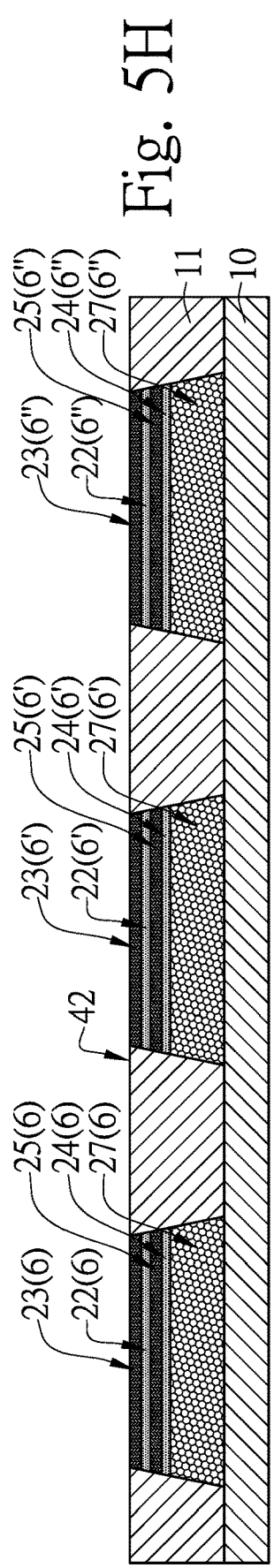
FIGS. 5H~5K are the cross-sectional schematics showing steps of another embodiment of a method of frequency tuning for bulk acoustic wave resonator of bulk acoustic wave filter of the present invention.
Figure 5I:
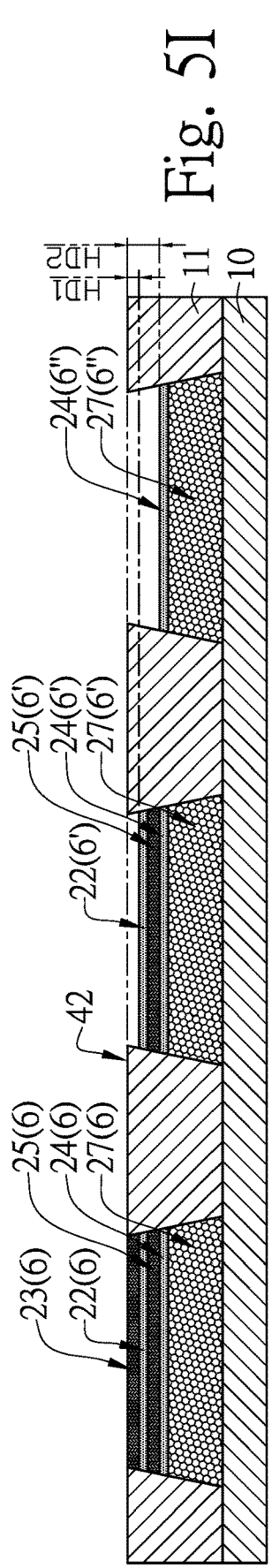
Figure 5J:
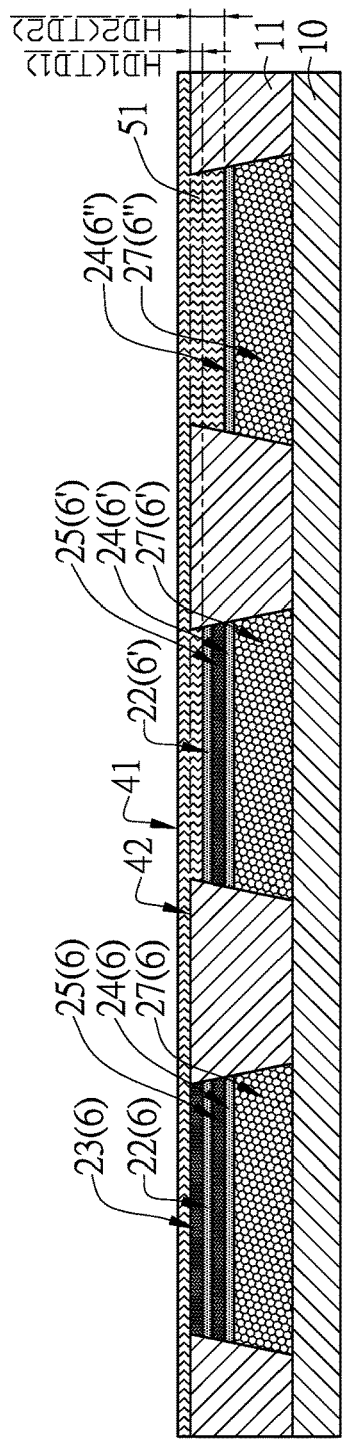
Figure 5K:
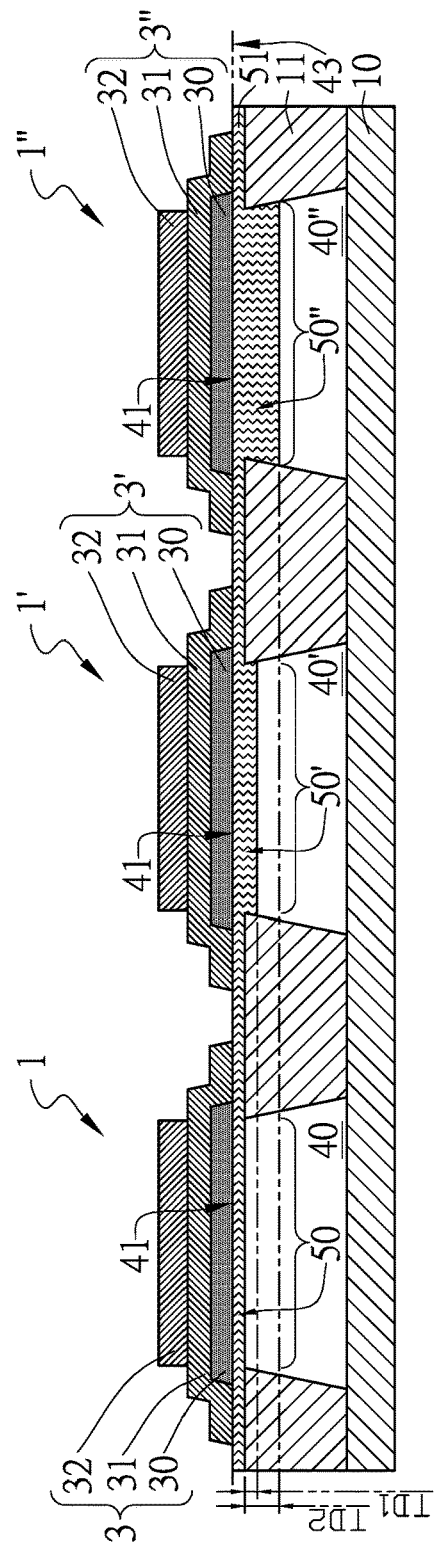

Please refer to FIGS. 5H~5K, which are the cross-sectional schematics showing steps of another embodiment of a method of frequency tuning for bulk acoustic wave resonator of bulk acoustic wave filter of the present invention. In current embodiment, the substrate 10 is a compound semiconductor substrate; the sacrificial structure 21 is made of an epitaxial structure. The embodiment of FIG. 5K is formed from the epitaxial structure of FIG. 5E. The main steps for forming the embodiment shown in FIG. 5K are basically the same as those for forming the embodiment shown in FIG. 3G, except that at least one first bulk acoustic wave resonator 1, at least one second bulk acoustic wave resonator 1' and at least one third bulk acoustic wave resonator 1" are formed on the substrate 10 respectively; wherein the Step C1 comprises following steps of: Step C11: (please referring to FIG. 5E) forming a sacrificial structure 21 on the substrate 10, wherein the sacrificial structure 21 comprises a sacrificial epitaxial layer 27, a second etching stop layer 24, a second fine tuning layer 25, a first etching stop layer 22 and a first fine tuning layer 23, wherein the sacrificial epitaxial layer 27 is formed on the substrate 10, the second etching stop layer 24 is formed on the sacrificial epitaxial layer 27, the second fine tuning layer 25 is formed on the second etching stop layer 24, the first etching stop layer 22 is formed on the second fine tuning layer 25, the first fine tuning layer 23 is formed on the first etching stop layer 22; and Step C12: (please referring to FIG. 5F) etching the sacrificial structure 21 to form the plural of sacrificial structure mesas, wherein the plural of sacrificial structure mesas have the same height, wherein the plural of sacrificial structure mesas comprise at least one first sacrificial structure mesa 6, at least one second sacrificial structure mesa 6' and at least one third sacrificial structure mesa 6". After the Step C2 and the Step C3, the structure of FIG. 5H is formed. In the Step C4, (please referring to FIG. 5I) the first fine tuning layer 23 of the at least one second sacrificial structure mesa 6' is etched such that the at least one first sacrificial structure mesa 6 and the at least one second sacrificial structure mesa 6' have a first height difference HD1; and the first fine tuning layer 23, the first etching stop layer 22 and the second fine tuning layer 25 of the at least one third sacrificial structure mesa 6" are etched such that the at least one first sacrificial structure mesa 6 and the at least one third sacrificial structure mesa 6" have a second height difference HD2, wherein the first fine tuning layer 23 has a thickness FT1, the first etching stop layer 22 has a thickness ET1, the second fine tuning layer 25 has a thickness FT2. In the Step C5, the plural of bulk acoustic wave resonance structures are formed, wherein the plural of bulk acoustic wave resonance structures comprise at least one first bulk acoustic wave resonance structure 3, at least one second bulk acoustic wave resonance structure 3' and at least one third bulk acoustic wave resonance structure 3", wherein in the Step C5 comprises following steps of: the Step C51, the Step C52, the Step C53, the Step C54 and the Step C55. The structure of FIG. 5J is formed after the Step C51 and the Step C52, wherein the second polish layer 51 is polished such that the at least one first sacrificial structure mesa 6, the at least one second sacrificial structure mesa 6' and the at least one third sacrificial structure mesa 6" are not exposed, thereby the second polish layer 51 under the polished surface 41 (the extending plane 43) and located under the at least one first bulk acoustic wave resonance structure 3, the at least one second bulk acoustic wave resonance structure 3' and the at least one third bulk acoustic wave resonance structure 3" form a first frequency tuning structure 50 of the at least one first bulk acoustic wave resonance structure 3, a second frequency tuning structure 50' of the at least one second bulk acoustic wave resonance structure 3' and a third frequency tuning structure 50" of the at least one third bulk acoustic wave resonance structure 3" respectively; wherein the first frequency tuning structure 50 and the second frequency tuning structure 50' have a first thickness difference TD1, the first thickness difference TD1 is equal to the first height difference HD1; wherein the first frequency tuning structure 50 and the third frequency tuning structure 50" have a second thickness difference TD2, the second thickness difference TD2 is equal to the second height difference HD2. The structure of FIG. 5K is formed after the Step C53, the Step C54, the Step C55 and the Step C6, wherein the plural of cavities comprise at least one first cavity 40, at least one second cavity 40' and at least one third cavity 40"; wherein the at least one first bulk acoustic wave resonance structure 3 and the at least one second bulk acoustic wave resonance structure 3' have a first resonance frequency difference FD1, the first resonance frequency difference FD1 is correlated to the first thickness difference TD1 of the first frequency tuning structure 50 and the second frequency tuning structure 50'; that is that the first resonance frequency difference FD1 is correlated to the first height difference HD1; thereby adjusting the first height difference HD1 is capable of tuning the first resonance frequency difference FD1 of the at least one first bulk acoustic wave resonance structure 3 and the at least one second bulk acoustic wave resonance structure 3'; wherein the at least one first bulk acoustic wave resonance structure 3 and the at least one third bulk acoustic wave resonance structure 3" have a second resonance frequency difference FD2, the second resonance frequency difference FD2 is correlated to the second thickness difference TD2 of the first frequency tuning structure 50 and the third frequency tuning structure 50"; that is that the second resonance frequency difference FD2 is correlated to the second height difference HD2, thereby adjusting the second height difference HD2 is capable of tuning a second resonance frequency difference FD2 of the at least one first bulk acoustic wave resonance structure 3 and the at least one third bulk acoustic wave resonance structure 3"; wherein the second polish layer 51 is made of insulator.

Figure 5L:
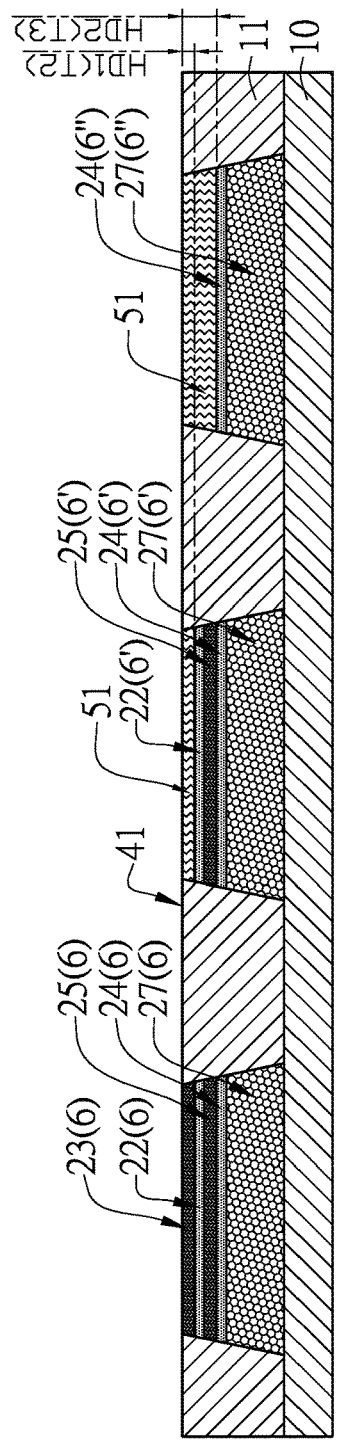
FIGS. 5L and 5M are the cross-sectional schematics showing steps of another embodiment of a method of frequency tuning for bulk acoustic wave resonator of bulk acoustic wave filter of the present invention.
Figure 5M:
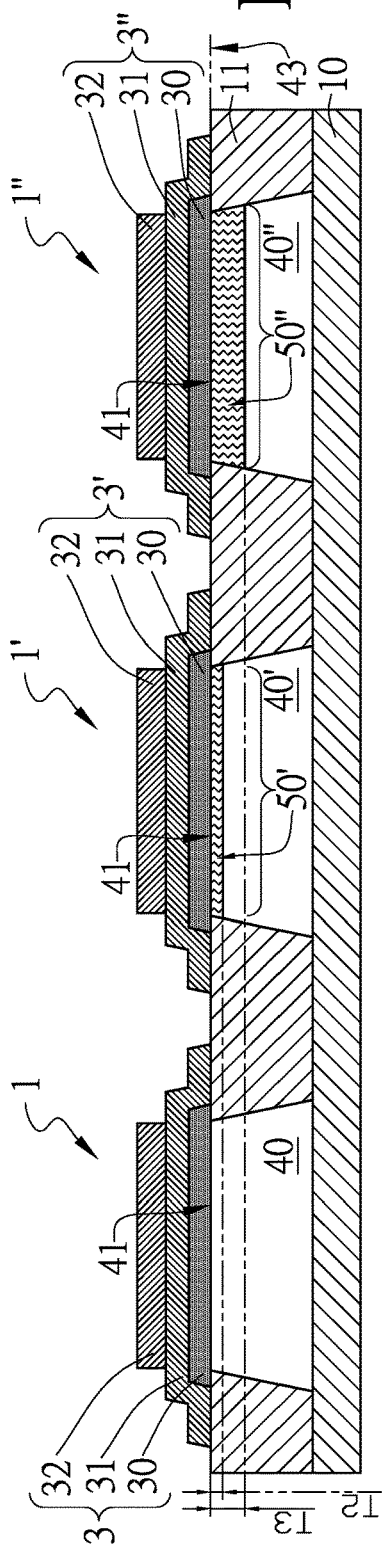

Please refer to FIGS. 5L and 5M, which are the cross-sectional schematics showing steps of another embodiment of a method of frequency tuning for bulk acoustic wave resonator of bulk acoustic wave filter of the present invention. In current embodiment, the substrate 10 is a compound semiconductor substrate; the sacrificial structure 21 is made of an epitaxial structure. The main steps for forming the embodiment shown in FIG. 5M are basically the same as those for forming the embodiment shown in FIG. 5K, except that in the Step C52, the second polish layer 51 is polished such that the at least one first sacrificial structure mesa 6 is exposed and the at least one second sacrificial structure mesa 6' and the at least one third sacrificial structure mesa 6" are not exposed (please referring to FIG. 5L), thereby the second polish layer 51 under the polished surface 41 (the extending plane 43) and located under the at least one second bulk acoustic wave resonance structure 3' forms a second frequency tuning structure 50' of the at least one second bulk acoustic wave resonance structure 3'; the second polish layer 51 under the polished surface 41 (the extending plane 43) and located under the at least one third bulk acoustic wave resonance structure 3" forms a third frequency tuning structure 50" of the at least one third bulk acoustic wave resonance structure 3". As shown in FIG. 5L, the second frequency tuning structure 50' has a thickness T2, the thickness T2 of the second frequency tuning structure 50' is equal to the first height difference HD1; wherein the third frequency tuning structure 50" has a thickness T3, the thickness T3 of the third frequency tuning structure 50" is equal to the second height difference HD2. In current embodiment, there is no such a first frequency tuning structure 50 as shown in FIG. 5K. Therefore, the first resonance frequency difference FD1 of the at least one first bulk acoustic wave resonance structure 3 and the at least one second bulk acoustic wave resonance structure 3' is correlated to the thickness T2 of the second frequency tuning structure 50'; that is that the first resonance frequency difference FD1 is correlated to the first height difference HD1 of the at least one first sacrificial structure mesa 6 and the at least one second sacrificial structure mesa 6'; thereby adjusting the first height difference HD1 is capable of tuning the first resonance frequency difference FD1 of the at least one first bulk acoustic wave resonance structure 3 and the at least one second bulk acoustic wave resonance structure 3'; the second resonance frequency difference FD2 of the at least one first bulk acoustic wave resonance structure 3 and the at least one third bulk acoustic wave resonance structure 3" is correlated to the thickness T3 of the third frequency tuning structure 50"; that is that the second resonance frequency difference FD2 is correlated to the second height difference HD2 of the at least one first sacrificial structure mesa 6 and the at least one third sacrificial structure mesa 6"; thereby adjusting the second height difference HD2 is capable of tuning a second resonance frequency difference FD2 of the at least one first bulk acoustic wave resonance structure 3 and the at least one third bulk acoustic wave resonance structure 3". In current embodiment, the second polish layer 51 may be made of at least one material selected from the group consisting of: metal, alloy and insulator.

Figure 5N:
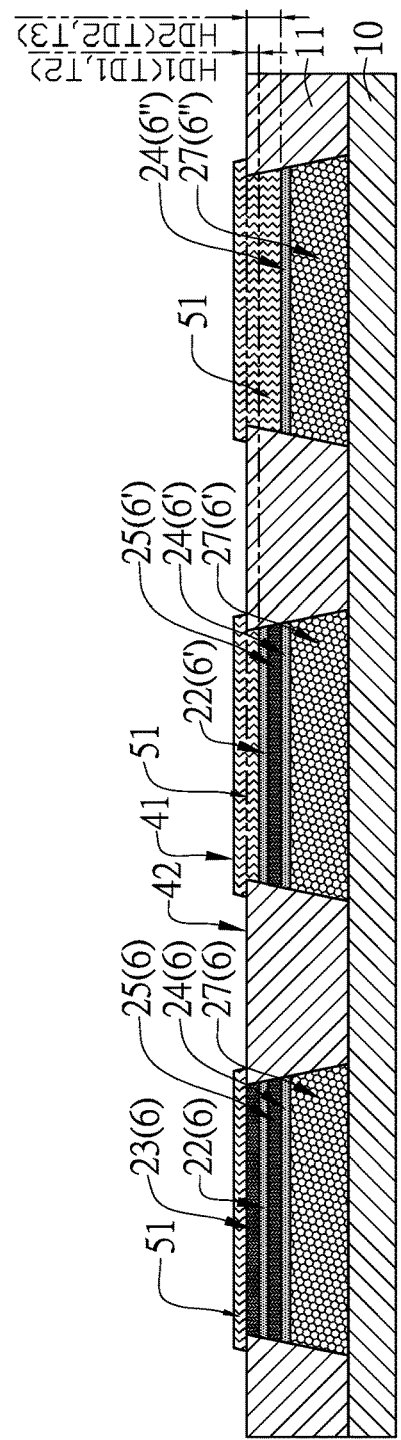
FIGS. 5N and 5O are the cross-sectional schematics showing steps of another embodiment of a method of frequency tuning for bulk acoustic wave resonator of bulk acoustic wave filter of the present invention.
Figure 5O:
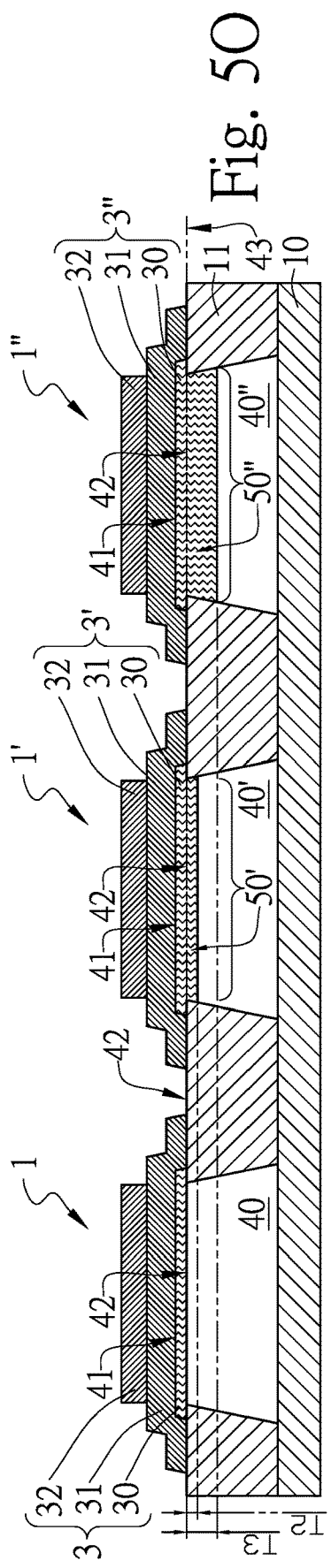

Please refer to FIGS. 5N and 5O, which are the cross-sectional schematics showing steps of another embodiment of a method of frequency tuning for bulk acoustic wave resonator of bulk acoustic wave filter of the present invention. In current embodiment, the substrate 10 is a compound semiconductor substrate; the sacrificial structure 21 is made of an epitaxial structure. The main steps for forming the embodiment shown in FIG. 5O are basically the same as those for forming the embodiment shown in FIG. 5K, except that in the Step C5, the plural of bulk acoustic wave resonance structures are formed on an extending plane 43, wherein the extending plane 43 is coincident with the pre-polished surface 42, wherein the Step C5 comprises following steps of: Step C51': forming a second polish layer 51 on the plural of sacrificial structure mesas and the insulating layer 11, wherein the second polish layer 51 is made of at least one material selected from the group consisting of: metal and alloy; wherein in a preferable embodiment, the second polish layer 51 is made of at least one material selected from the group consisting of: Ru, Ti, Mo, Pt, Au, A1 and W; Step C52': (please referring to FIG. 5J) polishing the second polish layer 51 by a chemical-mechanical planarization process to form a polished surface 41 such that the plural of sacrificial structure mesas are not exposed; Step C53': (please referring to FIG. 5N) patterning the second polish layer 51; Step C54': forming a piezoelectric layer 31 on the polished surface 41; and Step C55': forming a top electrode layer 32 on the piezoelectric layer 31. After the Step C6 etching the plural of sacrificial structure mesas, the embodiment of FIG. 5O is formed. In the Step C4, the at least one second sacrificial structure mesa 6' and the at least one third sacrificial structure mesa 6" are etched; wherein the second polish layer 51 above the pre-polished surface 42 (the extending plane 43), under the polished surface 41 and located under the at least one first bulk acoustic wave resonance structure 3 forms a bottom electrode layer 30 of the at least one first bulk acoustic wave resonance structure 3; wherein the second polish layer 51 above the pre-polished surface 42 (the extending plane 43), under the polished surface 41 and located under the at least one second bulk acoustic wave resonance structure 3' forms a bottom electrode layer 30 of the at least one second bulk acoustic wave resonance structure 3'; wherein the second polish layer 51 under the pre-polished surface 42 (the extending plane 43) and located under the at least one second bulk acoustic wave resonance structure 3' forms a second frequency tuning structure 50' of the at least one second bulk acoustic wave resonance structure 3'; wherein the second frequency tuning structure 50' has a thickness T2, the thickness T2 of the second frequency tuning structure 50' is equal to the first height difference HD1; wherein the second polish layer 51 above the pre-polished surface 42 (the extending plane 43), under the polished surface 41 and located under the at least one third bulk acoustic wave resonance structure 3" forms a bottom electrode layer 30 of the at least one third bulk acoustic wave resonance structure 3"; wherein the second polish layer 51 under the pre-polished surface 42 (the extending plane 43) and located under the at least one third bulk acoustic wave resonance structure 3" forms a third frequency tuning structure 50" of the at least one third bulk acoustic wave resonance structure 3"; the third frequency tuning structure 50" has a thickness T3, the thickness T3 of the third frequency tuning structure 50" is equal to the second height difference HD2; thereby adjusting the first height difference HD1 is capable of tuning the first resonance frequency difference FD1 of the at least one first bulk acoustic wave resonance structure 3 and the at least one second bulk acoustic wave resonance structure 3'; thereby adjusting the second height difference HD2 is capable of tuning the second resonance frequency difference FD2 of the at least one first bulk acoustic wave resonance structure 3 and the at least one third bulk acoustic wave resonance structure 3".

Figure 5P:
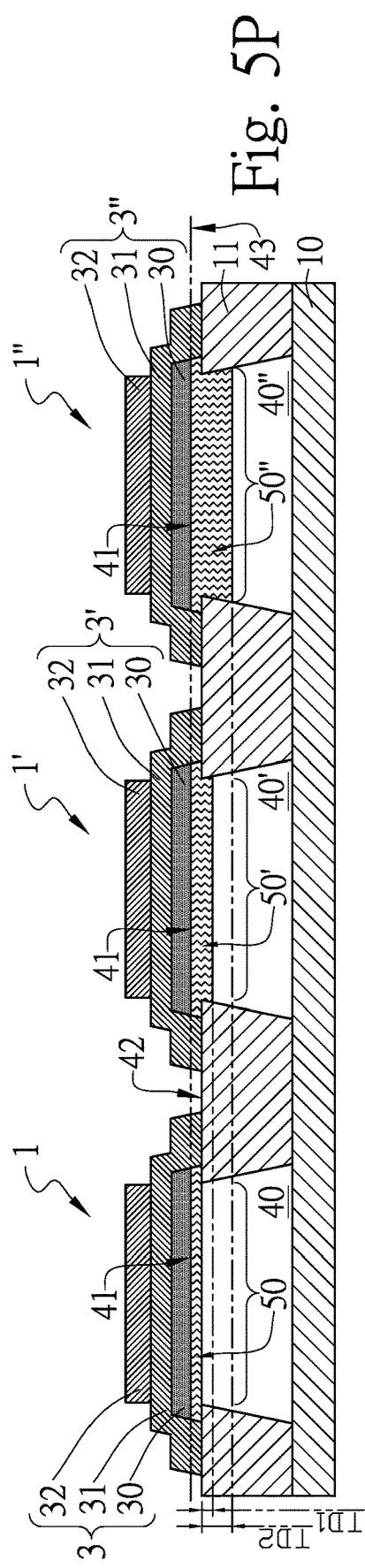
FIG. 5P is the cross-sectional schematic showing another embodiment of a method of frequency tuning for bulk acoustic wave resonator of bulk acoustic wave filter of the present invention.

Please refer to FIG. 5P, which is the cross-sectional schematic showing another embodiment of a method of frequency tuning for bulk acoustic wave resonator of bulk acoustic wave filter of the present invention. The main steps for forming the embodiment shown in FIG. 5P are basically the same as those for forming the embodiment shown in FIG. 5K, except that the Step C5 comprises following steps of: Step C51": forming a second polish layer 51 on the plural of sacrificial structure mesas and the insulating layer 11, wherein the substrate 10 is a compound semiconductor substrate; the plural of sacrificial structure mesas is made of an epitaxial structure; wherein the second polish layer 51 is made of at least one material selected from the group consisting of: metal, alloy and insulator; Step C52": (please referring to FIG. 5J) polishing the second polish layer 51 by a chemical-mechanical planarization process to form a polished surface 41 such that the at least one first sacrificial structure mesa 6, the at least one second sacrificial structure mesa 6' and the at least one third sacrificial structure mesa 6" are not exposed; Step C53": (please referring to FIG. 5N) patterning the second polish layer 51; Step C54": forming a bottom electrode layer 30 on the polished surface 41 (the extending plane 43); Step C55": forming a piezoelectric layer 31 on the bottom electrode layer 30; and Step C56": forming a top electrode layer 32 on the piezoelectric layer 31. After the Step C6, the embodiment of FIG. 5P is formed, wherein the second polish layer 51 under the polished surface 41 (the extending plane 43) and located under the at least one first bulk acoustic wave resonance structure 3, the at least one second bulk acoustic wave resonance structure 3' and the at least one third bulk acoustic wave resonance structure 3" form a first frequency tuning structure 50 of the at least one first bulk acoustic wave resonance structure 3, a second frequency tuning structure 50' of the at least one second bulk acoustic wave resonance structure 3' and a third frequency tuning structure 50" of the at least one third bulk acoustic wave resonance structure 3" respectively; wherein the first frequency tuning structure 50 and the second frequency tuning structure 50' have a first thickness difference TD1, the first thickness difference TD1 is equal to the first height difference HD1; wherein the first frequency tuning structure 50 and the third frequency tuning structure 50" have a second thickness difference TD2, the second thickness difference TD2 is equal to the second height difference HD2; thereby adjusting the first height difference HD1 is capable of tuning the first resonance frequency difference FD1 of the at least one first bulk acoustic wave resonance structure 3 and the at least one second bulk acoustic wave resonance structure 3'; thereby adjusting the second height difference HD2 is capable of tuning a second resonance frequency difference FD2 of the at least one first bulk acoustic wave resonance structure 3 and the at least one third bulk acoustic wave resonance structure 3".

The embodiments of FIGS. 5K, 5M, 5O and 5P may also be formed from the structure of FIG. 5A, wherein the substrate 10 may be a semiconductor substrate; the plural of sacrificial structure mesas may be made of at least one material selected from the group consisting of: metal, alloy and epitaxial structure.

Figure 6A:
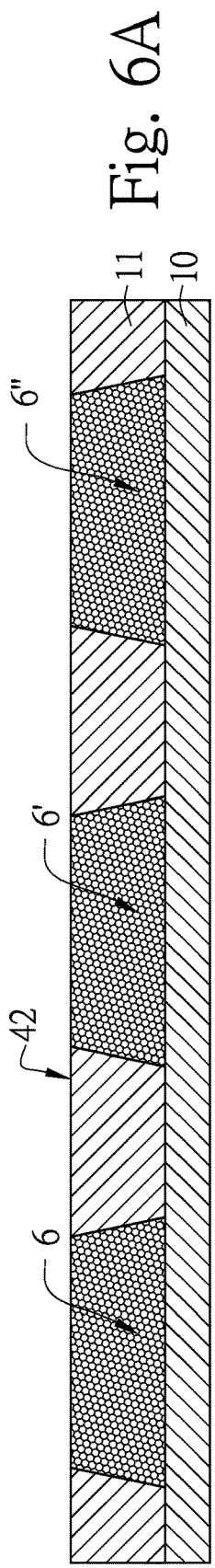

Please refer to FIGS. 6A~6C, which are the cross-sectional schematics showing steps of an embodiment of a method of frequency tuning for bulk acoustic wave resonator of bulk acoustic wave filter of the present invention. In the embodiment, the substrate 10 may be a semiconductor substrate; the plural of sacrificial structure mesas may be made of at least one material selected from the group consisting of: metal, alloy and epitaxial structure. The main structure of the epitaxial structure of the embodiment in FIG. 6A is basically the same as that of the embodiment in FIG. 3B, except that the plural of sacrificial structure mesas comprise at least one first sacrificial structure mesa 6, at least one second sacrificial structure mesa 6' and at least one third sacrificial structure mesa 6". The main steps for forming the embodiment shown in FIG. 6C are basically the same as those for forming the embodiment shown in FIG. 4D, except that at least one first bulk acoustic wave resonator 1, at least one second bulk acoustic wave resonator 1' and at least one third bulk acoustic wave resonator 1" are formed on the substrate 10 respectively; wherein in the Step C1, the plural of sacrificial structure mesas comprise at least one first sacrificial structure mesa 6, at least one second sacrificial structure mesa 6' and at least one third sacrificial structure mesa 6"; wherein in the Step C4, the at least one first sacrificial structure mesa 6, the at least one second sacrificial structure mesa 6' and the at least one third sacrificial structure mesa 6" are etched such that the at least one first sacrificial structure mesa 6 and the at least one second sacrificial structure mesa 6' have a first height difference HD1, and the at least one first sacrificial structure mesa 6 and the at least one third sacrificial structure mesa 6" have a second height difference HD2 (please referring to FIG. 6B); wherein in the Step C5, the plural of bulk acoustic wave resonance structures comprise at least one first bulk acoustic wave resonance structure 3, at least one second bulk acoustic wave resonance structure 3' and at least one third bulk acoustic wave resonance structure 3", wherein the at least one first bulk acoustic wave resonance structure 3, the at least one second bulk acoustic wave resonance structure 3' and the at least one third bulk acoustic wave resonance structure 3" are located above the at least one first sacrificial structure mesa 6, the at least one second sacrificial structure mesa 6' and the at least one third sacrificial structure mesa 6" respectively; wherein in the Step C52, the second polish layer 51 is polished such that the at least one first sacrificial structure mesa 6, the at least one second sacrificial structure mesa 6' and the at least one third sacrificial structure mesa 6" are not exposed, wherein the second polish layer 51 under the polished surface 41 (the extending plane 43) and located under the at least one first bulk acoustic wave resonance structure 3, the at least one second bulk acoustic wave resonance structure 3' and the at least one third bulk acoustic wave resonance structure 3" form a first frequency tuning structure 50 of the at least one first bulk acoustic wave resonance structure 3, a second frequency tuning structure 50' of the at least one second bulk acoustic wave resonance structure 3' and a third frequency tuning structure 50" of the at least one third bulk acoustic wave resonance structure 3" respectively; wherein the first frequency tuning structure 50 and the second frequency tuning structure 50' have a first thickness difference TD1, the first thickness difference TD1 is equal to the first height difference HD1; wherein the first frequency tuning structure 50 and the third frequency tuning structure 50" have a second thickness difference TD2, the second thickness difference TD2 is equal to the second height difference HD2; thereby adjusting the first height difference HD1 is capable of tuning the first resonance frequency difference FD1 of the at least one first bulk acoustic wave resonance structure 3 and the at least one second bulk acoustic wave resonance structure 3'; thereby adjusting the second height difference HD2 is capable of tuning a second resonance frequency difference FD2 of the at least one first bulk acoustic wave resonance structure 3 and the at least one third bulk acoustic wave resonance structure 3", wherein the second polish layer 51 is made of insulator.

Please refer to FIG. 6D, which is the cross-sectional schematic showing an embodiment of a method of frequency tuning for bulk acoustic wave resonator of bulk acoustic wave filter of the present invention. In current embodiment, the substrate 10 may be a semiconductor substrate; the plural of sacrificial structure mesas may be made of at least one material selected from the group consisting of: metal, alloy and epitaxial structure. The main steps for forming the embodiment shown in FIG. 6D are basically the same as those for forming the embodiment shown in FIG. 6C, except that in the Step C52, the second polish layer 51 is polished such that the polished surface 41 (the extending plane 43) is coincident with the pre-polished surface 42 or such that the polished surface 41 is lower than the pre-polished surface 42, and wherein the at least one first sacrificial structure mesa 6, the at least one second sacrificial structure mesa 6' and the at least one third sacrificial structure mesa 6" are not exposed. In current embodiment, the second polish layer 51 may be made of at least one material selected from the group consisting of: metal, alloy and insulator.

Please refer to FIG. 6E, which is the cross-sectional schematic showing another embodiment of a method of frequency tuning for bulk acoustic wave resonator of bulk acoustic wave filter of the present invention. In current embodiment, the substrate 10 may be a semiconductor substrate; the plural of sacrificial structure mesas may be made of at least one material selected from the group consisting of: metal, alloy and epitaxial structure. The main steps for forming the embodiment shown in FIG. 6E are basically the same as those for forming the embodiment shown in FIG. 6C, except that in the Step C5, the plural of bulk acoustic wave resonance structures are formed on an extending plane 43, wherein the extending plane 43 is coincident with the pre-polished surface 42; wherein the Step C5 comprises following steps of: Step C51': forming a second polish layer 51 on the plural of sacrificial structure mesas and the insulating layer 11, wherein the second polish layer 51 is made of at least one material selected from the group consisting of: metal and alloy; wherein in a preferable embodiment, the second polish layer 51 is made of at least one material selected from the group consisting of: Ru, Ti, Mo, Pt, Au, Al and W; Step C52': polishing the second polish layer 51 by a chemical-mechanical planarization process to form a polished surface 41 such that the plural of sacrificial structure mesas are not exposed; Step C53': patterning the second polish layer 51; Step C54': forming a piezoelectric layer 31 on the polished surface 41; and Step C55': forming a top electrode layer 32 on the piezoelectric layer 31. After the Step C6 etching the plural of sacrificial structure mesas, the embodiment of FIG. 6E is formed; wherein the second polish layer 51 above the pre-polished surface 42 (the extending plane 43), under the polished surface 41 and located under the at least one first bulk acoustic wave resonance structure 3 forms a bottom electrode layer 30 of the at least one first bulk acoustic wave resonance structure 3; wherein the second polish layer 51 under the pre-polished surface 42 (the extending plane 43) and located under the at least one first bulk acoustic wave resonance structure 3 forms a first frequency tuning structure 50 of the at least one first bulk acoustic wave resonance structure 3; wherein the second polish layer 51 above the pre-polished surface 42 (the extending plane 43), under the polished surface 41 and located under the at least one second bulk acoustic wave resonance structure 3' forms a bottom electrode layer 30 of the at least one second bulk acoustic wave resonance structure 3'; wherein the second polish layer 51 under the pre-polished surface 42 (the extending plane 43) and located under the at least one second bulk acoustic wave resonance structure 3' forms a second frequency tuning structure 50' of the at least one second bulk acoustic wave resonance structure 3'; wherein the first frequency tuning structure 50 and the second frequency tuning structure 50' have a first thickness difference TD1, the first thickness difference TD1 is equal to the first height difference HD1; wherein the second polish layer 51 above the pre-polished surface 42 (the extending plane 43), under the polished surface 41 and located under the at least one third bulk acoustic wave resonance structure 3" forms a bottom electrode layer 30 of the at least one third bulk acoustic wave resonance structure 3"; wherein the second polish layer 51 under the pre-polished surface 42 (the extending plane 43) and located under the at least one third bulk acoustic wave resonance structure 3" forms a third frequency tuning structure 50" of the at least one third bulk acoustic wave resonance structure 3"; wherein the first frequency tuning structure 50 and the third frequency tuning structure 50" have a second thickness difference TD2, the second thickness difference TD2 is equal to the second height difference HD2; thereby adjusting the first height difference HD1 is capable of tuning the first resonance frequency difference FD1 of the at least one first bulk acoustic wave resonance structure 3 and the at least one second bulk acoustic wave resonance structure 3'; thereby adjusting the second height difference HD2 is capable of tuning a second resonance frequency difference FD2 of the at least one first bulk acoustic wave resonance structure 3 and the at least one third bulk acoustic wave resonance structure 3".

Please refer to FIG. 6F, which is the cross-sectional schematic showing another embodiment of a method of frequency tuning for bulk acoustic wave resonator of bulk acoustic wave filter of the present invention. The main steps for forming the embodiment shown in FIG. 6F are basically the same as those for forming the embodiment shown in FIG. 6C, except that the Step C5 comprises following steps of: Step C51": forming a second polish layer 51 on the plural of sacrificial structure mesas and the insulating layer 11, wherein the substrate 10 is a compound semiconductor substrate; the plural of sacrificial structure mesas is made of an epitaxial structure; wherein the second polish layer 51 is made of at least one material selected from the group consisting of: metal, alloy and insulator; Step C52": polishing the second polish layer 51 by a chemical-mechanical planarization process to form a polished surface 41 such that the at least one first sacrificial structure mesa 6, the at least one second sacrificial structure mesa 6' and the at least one third sacrificial structure mesa 6" are not exposed; Step C53": patterning the second polish layer 51; Step C54": forming a bottom electrode layer 30 on the polished surface 41 (the extending plane 43); Step C55": forming a piezoelectric layer 31 on the bottom electrode layer 30; and Step C56": forming a top electrode layer 32 on the piezoelectric layer 31. After the Step C6, the embodiment of FIG. 6F is formed, wherein the second polish layer 51 under the polished surface 41 and located under the at least one first bulk acoustic wave resonance structure 3, the at least one second bulk acoustic wave resonance structure 3' and the at least one third bulk acoustic wave resonance structure 3" form a first frequency tuning structure 50 of the at least one first bulk acoustic wave resonance structure 3, a second frequency tuning structure 50' of the at least one second bulk acoustic wave resonance structure 3' and a third frequency tuning structure 50" of the at least one third bulk acoustic wave resonance structure 3" respectively; wherein the first frequency tuning structure 50 and the second frequency tuning structure 50' have a first thickness difference TD1, the first thickness difference TD1 is equal to the first height difference HD1; wherein the first frequency tuning structure 50 and the third frequency tuning structure 50" have a second thickness difference TD2, the second thickness difference TD2 is equal to the second height difference HD2; thereby adjusting the first height difference HD1 is capable of tuning a first resonance frequency difference FD1 of the at least one first bulk acoustic wave resonance structure 3 and the at least one second bulk acoustic wave resonance structure 3'; thereby adjusting the second height difference HD2 is capable of tuning a second resonance frequency difference FD2 of the at least one first bulk acoustic wave resonance structure 3 and the at least one third bulk acoustic wave resonance structure 3".

The embodiments of FIGS. 6C, 6D, 6E and 6F may also be formed from the epitaxial structure of FIG. 5E, wherein the substrate 10 is a compound semiconductor substrate; the sacrificial structure 21 is made of an epitaxial structure.

The sacrificial structure 21 of FIG. 5E may further comprises a top etching stop layer 26 formed on the first fine tuning layer 23 (not shown in Figure), thereby the embodiments of FIGS. 6C, 6D, 6E and 6F may be formed from the epitaxial structure of FIG. 5E, wherein the function of the top etching stop layer 26 is basically the same as that of the top etching stop layer 26 of the embodiment of FIG. 4J. In order to prevent from that the thickness of the first fine tuning layer 23 of the plural of sacrificial structure mesas located near the center of the substrate 10 is unequal to the thickness of the first fine tuning layer 23 of the plural of sacrificial structure mesas located away from the center of the substrate 10, the top etching stop layer 26 is introduced such that the thickness of the first fine tuning layer 23 of the plural of sacrificial structure mesas located near the center of the substrate 10 is capable to be preserved to be equal to the thickness of the first fine tuning layer 23 of the plural of sacrificial structure mesas located away from the center of the substrate 10.

The common characteristic of the embodiments of FIGS. 5C, 5K, 5P, 6C, 6D, 6E and 6F is that: the bottom electrode layer 30 of the at least one first bulk acoustic wave resonance structure 3, the bottom electrode layer 30 of the at least one second bulk acoustic wave resonance structure 3' and the bottom electrode layer 30 of the at least one third bulk acoustic wave resonance structure 3" are all formed on the extending plane 43; and the first frequency tuning structure 50, the second frequency tuning structure 50' and the third frequency tuning structure 50" are all formed under the extending plane 43. The common characteristic of the embodiments of FIGS. 5D, 5M and 5O is that: the bottom electrode layer 30 of the at least one first bulk acoustic wave resonance structure 3, the bottom electrode layer 30 of the at least one second bulk acoustic wave resonance structure 3' and the bottom electrode layer 30 of the at least one third bulk acoustic wave resonance structure 3" are all formed on the extending plane 43; and the second frequency tuning structure 50' and the third frequency tuning structure 50" are all formed under the extending plane 43.

The embodiments of FIGS. 3G, 3I, 3K, 3L, 4D, 4F, 4H, 4I, 5C, 5D, 5K, 5M, 5O, 5P, 6C, 6D, 6E and 6F may further comprises a bottom etching stop layer 20 (as the embodiment of FIG. 2I or FIG. 2J), wherein the bottom etching stop layer 20 is formed on the substrate 10, the insulating layer 11 is formed on the bottom etching stop layer 20, wherein the at least one first cavity 40 and the at least one second cavity 40' (and the at least one third cavity 40") are located above the bottom etching stop layer 20, wherein the substrate 10 is a compound semiconductor substrate; the plural of sacrificial structure mesas (the sacrificial structure 21) may be made of an epitaxial structure.

Figure 6G:
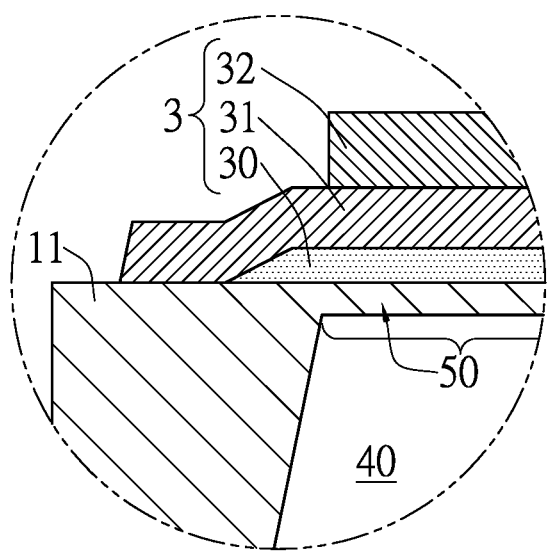
FIG. 6G is the partial enlarged cross-sectional schematic showing an embodiment of a method of frequency tuning for bulk acoustic wave resonator of bulk acoustic wave filter of the present invention.
Figure 6H:
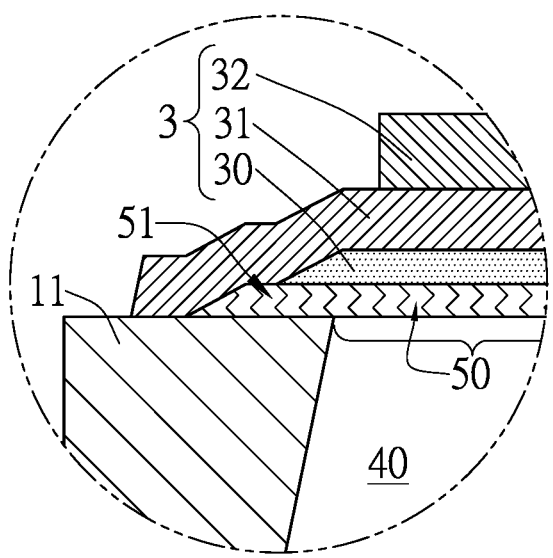
FIG. 6H is the partial enlarged cross-sectional schematic showing another embodiment of a method of frequency tuning for bulk acoustic wave resonator of bulk acoustic wave filter of the present invention.
Figure 7A:
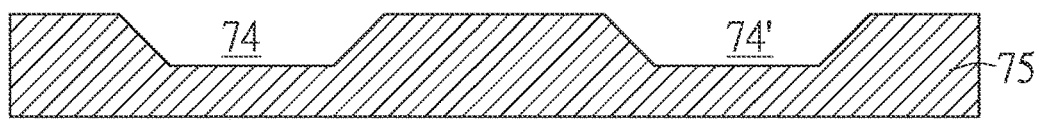
FIGS. 7A~7D are the cross-sectional schematics showing steps of a fabricating method for bulk acoustic wave filter of conventional technology.
Figure 7B:
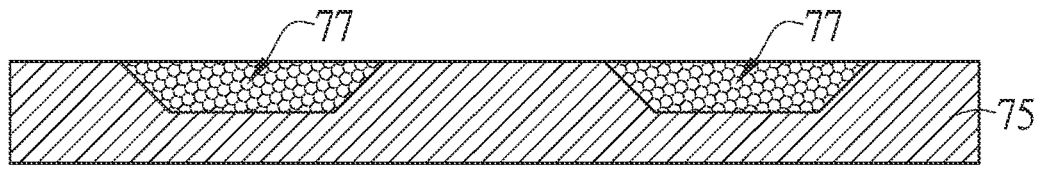
Figure 7C:
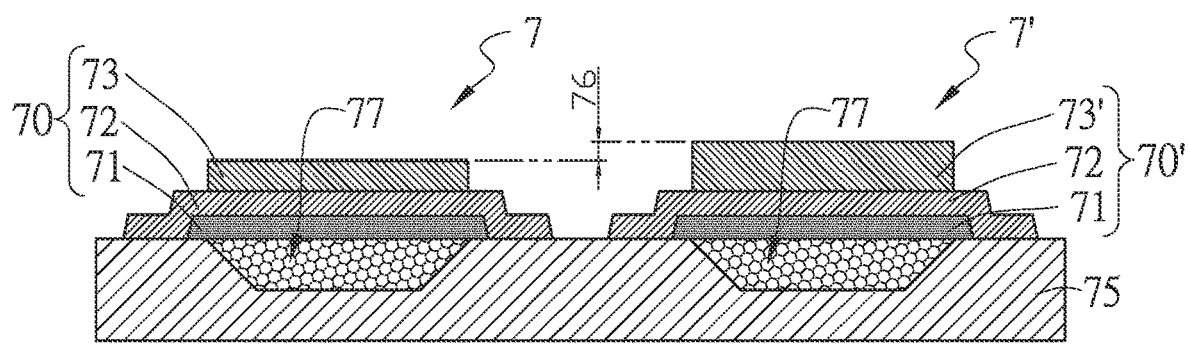
Figure 7D:
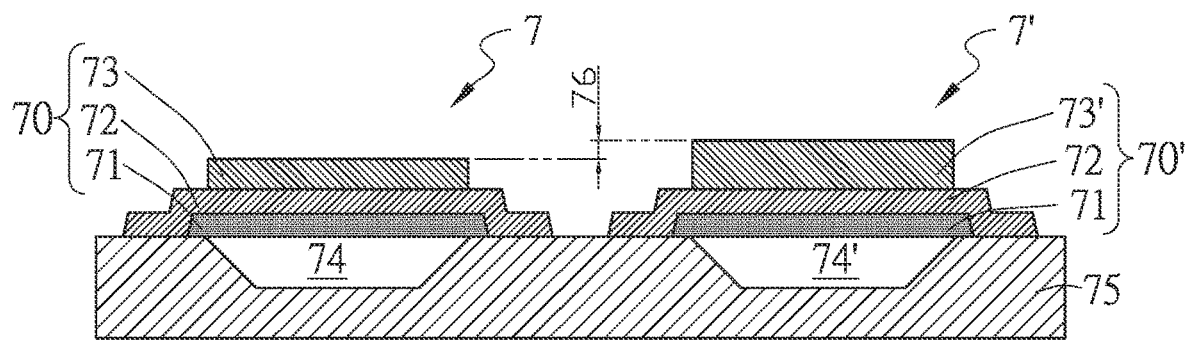

Please refer to FIG. 6G, which is the partial enlarged cross-sectional schematic showing an embodiment of a method of frequency tuning for bulk acoustic wave resonator of bulk acoustic wave filter of the present invention. The structure of FIG. 6G is the partial enlarged cross-sectional schematic showing one of the embodiments of FIGS. 1F, 1K, 2F, 2I and 5C. The bottom electrode layer 30 of the at least one first bulk acoustic wave resonance structure 3 is very slowly and gradually thinned at the edge, so that the crystallization of the piezoelectric layer 31 near the edge of the bottom electrode layer 30 may maintain a good state without causing a phenomenon of crystal cracks or breakage. Therefore, in the structure of FIG. 6G, the bottom electrode layer 30 very slowly and gradually thinned at the edge, therefore, FIG. 6G is a preferable embodiment. In other embodiments of the present invention, the bottom electrode layer 30 of the at least one first bulk acoustic wave resonance structure 3 (or the at least one second bulk acoustic wave resonance structure 3', or the at least one third bulk acoustic wave resonance structure 3") may also have the similar structure that the bottom electrode layer 30 is very slowly and gradually thinned at the edge as that of the embodiment of FIG. 6G. Please refer to FIG. 6H, which is the partial enlarged cross-sectional schematic showing another embodiment of a method of frequency tuning for bulk acoustic wave resonator of bulk acoustic wave filter of the present invention. The structure of FIG. 6H is the partial enlarged cross-sectional schematic showing one of the embodiments of FIGS. 3L and 5P of the present invention. In the embodiment, besides the bottom electrode layer 30 of the at least one first bulk acoustic wave resonance structure 3 is very slowly and gradually thinned at the edge, the second polish layer 51 is also very slowly and gradually thinned at the edge. In the embodiments of FIGS. 4I and 6F of the present invention, the second polish layer 51 may be also very slowly and gradually thinned at the edge.

In the embodiments of the present invention, if the thickness of the first frequency tuning structure 50 (or the second frequency tuning structure 50', or the third frequency tuning structure 50") is too thick, then it will affect the resonance state of the at least one first bulk acoustic wave resonance structure 3 (or the at least one second bulk acoustic wave resonance structure 3', or the at least one third bulk acoustic wave resonance structure 3"). Therefore, the thickness of the first frequency tuning structure 50 (or the second frequency tuning structure 50', or the third frequency tuning structure 50") is required to be less than 1000 nm. In some preferable embodiments, the thickness of the first frequency tuning structure 50 (or the second frequency tuning structure 50', or the third frequency tuning structure 50") is equal to or less than 300 nm.

As disclosed in the above description and attached drawings, the present invention can provide a bulk acoustic wave filter and a method of frequency tuning for a bulk acoustic wave resonator of a bulk acoustic wave filter. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

The invention claimed is:

1. A bulk acoustic wave filter comprising:
a substrate;
an insulating layer disposed on the substrate, wherein the insulating layer has a first cavity and a second cavity formed therein;
a first bulk acoustic wave resonance structure disposed on the first cavity, wherein the first bulk acoustic wave resonance structure comprises a first bottom electrode disposed on the first cavity, a first top electrode disposed on the first bottom electrode, a first piezoelectric layer portion sandwiched between the first top electrode and the first bottom electrode, and a first frequency tuning structure disposed between the first cavity and the first bottom electrode, wherein the first frequency tuning structure and the first bottom electrode are made of a same material, and a width of the first bottom electrode is greater than a width of the first frequency tuning structure; and
a second bulk acoustic wave resonance structure disposed on the second cavity, wherein the second bulk acoustic wave resonance structure comprises a second bottom electrode disposed on the second cavity, a second top electrode disposed on the second bottom electrode, a second piezoelectric layer portion sandwiched between the second top electrode and the second bottom electrode.

2. The bulk acoustic wave filter according to claim 1, wherein the second bulk acoustic wave resonance structure further comprises a second frequency tuning structure disposed between the second cavity and the second bottom electrode.

3. The bulk acoustic wave filter according to claim 2, wherein a thickness of the first frequency tuning structure is greater than a thickness of the second frequency tuning structure.

4. The bulk acoustic wave filter according to claim 1, wherein the substrate is a semiconductor substrate, and the insulating layer comprises silicon nitride, silicon oxide, polymer, or a combination thereof.

5. The bulk acoustic wave filter according to claim 1, wherein the substrate is a compound semiconductor substrate.

6. The bulk acoustic wave filter according to claim 1, wherein the insulating layer comprises silicon nitride, silicon oxide, aluminium nitride, zinc oxide, or a combination thereof.

7. The bulk acoustic wave filter according to claim 1, wherein the first frequency tuning structure is made of a metal or an alloy.

8. The bulk acoustic wave filter according to claim 1, wherein the first frequency tuning structure is made of Ru, Ti, Mo, Pt, Au, Al, W, or a combination thereof.

9. The bulk acoustic wave filter according to claim 1, wherein the first frequency tuning structure and the first bottom electrode are integrally formed.

10. A bulk acoustic wave filter comprising:
a substrate;
an insulating layer formed on the substrate, wherein a first cavity and a second cavity are formed in the insulating layer, and the first cavity and the second cavity are defined by sidewalls of the insulating layer and a top surface of the substrate;
a first bulk acoustic wave resonance structure formed on the first cavity, wherein the first bulk acoustic wave resonance structure comprises a first frequency tuning structure formed on the first cavity, a first bottom electrode formed on the first frequency tuning structure, a first piezoelectric layer portion formed on the first bottom electrode, and a first top electrode formed on the first piezoelectric layer portion, wherein the first frequency tuning structure and the first bottom electrode are made of a same material, and a spacing between a sidewall of the first bottom electrode to an opposite sidewall of the first bottom electrode is greater than a spacing between a sidewall of the first frequency tuning structure to an opposite sidewall of the first frequency tuning structure; and
a second bulk acoustic wave resonance structure formed on the second cavity, wherein the second bulk acoustic wave resonance structure comprises a second bottom electrode formed on the second cavity, a second piezoelectric layer portion formed on the second bottom electrode, and a second top electrode formed on the second piezoelectric layer portion.

11. The bulk acoustic wave filter according to claim 10, wherein a first spacing between the substrate and the first frequency tuning structure is less than a second spacing between the substrate and the second bottom electrode.

12. The bulk acoustic wave filter according to claim 10, wherein the second bulk acoustic wave resonance structure further comprises a second frequency tuning structure formed on the second cavity, wherein the second frequency tuning structure is between the second cavity and the second bottom electrode.

13. The bulk acoustic wave filter according to claim 12, wherein a first spacing between the substrate and the first frequency tuning structure is less than a second spacing between the substrate and the second frequency tuning structure.

14. The bulk acoustic wave filter according to claim 12, wherein the first frequency tuning structure and the second frequency tuning structure are made of a same material.

15. The bulk acoustic wave filter according to claim 14, wherein the first frequency tuning structure and the second frequency tuning structure are made of a metal or an alloy.

16. The bulk acoustic wave filter according to claim 10, wherein a thickness of the first frequency tuning structure is gradually thinned at the sidewall of the first frequency tuning structure.

* * * * *